US012575107B2

(12) United States Patent
Young et al.

(10) Patent No.: US 12,575,107 B2
(45) Date of Patent: Mar. 10, 2026

(54) MEMORY DEVICE

(71) Applicant: Taiwan Semiconductor Manufacturing Company, Ltd., Hsinchu (TW)

(72) Inventors: Bo-Feng Young, Taipei (TW); Sai-Hooi Yeong, Hsinchu County (TW); Shih-Lien Linus Lu, Hsinchu (TW); Chia-En Huang, Hsinchu County (TW); Yih Wang, Hsinchu (TW); Yu-Ming Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 51 days.

(21) Appl. No.: 18/766,701

(22) Filed: Jul. 9, 2024

(65) Prior Publication Data

US 2024/0365554 A1 Oct. 31, 2024

Related U.S. Application Data

(63) Continuation of application No. 17/400,081, filed on Aug. 11, 2021, now Pat. No. 12,089,414.

(60) Provisional application No. 63/137,759, filed on Jan. 15, 2021.

(51) Int. Cl.
| | |
|---|---|
| *H10B 51/20* | (2023.01) |
| *G11C 5/06* | (2006.01) |
| *G11C 11/22* | (2006.01) |

(52) U.S. Cl.
CPC .............. *H10B 51/20* (2023.02); *G11C 5/06* (2013.01); *G11C 11/223* (2013.01)

(58) Field of Classification Search
CPC ........ H10B 51/20; H10B 51/10; H10B 51/50; H10B 51/30; G11C 5/06; G11C 11/223; G11C 5/025; G11C 11/2275; G11C 11/2273; G11C 5/02
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |

(Continued)

*Primary Examiner* — S M Sohel Imtiaz
(74) *Attorney, Agent, or Firm* — JCIPRNET

(57) ABSTRACT

Provided are a memory device and a method of forming the same. The memory device includes a substrate, a multi-layer stack, a plurality of memory cells, and a plurality of conductive contacts. The substrate includes an array region and a staircase region. The multi-layer stack is disposed on the substrate in the array region, wherein the multi-layer stack has an end portion extending on the staircase region to be shaped into a staircase structure. The plurality of memory cells are respectively disposed on sidewalls of the multi-layer stack in the array region, and arranged at least along a stacking direction of the multi-layer stack. The plurality of conductive contacts are respectively on the staircase structure. At least two conductive contacts are electrically connected to each other.

20 Claims, 55 Drawing Sheets

(56)     References Cited

U.S. PATENT DOCUMENTS

| | | | |
|---|---|---|---|
| 9,520,482 B1 | 12/2016 | Chang et al. | |
| 9,576,814 B2 | 2/2017 | Wu et al. | |
| 9,842,657 B1 * | 12/2017 | Dutta | G11C 11/5628 |
| 2017/0256551 A1 * | 9/2017 | Lee | H10B 41/40 |
| 2020/0227439 A1 * | 7/2020 | Sato | H10B 51/10 |
| 2020/0357813 A1 * | 11/2020 | Tanzawa | H10B 43/27 |
| 2021/0296232 A1 * | 9/2021 | Zhang | H10B 41/50 |
| 2021/0296335 A1 * | 9/2021 | Sun | H10B 43/10 |
| 2021/0366923 A1 * | 11/2021 | Oh | H10B 43/27 |
| 2022/0028440 A1 * | 1/2022 | Tang | G11C 8/14 |
| 2022/0108987 A1 * | 4/2022 | Lee | G11C 5/10 |
| 2022/0139950 A1 * | 5/2022 | Guo | H10B 41/27 |
| | | | 257/314 |
| 2022/0173040 A1 * | 6/2022 | Wang | H10B 41/50 |
| 2022/0310170 A1 * | 9/2022 | Tanaka | H10B 51/40 |
| 2022/0384341 A1 * | 12/2022 | Tessariol | H01L 21/76816 |
| 2023/0301105 A1 * | 9/2023 | Wei | H01L 23/5226 |
| | | | 257/324 |

* cited by examiner

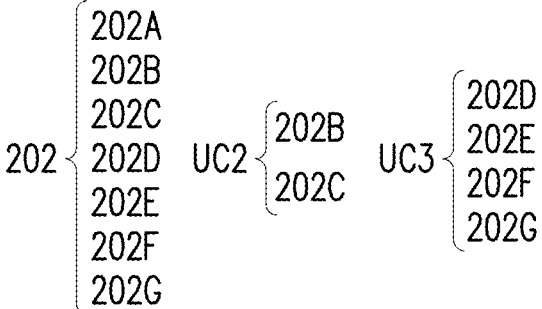
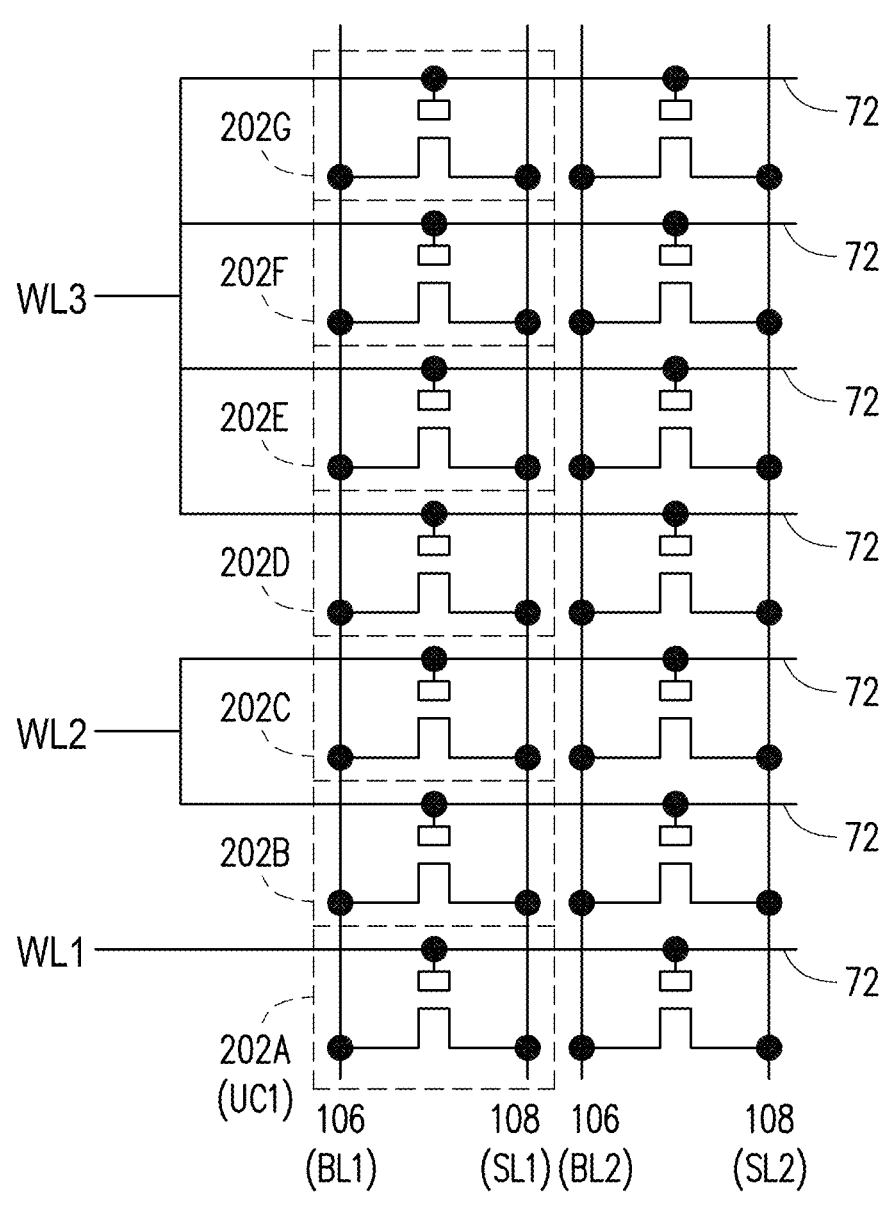
FIG. 1B

200

60

56

52E

52D

52C

52B

52A

52

58 { 52 53

60

61

53D

53C

53B

53A

53

B

B'

200

86

58

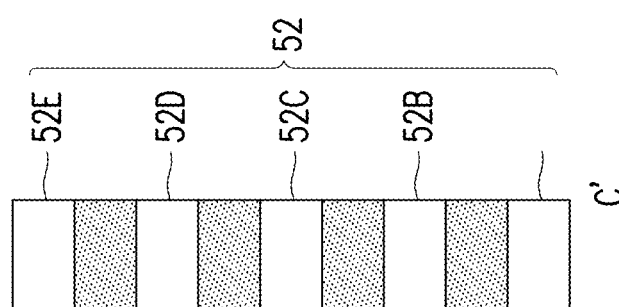
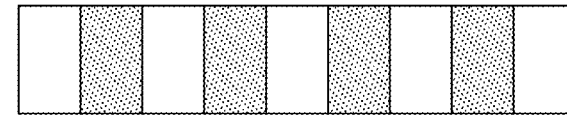
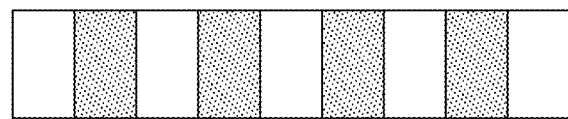
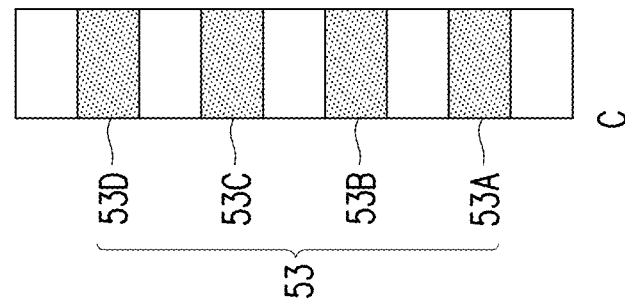
FIG. 15B

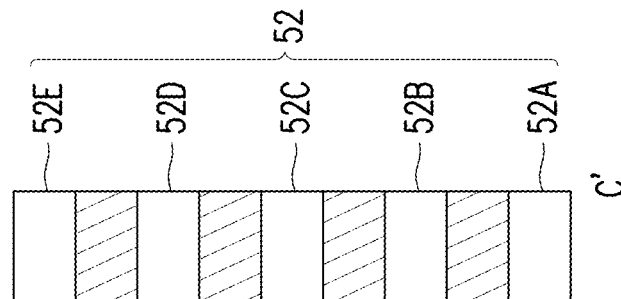
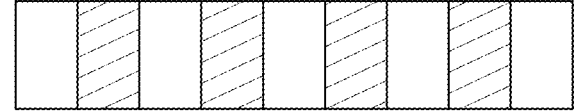
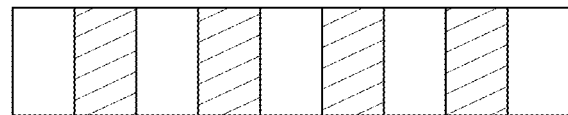
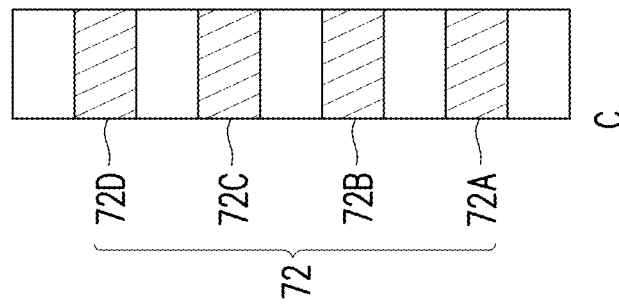
FIG. 16B

200

90

86

58

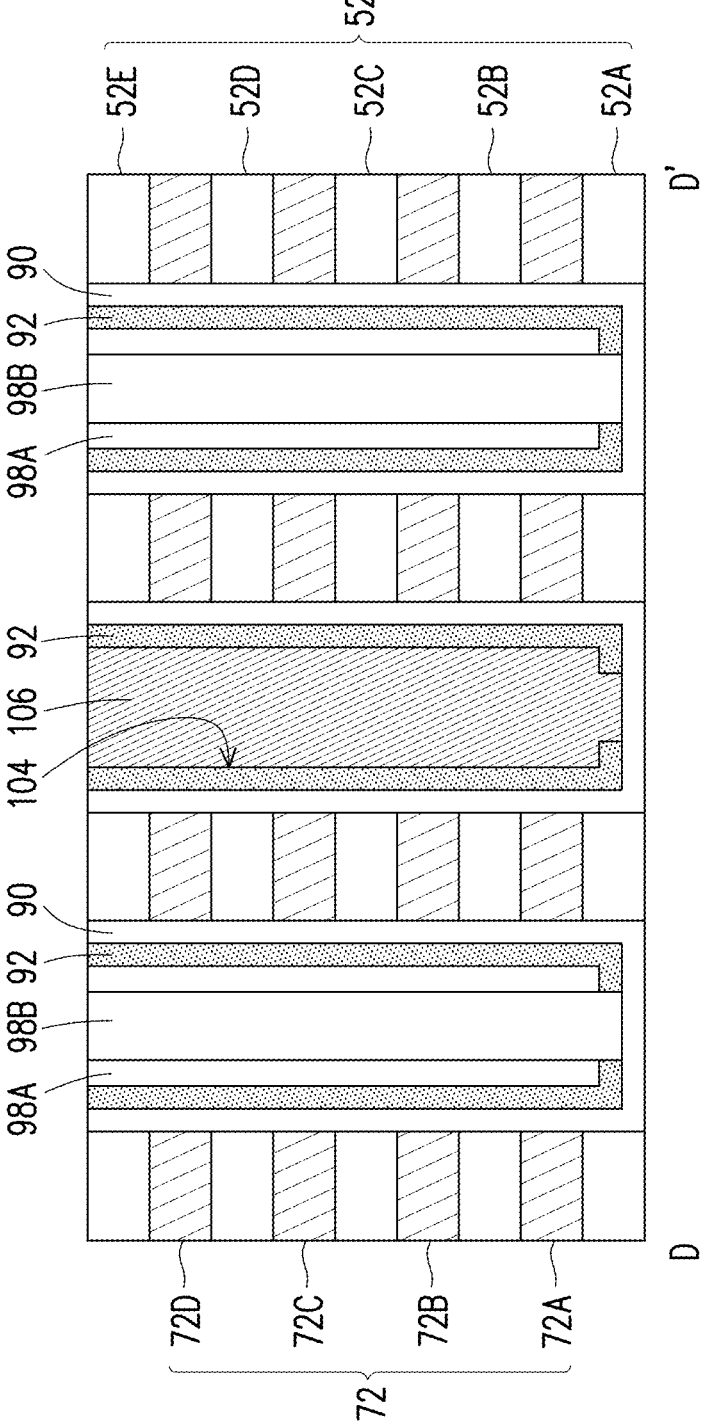
FIG. 26B

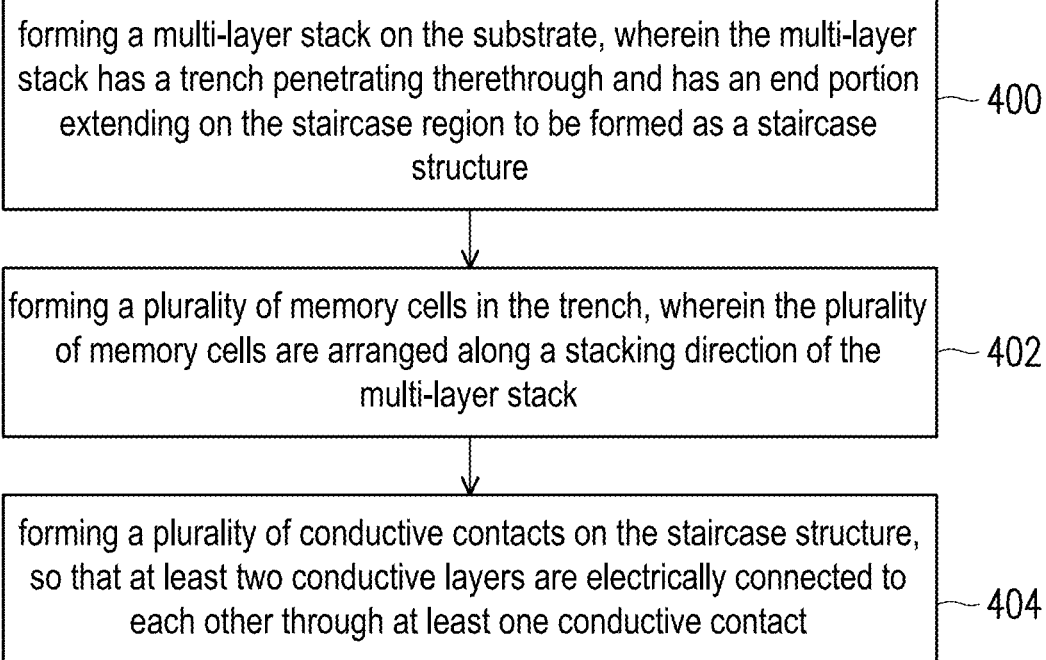

forming a multi-layer stack on the substrate, wherein the multi-layer stack has a trench penetrating therethrough and has an end portion extending on the staircase region to be formed as a staircase structure ⌐400 forming a plurality of memory cells in the trench, wherein the plurality of memory cells are arranged along a stacking direction of the multi-layer stack ⌐402 forming a plurality of conductive contacts on the staircase structure, so that at least two conductive layers are electrically connected to each other through at least one conductive contact ⌐404

FIG. 28

MEMORY DEVICE

CROSS-REFERENCE TO RELATED APPLICATION

This application is a continuation application of and claims the priority benefit of a prior application Ser. No. 17/400,081, filed on Aug. 11, 2021, now allowed, which claims the priority benefit of U.S. provisional application Ser. No. 63/137,759, filed on Jan. 15, 2021. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three-dimensional (3D) memory device has been introduced to replace a planar memory device. However, 3D memory device has not been entirely satisfactory in all respects, additional problems arise that should be addressed.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

FIGS. 1A, 1B, and 1C illustrate a simplified perspective view, a circuit diagram, and a top down view of a memory device in accordance with a first embodiment.

FIGS. 2, 3, 4, 5, 6, 7, 8, 9, 10, 11, 12, 13, 14, 15A, 15B, 16A, 16B, 17A, 17B, 18A, 18B, 19, 20, 21, 22A, 22B, 23A, 23B, 24A, 24B, 25A, 25B, 26A, 26B, 27A, 27B, 27C, 27D, and 27E illustrate varying views of manufacturing a memory device in accordance with a first embodiment.

FIG. 28 illustrates a method of forming a memory device in accordance with a first embodiment.

DETAILED DESCRIPTION

Figure 1A:
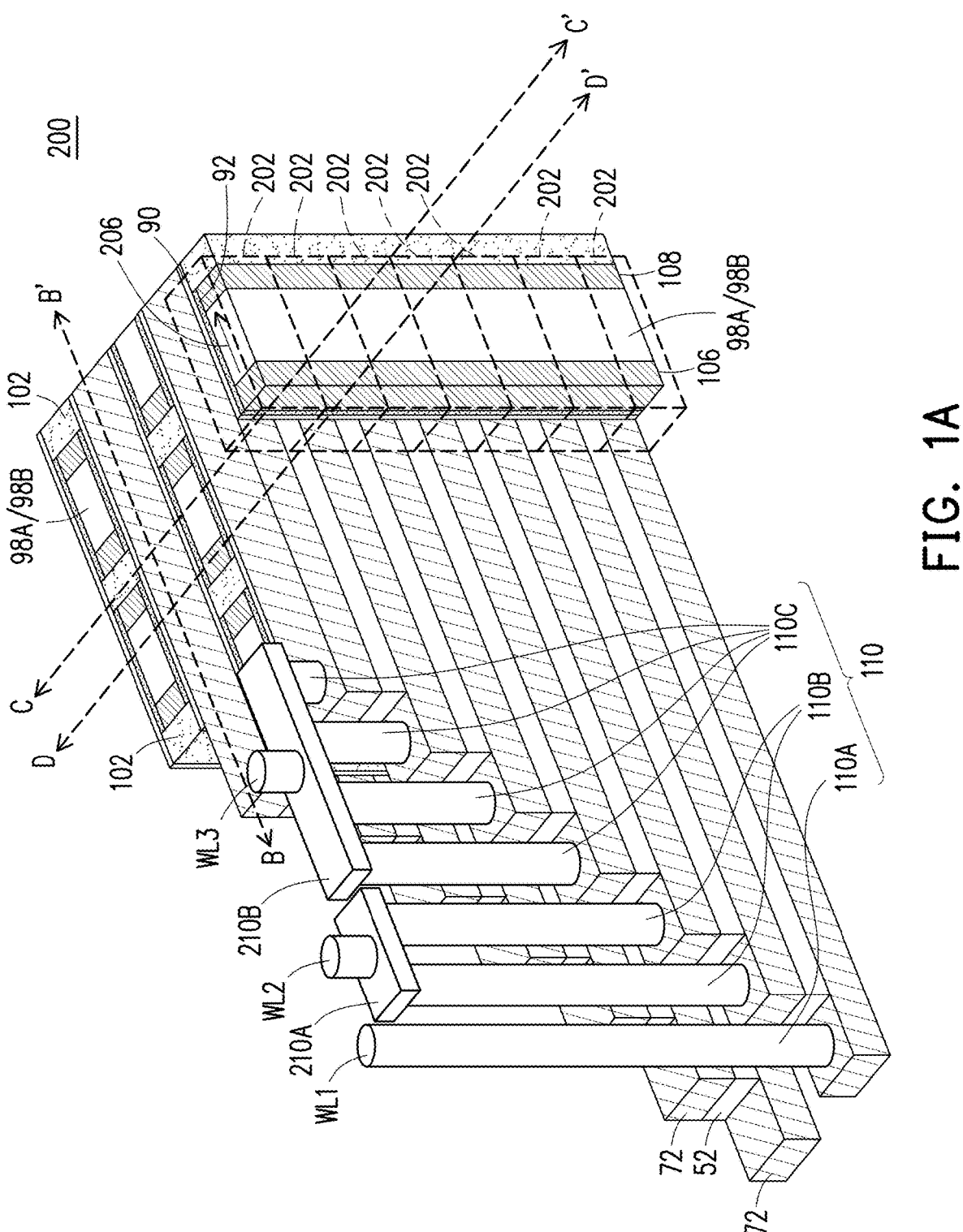

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

Among various non-volatile memories, the ferroelectric field effect transistor (FeFET) is a promising candidate for high-density, low-power application. Due to its field-driven operation, FeFET has advantages such as non-destructive readout, high program/erase speed, and low power consumption. In addition, FeFET has attracted more attention because of its high scalability and high CMOS compatibility. Toward even higher density, a 3D vertical structure has been proposed. A 3D vertical stacked ferroelectric structure has been recently developed and its memory operation have been demonstrated. In some embodiments, the 3D memory array is a FeFET memory circuit including a plurality of vertically stacked memory cells. In some embodiments, each memory cell is regarded as a FeFET that includes a word line region acting as a gate electrode, a bit line region acting as a first source/drain electrode, and a source line region acting as a second source/drain electrode, a ferroelectric material as a gate dielectric, and an oxide semiconductor (OS) as a channel region. In some embodiments, the oxide semiconductor channel is suitable for fast access speed due to its high mobility with very thin body.

In accordance with some embodiments, a memory device includes a multi-layer stack disposed on a substrate in an array region, wherein the multi-layer stack includes a plurality of conductive layers and a plurality of dielectric layers stacked alternately, and the multi-layer stack has an end portion extending on the staircase region to be shaped into a staircase structure. A plurality of memory cells are respectively disposed on sidewalls of the multi-layer stack in the array region, and arranged along a stacking direction of the multi-layer stack, so as to form a three-dimensional (3D) vertical configuration. It should be noted that at least two conductive layers are electrically connected to each other, so that corresponding two memory cells share the same word line. In such embodiment, the unit cell including the two memory cells may have different on-current ($I_{ON}$) from that of other unit cell including single one memory cell or more than two memory cells. Therefore, those unit cells with different on-current ($I_{ON}$) can be identified as different unit cells to store more than two logic states, thereby realizing the multi-level programming in the memory device. In this case, the memory device is applicable in the AI applications, such as Deep Neural Networks (DNN) computation, Convolutional Neural Networks (CNN) computation, in-memory computing, or the like.

Figure 1C:
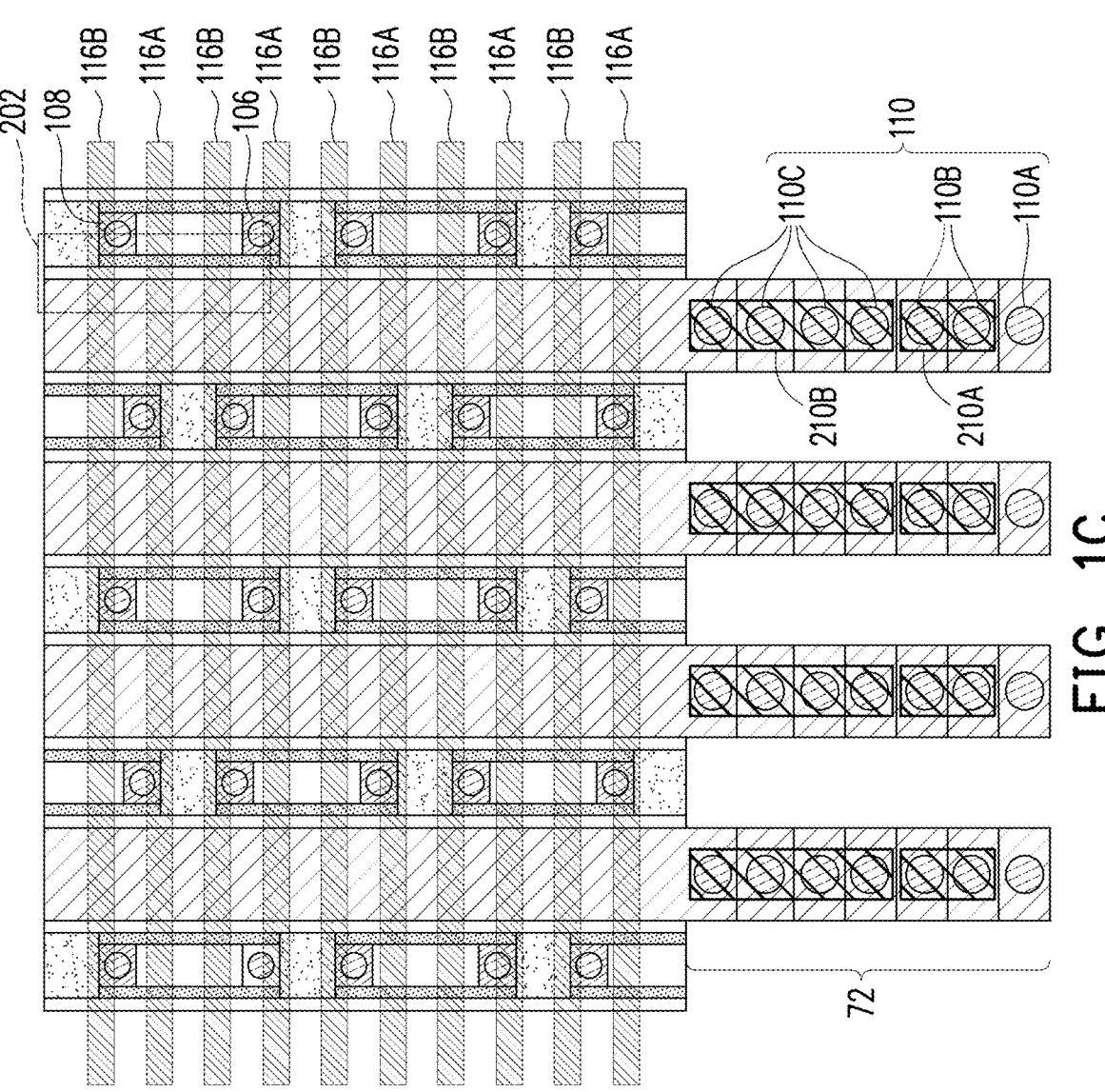

FIGS. 1A, 1B, and IC illustrate examples of a memory array according to a first embodiment. FIG. 1A illustrates an example of a portion of a simplified memory device 200 in a partial three-dimensional view; FIG. 1B illustrates a circuit diagram of the memory device 200; and FIG. 1C illustrates a top down view of the memory device 200 in accordance with the first embodiment. The memory device 200 includes a plurality of memory cells 202, which may be arranged in a grid of rows and columns. The memory cells 202 may further stacked vertically to provide a three-dimensional memory array, thereby increasing device density. The memory device 200 may be disposed in the back end of line (BEOL) of a semiconductor die. For example, the memory array may be disposed in the interconnect layers of the semiconductor die, such as, above one or more active devices (e.g., transistors) formed on a semiconductor substrate.

In some embodiments, the memory device 200 is a NOR memory array or architecture. In some embodiments, as shown in FIG. 1B, a gate of each memory cell 202 is electrically coupled to a respective word line (e.g., WL1, WL2, or WL3), a first source/drain region of each memory cell 202 is electrically coupled to a respective bit line (e.g., BL1 or BL2), and a second source/drain region of each memory cell 202 is electrically coupled to a respective source line (e.g., SL1 or SL2), which electrically couples the second source/drain region to ground. The memory cells 202 in a same horizontal row of the memory device 200 may share a common word line while the memory cells 202 in a same vertical column of the memory device 200 may share a common source line and a common bit line.

As shown in FIG. 1B, in the present embodiment, the memory cells 202 may be divided into at least three unit cells UC1, UC2, and UC3. Specifically, a first unit cell UC1 may include single one memory cell 202A; a second unit cell UC2 may include two memory cells 202B and 202C; and a third unit cell UC3 may include four memory cells 202D, 202E, 202F, and 202G. A gate of the memory cell 202A is electrically coupled to the word line WL1, a first source/drain region of memory cell 202A is electrically coupled to the bit line BL1, and a second source/drain region of the memory cell 202A is electrically coupled to the source line SL1. The memory cells 202A to 202G in a same vertical column of the memory device 200 may share the common source line SL1 and the common bit line BL1. It should be noted that gates of the two memory cells 202B and 202C are electrically connected to each other and together electrically coupled to the word line WL2. Similarly, gates of the four memory cells 202D, 202E, 202F, and 202G are electrically connected to each other and together electrically coupled to the word line WL3. In such embodiment, the unit cells UC1, UC2, and UC3 may include different amount of storage elements with different on-current ($I_{ON}$). For example, the first unit cell UC1 has one unit of on-current ($I_{ON}$); the second unit cell UC2 has two units of on-current ($I_{ON}$); and the third unit cell UC3 has four units of on-current ($I_{ON}$). In this case, the unit cells UC1, UC2, and UC3 can be identified as different unit cells to store more than two logic states, thereby realizing the multi-level programming in the memory device 200.

With the evolution of artificial intelligence (AI) operations, AI operations are more and more widely used. For example, neural network operations such as image analysis, speech analysis, and natural language processing are performed using neural network models. Therefore, AI research and development as well as application continues in various technical fields, and numerous algorithms suitable for Deep Neural Networks (DNN), Convolutional Neural Networks (CNN) and the like are also constantly being introduced. However, no matter which algorithm is used in neural network operations, the amount of data used in the hidden layer to achieve machine learning is enormous. In the present embodiment, the memory device 200 provides a plurality of unit cells UC1, UC2, and UC3 with different amount of memory cells 202 to achieve the multi-level programming, thereby improving the storage capacity and power efficiency. In this case, the memory device 200 of the present embodiment is applicable in the AI applications, such as DNN computation, CNN computation, in-memory computing, or the like.

The memory device 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not explicitly illustrated in FIGS. 1A and 1B). The conductive lines 72 may have a staircase configuration such that lower conductive lines 72 are longer than and extend laterally past endpoints of upper conductive lines 72. For example, in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory device 200, and conductive contacts may be made to exposed portions of the conductive lines 72, respectively.

The memory device 200 further includes conductive pillars 106 (e.g., electrically connected to bit lines) and conductive pillars 108 (e.g., electrically connected to source lines) arranged alternately. The conductive pillars 106 and 108 may each extend in a direction perpendicular to the conductive lines 72. A dielectric material 98A/98B is disposed between and isolates adjacent ones of the conductive pillars 106 and the conductive pillars 108.

Pairs of the conductive pillars 106 and 108 along with an intersecting conductive line 72 define boundaries of each memory cell 202, and an isolation pillar 102 is disposed between and isolates adjacent pairs of the conductive pillars 106 and 108. In some embodiments, the conductive pillars 108 are electrically coupled to ground. Although FIG. 1A illustrates a particular placement of the conductive pillars 106 relative the conductive pillars 108, it should be appreciated that the placement of the conductive pillars 106 and 108 may be exchanged in other embodiments.

In some embodiments, the memory device 200 may also include an oxide semiconductor (OS) material as a channel layer 92. The channel layer 92 may provide channel regions for the memory cells 202. For example, when an appropriate voltage (e.g., higher than a respective threshold voltage ($V_{th}$) of a corresponding memory cell 202) is applied through a corresponding conductive line 72, a region of the channel layer 92 that intersects the conductive line 72 may allow current to flow from the conductive pillars 106 to the conductive pillars 108 (e.g., in the direction indicated by arrow 206).

In some embodiments, a ferroelectric layer 90 is disposed between the channel layer 92 and each of the conductive lines 72 and the dielectric layers 52, and the ferroelectric layer 90 may serve as a gate dielectric for each memory cell 202. In some embodiments, the ferroelectric layer 90 includes a ferroelectric material, such as a hafnium oxide, hafnium zirconium oxide, silicon-doped hafnium oxide, or the like. In such embodiment, the memory device 200 may be referred to as a ferroelectric memory device. However, the embodiments of the present disclosure are not limited thereto. In other embodiments, the ferroelectric layer 90 may be replaced by any suitable switching material, such as a phase change material, a variable resistance material, or the like. In this case, the memory device 200 may be referred to as a change random access memory (PCRAM) device, a resistive random access memory (RRAM) cell, or the like.

The ferroelectric layer 90 may be polarized in one of two different directions, and the polarization direction may be changed by applying an appropriate voltage differential across the ferroelectric layer 90 and generating an appropriate electric field. The polarization may be relatively localized (e.g., generally contained within each boundaries of the memory cells 202), and a continuous region of the ferroelectric layer 90 may extend across a plurality of memory cells 202. Depending on a polarization direction of a particular region of the ferroelectric layer 90, a threshold voltage of a corresponding memory cell 202 varies, and a digital value (e.g., 0 or 1) can be stored. For example, when a region of the ferroelectric layer 90 has a first electrical polarization direction, the corresponding memory cell 202 may have a relatively low threshold voltage, and when the region of the ferroelectric layer 90 has a second electrical polarization direction, the corresponding memory cell 202 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on one or more memory cells 202 of the respective unit cell UC1, UC2, or UC3 in such embodiments, a write voltage is applied across a portion of the ferroelectric layer 90 corresponding to the one or more memory cells 202 of the respective unit cell UC1, UC2, or UC3. For example, as shown in FIG. 1B, the write voltage is applied by applying appropriate voltages to a corresponding conductive line 72 (e.g., the word line WL1) and the corresponding conductive pillars 106/108 (e.g., the bit line BL1/source line SL1). By applying the write voltage across the portion of the ferroelectric layer 90, a polarization direction of the region of the ferroelectric layer 90 can be changed. As a result, the corresponding threshold voltage of the corresponding memory cell 202A can also be switched from a low threshold voltage to a high threshold voltage or vice versa, and a digital value can be stored in the memory cell 202A. Because the conductive lines 72 intersect the conductive pillars 106 and 108, individual memory cells 202 may be selected for the write operation.

To perform a read operation on one or more memory cells 202 of the respective unit cell UC1, UC2, or UC3 in such embodiments, a read voltage (a voltage between the low and high threshold voltages) is applied to the corresponding the one or more memory cells 202 of the respective unit cell UC1, UC2, or UC3. Depending on the polarization direction of the corresponding region of the ferroelectric layer 90, the one or more memory cells 202 of the respective unit cell UC1, UC2, or UC3 may or may not be turned on. As a result, the conductive pillar 106 may or may not be discharged through the conductive pillar 108 (e.g., a source line that is coupled to ground), and the digital value stored in the unit cell UC1, UC2, or UC3 can be determined. Because the conductive lines 72 intersect the conductive pillars 106 and 108, individual memory cells 202 may be selected for the read operation.

FIG. 1A further illustrates reference cross-sections of the memory device 200 that are used in later Figures. Cross-section B-B' is along a longitudinal axis of conductive lines 72 and in a direction, for example, parallel to the direction of current flow of the memory cells 202. Cross-section C-C' is perpendicular to cross-section B-B' and extends through the dielectric materials 98A/98B and the isolation pillars 102. Cross-section D-D' is perpendicular to cross-section B-B' and extends through the dielectric materials 98A/98B and the conductive pillars 106. Subsequent figures refer to these reference cross-sections for clarity.

Figure 2:
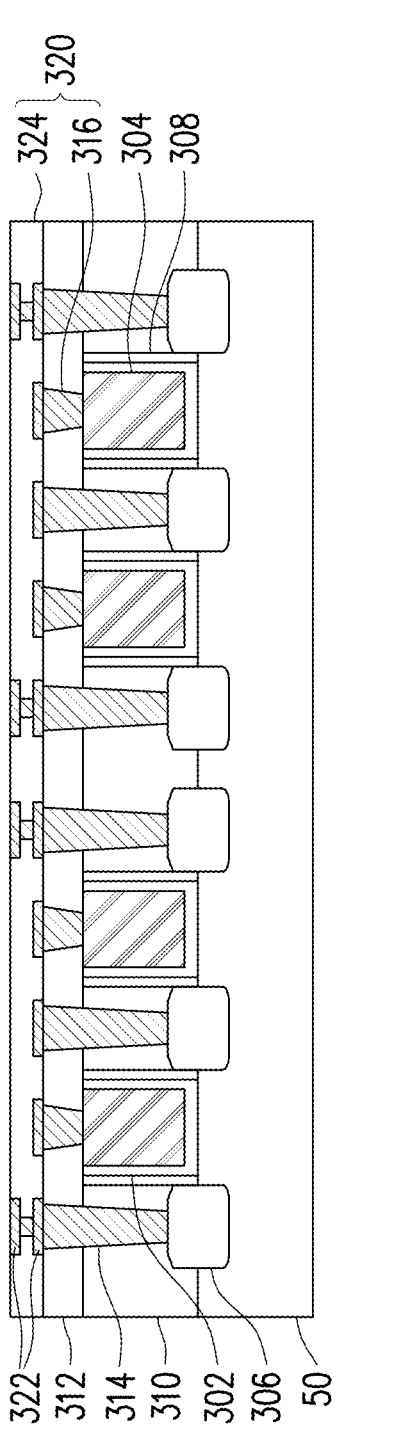

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be an integrated circuit die, such as a logic die, a memory die, an ASIC die, or the like. The substrate 50 may be a complementary metal oxide semiconductor (CMOS) die and may be referred to as a CMOS under array (CUA). The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include transistors at a top surface of the substrate 50. The transistors may include gate dielectric layers 302 over top surfaces of the substrate 50 and gate electrodes 304 over the gate dielectric layers 302. Source/drain regions 306 are disposed in the substrate 50 on opposite sides of the gate dielectric layers 302 and the gate electrodes 304. Gate spacers 308 are formed along sidewalls of the gate dielectric layers 302 and separate the source/drain regions 306 from the gate electrodes 304 by appropriate lateral distances. The transistors may include fin field effect transistors (FinFETs), nanostructure (e.g., nanosheet, nanowire, gate-all-around, or the like) FETS (nano-FETs), planar FETs, the like, or combinations thereof, and may be formed by gate-first processes or gate-last processes.

A first inter-layer dielectric (ILD) 310 surrounds and isolates the source/drain regions 306, the gate dielectric layers 302, and the gate electrodes 304 and a second ILD 312 is over the first ILD 310. Source/drain contacts 314 extend through the second ILD 312 and the first ILD 310 and are electrically coupled to the source/drain regions 306 and gate contacts 316 extend through the second ILD 312 and are electrically coupled to the gate electrodes 304. An interconnect structure 320 is over the second ILD 312, the source/drain contacts 314, and the gate contacts 316. The interconnect structure 320 includes one or more stacked dielectric layers 324 and conductive features 322 formed in the one or more dielectric layers 324, for example. The interconnect structure 320 may be electrically connected to the gate contacts 316 and the source/drain contacts 314 to form functional circuits. In some embodiments, the functional circuits formed by the interconnect structure 320 may include logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3:

In FIG. 3, a multi-layer stack 58 is formed over the structure of FIG. 2. The substrate 50, the transistors, the ILDs, and the interconnect structure 320 may be omitted from subsequent drawings for the purposes of simplicity and clarity. Although the multi-layer stack 58 is illustrated as contacting the dielectric layers 324 of the interconnect structure 320, any number of intermediate layers may be disposed between the substrate 50 and the multi-layer stack 58. For example, one or more interconnect layers including conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory device 200 (see FIGS. 1A and 1B). In some embodiments, one or more interconnect layers including conductive features in insulating layers (e.g., low-k dielectric layers) may be disposed over the multi-layer stack 58.

In FIG. 3, the multi-layer stack 58 includes alternating layers of sacrificial layers 53A-53D (collectively referred to as sacrificial layers 53) and dielectric layers 52A-52E (collectively referred to as dielectric layers 52). The sacrificial layers 53 may be patterned and replaced in subsequent steps to define conductive lines 72 (e.g., the word lines). Although four layers of the sacrificial layers 53 and five layers of the dielectric layers 52 are illustrated in FIG. 3, the embodiments of the present disclosure are not limited thereto. In other embodiments, the number of layers of the sacrificial layers 53 and the dielectric layers 52 may be adjusted by the needs. For example, seven layers of the sacrificial layers 53 (may be replaced in the subsequent steps by the conductive lines 72) and six layers of the dielectric layers 52 between the conductive lines 72 is shown in FIG. 1A. The sacrificial layers 53 may include dielectric materials, such as silicon oxide, silicon nitride, silicon oxynitride, combinations thereof, or the like. The dielectric layers 52 may include insulating materials, such as silicon oxide, silicon nitride, silicon oxynitride, combinations thereof, or the like. The sacrificial layers 53 and the dielectric layers 52 include different materials with different etching selectivities. In some embodiments, the sacrificial layers 53 include silicon nitride, and the dielectric layers 52 include silicon oxide. Each of the sacrificial layers 53 and the dielectric layers 52 may be formed using, for example, chemical vapor deposition (CVD), atomic layer deposition (ALD), physical vapor deposition (PVD), plasma enhanced CVD (PECVD), or the like.

Although FIG. 3 illustrates a particular number of the sacrificial layers 53 and the dielectric layers 52, other embodiments may include different numbers of the sacrificial layers 53 and the dielectric layers 52. Besides, although the multi-layer stack 58 is illustrated as having dielectric layers as topmost and bottommost layers, the disclosure is not limited thereto. In some embodiments, at least one of the topmost and bottommost layers of the multi-layer stack 58 is a sacrificial layer.

FIGS. 4 through 12 are views of intermediate stages in the manufacturing a staircase structure of the memory device 200, in accordance with some embodiments. FIGS. 4 through 12 are illustrated along reference cross-section B-B' illustrated in FIG. 1A.

Figure 4:

In FIG. 4, a photoresist 56 is formed over the multi-layer stack 58. In some embodiments, the photoresist 56 is formed by a spin-on technique and patterned by an acceptable photolithography technique. Patterning the photoresist 56 may expose the multi-layer stack 58 in regions 60, while masking remaining portions of the multi-layer stack 58. For example, a topmost layer of the multi-layer stack 58 (e.g., the dielectric layer 52E) may be exposed in the regions 60.

Figure 5:

In FIG. 5, the exposed portions of the multi-layer stack 58 in the regions 60 are etched using the photoresist 56 as a mask. The etching may be any acceptable etching process, such as a dry etch (e.g., a reactive ion etch (RIE), a neutral beam etch (NBE), the like), a wet etch, the like, or a combination thereof. The etching may be anisotropic. The etching may remove portions of the dielectric layer 52E and the sacrificial layer 53D in the regions 60 and define openings 61. Because the dielectric layer 52E and the sacrificial layer 53D have different material compositions, etchants used to remove exposed portions of these layers may be different. In some embodiments, the sacrificial layer 53D acts as an etch stop layer while etching the dielectric layer 52E, and the dielectric layer 52D acts as an etch stop layer while etching sacrificial layer 53D. As a result, the portions of the dielectric layer 52E and the sacrificial layer 53D may be selectively removed without removing remaining layers of the multi-layer stack 58, and the openings 61 may be extended to a desired depth. Alternatively, a time-mode etching process may be used to stop the etching of the openings 61 after the openings 61 reach a desired depth. In the resulting structure, the dielectric layer 52D is exposed in the regions 60.

Figure 6:

In FIG. 6, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced and portions the multi-layer stack 58 in the regions 60 and regions 62 may be exposed. For example, top surfaces of the dielectric layer 52D may be exposed in the regions 60, and top surfaces of the dielectric layer 52E may be exposed in the regions 62.

Figure 7:

In FIG. 7, portions of the dielectric layer 52E, the sacrificial layer 53D, the dielectric layer 52D, and the sacrificial layer 53C in the regions 60 and the regions 62 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. Because the sacrificial layers 53D and 53C and the dielectric layers 52E and 52D have different material compositions, etchants used to remove exposed portions of these layers may be different. In some embodiments, portions of the dielectric layers 52E and 52D in the regions 62 and 60 are removed by using the photoresist 56 as a mask and using the underlying sacrificial layers 53D and 53C as etch stop layers. Thereafter, the exposed portions of the sacrificial layers 53D and 53C in the regions 62 and 60 are removed by using the photoresist 56 as a mask and using the underlying dielectric layers 52D and 52C as etching stop layers. In the resulting structure, the dielectric layer 52C is exposed in the regions 60, and the dielectric layer 52D is exposed in the regions 62.

Figure 8:
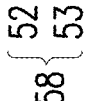

In FIG. 8, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, and regions 64 may be exposed. For example, top surfaces of the dielectric layer 52C may be exposed in the regions 60; top surfaces of the dielectric layer 52D may be exposed in the regions 62; and top surfaces of the dielectric layer 52E may be exposed in the regions 64.

Figure 9:

In FIG. 9, portions of the dielectric layers 52E, 52D, and 52C and the sacrificial layers 53D, 53C, and 53B in the regions 60, the regions 62, and the regions 64 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. Because the dielectric layers 52C-52E and the sacrificial layers 53B-53D have different material compositions, etchants used to remove exposed portions of these layers may be different. In some embodiments, portions of the dielectric layers 52E, 52D and 52C in the regions 64, 62 and 60 are removed by using the photoresist 56 as a mask and using the underlying sacrificial layers 53D, 53C and 53B as etch stop layers. Thereafter, the exposed portions of the sacrificial layers 53D, 53C and 53B in the regions 64, 62 and 60 are removed by using the photoresist 56 as a mask and using the underlying dielectric layers 52D, 52C and 52B as etching stop layers. In the resulting structure, the dielectric layer 52B is exposed in the regions 60; the dielectric layer 52C is exposed in the regions 62; and the dielectric layer 52D is exposed in the regions 64.

Figure 10:

In FIG. 10, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, the regions 64, and regions 66 may be exposed. For example, top surfaces of the dielectric layer 52B may be exposed in the regions 60; top surfaces of the dielectric layer 52C may be exposed in the regions 62; and top surfaces of the dielectric layer 52D may be exposed in the regions 64; and top surfaces of the dielectric layer 52E may be exposed in the regions 66.

Figure 11:

In FIG. 11, portions of the dielectric layers 52E, 52D, 52C, and 52B in the regions 60, the regions 62, the regions 64, and the regions 66 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. In some embodiments, portions of the dielectric layers 52E, 52D, 52C and 52B in the regions 66, 64, 62 and 60 are removed by using the photoresist 56 as a mask and using the underlying sacrificial layers 53D, 53C, 53B and 53A as etch stop layers. In the resulting structure, the sacrificial layer 53A is exposed in the regions 60; the sacrificial layer 53B is exposed in the regions 62; the sacrificial layer 53C is exposed in the regions 64; and the sacrificial layer 53D is exposed in the regions 66. Thereafter, the photoresist 56 may be removed by an acceptable ashing or wet strip process.

Figure 12:

In FIG. 12, an inter-metal dielectric (IMD) 70 is deposited over the multi-layer stack 58. The IMD 70 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the IMD 70 may include an oxide (e.g., silicon oxide or the like), a nitride (e.g., silicon nitride or the like), a combination thereof or the like. Other dielectric materials formed by any acceptable process may be used. The IMD 70 extends along sidewalls of the sacrificial layers 53B-53D and sidewalls of the dielectric layers 52B-52E. Further, the IMD 70 may contact top surfaces of the sacrificial layers 53A-53D and the dielectric layer 52E.

Thereafter, a removal process is applied to the IMD 70 to remove excess dielectric material over the multi-layer stack 58. In some embodiments, the removal process may be a planarization process, such as a chemical mechanical polish (CMP), an etch-back process, combinations thereof, or the like. The planarization process exposes the multi-layer stack 58 such that top surfaces of the multi-layer stack 58 and IMD 70 are level after the planarization process is completed.

Figure 16A:
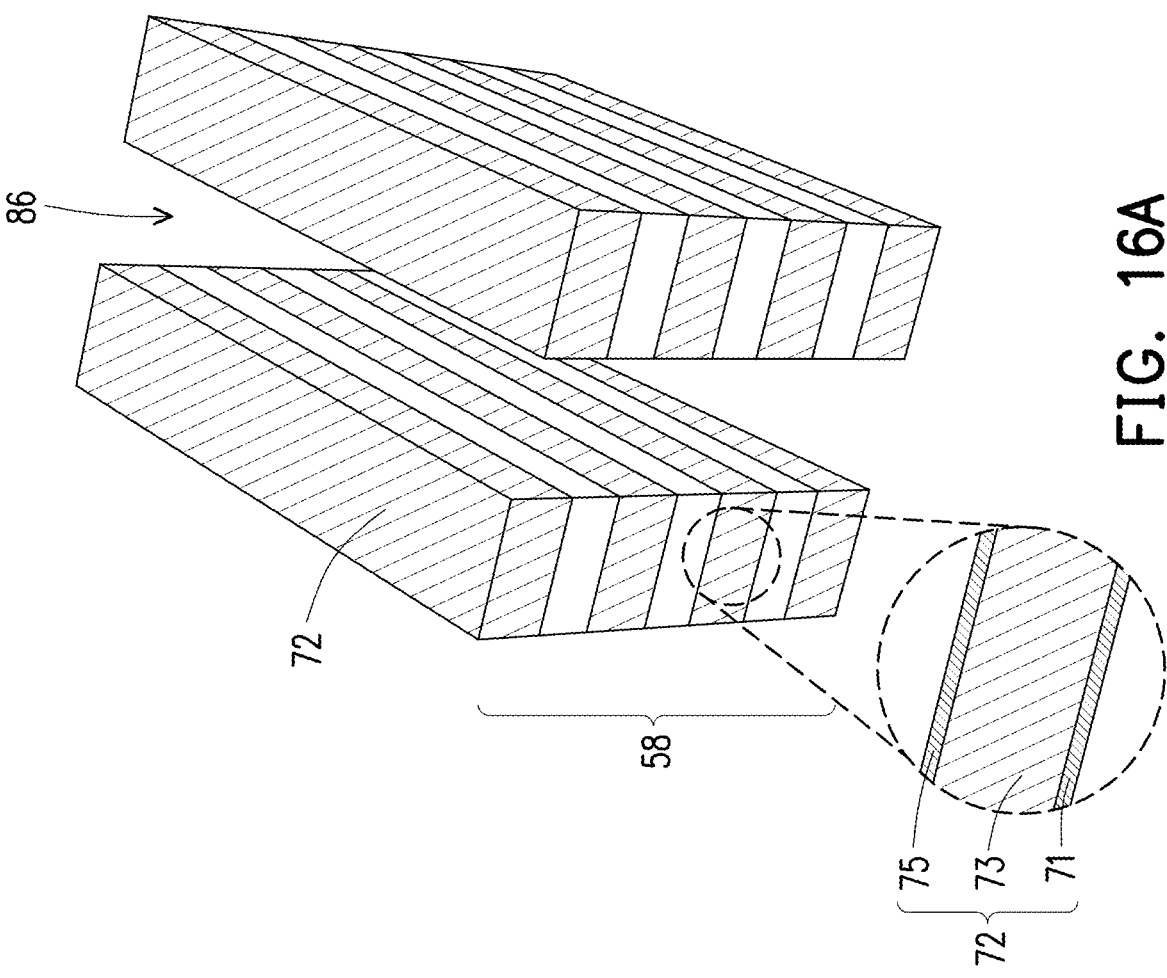

As shown in FIG. 12, an intermediate and bulk staircase structure is thus formed. The intermediate staircase structure includes alternating layers of sacrificial layers 53 and dielectric layers 52. The sacrificial layers 53 are subsequently replaced with conductive lines 72, which will be described in details in FIGS. 16A and 16B. Lower conductive lines 72 are longer and extend laterally past upper conductive lines 72, and a width of each of the conductive lines 72 increases in a direction towards the substrate 50 (see FIG. 1A).

FIGS. 13 through 16B are views of intermediate stages in the manufacturing of a memory region of the memory device 200, in accordance with some embodiments. In FIGS. 13 through 16B, the bulk multi-layer stack 58 is patterned to form trenches 86 therethrough, and sacrificial layers 53 are replaced with conductive materials to define the conductive lines 72. The conductive lines 72 may correspond to word lines in the memory device 200, and the conductive lines 72 may further provide gate electrodes for the resulting memory cells of the memory device 200. FIGS. 13, 14, 15B and 16B are illustrated along reference cross-section C-C' illustrated in FIG. 1A. FIGS. 15A and 16A are illustrated in a partial three-dimensional view.

Figure 13:
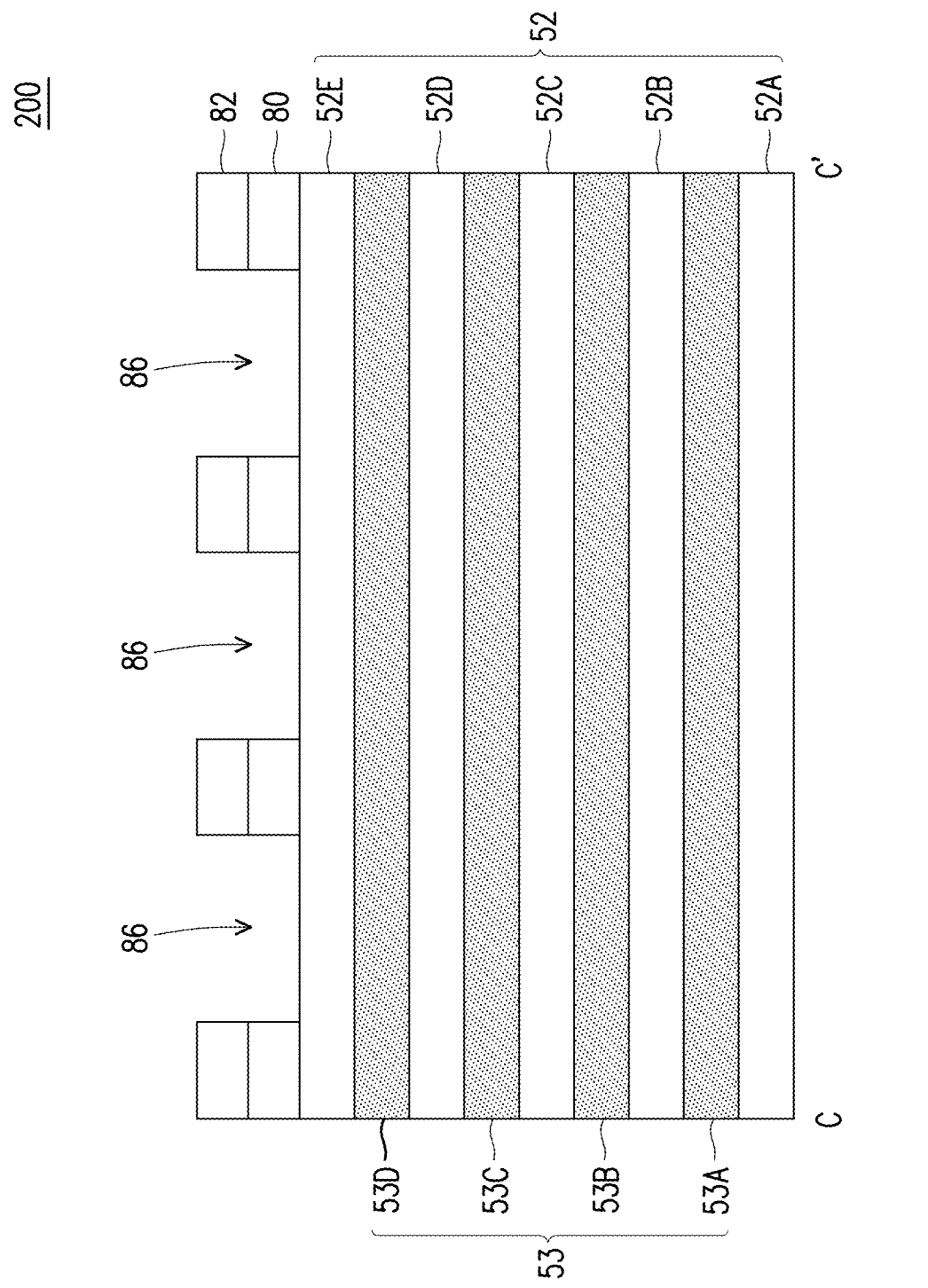

In FIG. 13, photoresist patterns 82 and underlying hard mask patterns 80 are formed over the multi-layer stack 58. In some embodiments, a hard mask layer and a photoresist layer are sequentially formed over the multi-layer stack 58. The hard mask layer may include, for example, silicon nitride, silicon oxynitride, or the like, which may be deposited by CVD, PVD, ALD, PECVD, or the like. The photoresist layer is formed by a spin-on technique, for example.

Thereafter, the photoresist layer is patterned to form photoresist patterns 82 and trenches 86 between the photoresist patterns 82. The photoresist layer is patterned by an acceptable photolithography technique, for example. The patterns of the photoresist patterns 82 are then transferred to the hard mask layer to form hard mask patterns 80 by using an acceptable etching process, such as by a dry etch (e.g., RIE, NBE, the like), a wet etch, the like, or a combination thereof. The etching may be anisotropic. Thus, trenches 86 are formed extending through the hard mask layer. Thereafter, the photoresist 82 may be optionally removed by an ashing process, for example.

Figure 14:
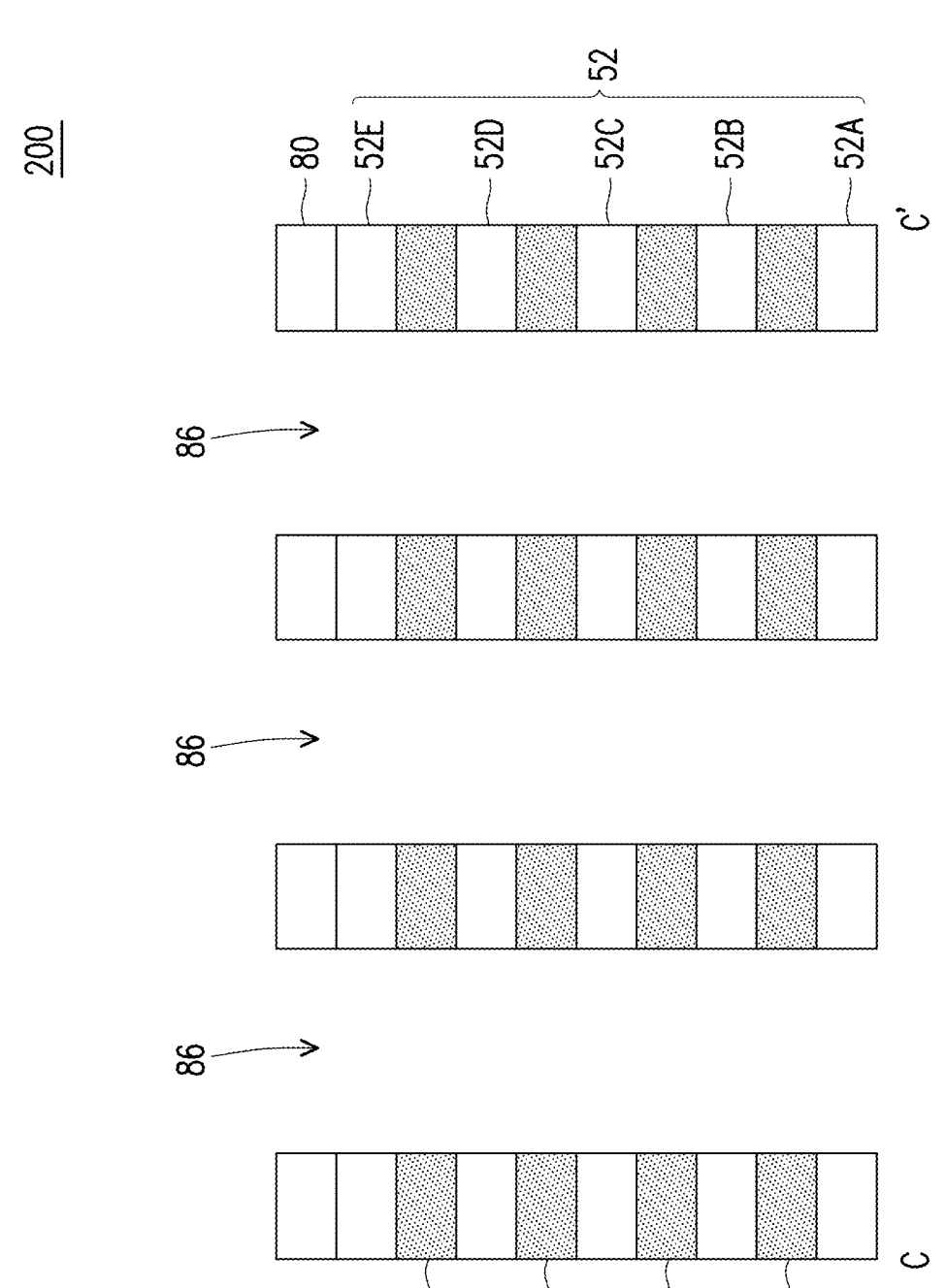
Figure 15A:
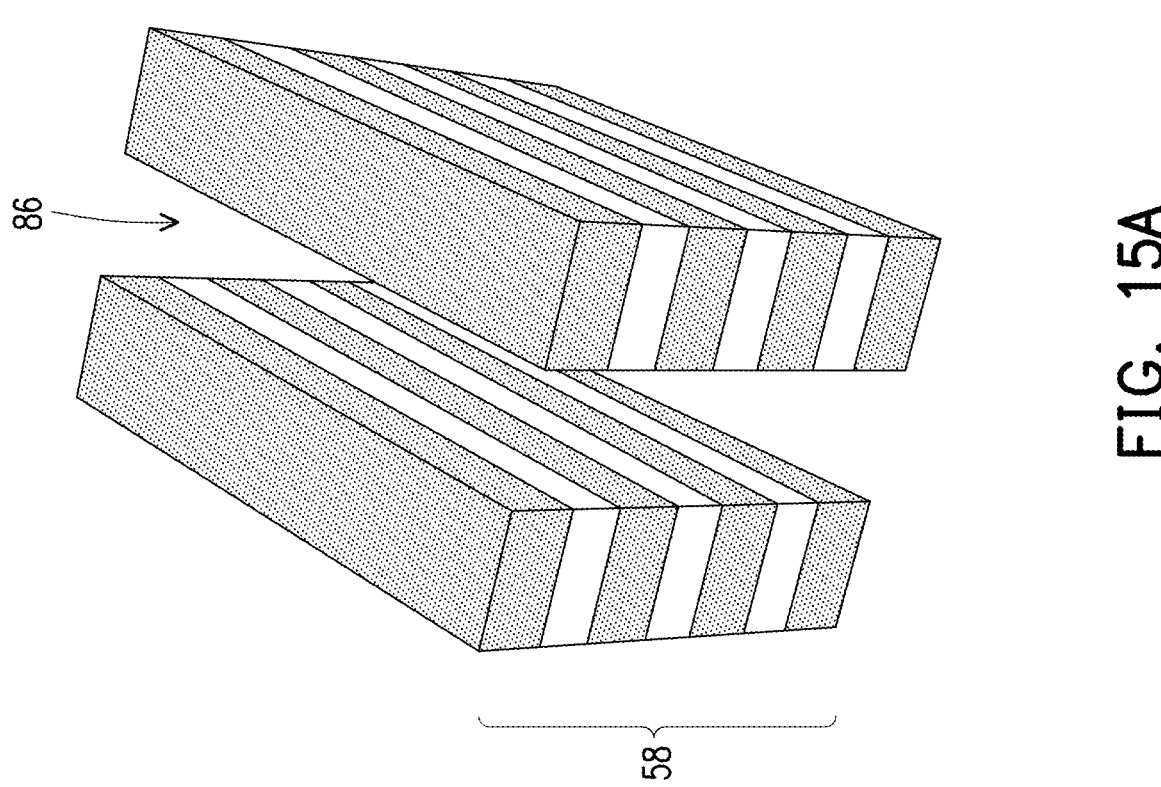

In FIGS. 14 to 15B, the patterns of the hard mask patterns 80 are transferred to the multi-layer stack 58 using one or more acceptable etching processes, such as by a dry etch (e.g., RIE, NBE, the like), a wet etch, the like, or a combination thereof. The etching processes may be anisotropic. Thus, the trenches 86 extend through the bulk multi-layer stack 58, and strip-shaped sacrificial layers 53 and strip-shaped dielectric layers 52 are accordingly defined. In some embodiments, the trenches 86 extend through the bulk staircase structure, and strip-shaped staircase structures are accordingly defined. The hard mask patterns 80 may be then removed by an acceptable process, such as a wet etching process, a dry etching process, a planarization process, combinations thereof, or the like.

In FIGS. 15 to 16B, the sacrificial layers 53A-53D (collectively referred to as sacrificial layers 53) are replaced with conductive lines 72A-72D (collectively referred to as conductive lines 72). In some embodiments, the sacrificial layers 53 are removed by an acceptable process, such as a wet etching process, a dry etching process or both. In the embodiment, a periphery region surrounding an array region with a memory array has some portions of the sacrificial layers 53 that are not removed by the said replacement or etching process. Therefore, some portions of the sacrificial layers 53 in the periphery region may provides further support to prevent the dielectric layers 22 in the array region from collapse. Thereafter, conductive lines 72 are filled into the space between two adjacent dielectric layers 52. In some embodiments, each conductive line 72 includes TiN, TaN, W, Ru, Al, the like or a combination thereof. In some embodiments, each conductive line 72 is made by a single material such as TiN. In some embodiments, each conductive line 72 is a multi-layer structure. For example, as shown in the local enlarged view, each conductive line 72 includes two barrier layers 71 and 75 and a metal layer 73 between the barrier layers 71 and 75. Specifically, a barrier layer is disposed between the metal layer 73 and the adjacent dielectric layer 52. The barrier layers may prevent the metal layer from diffusion to the adjacent dielectric layers 52. The barrier layers may also provide the function of increasing the adhesion between the metal layer and the adjacent dielectric layers, and may be referred to as glue layers in some examples. In some embodiments, both barrier layers and glue layers with different materials are provided as needed. The barrier layers 71 and 75 are formed of a first conductive material, such as a metal nitride, such as titanium nitride, tantalum nitride, molybdenum nitride, zirconium nitride, hafnium nitride, or the like. The metal layer 73 may are formed of a second conductive material, such as a metal, such as tungsten, ruthenium, molybdenum, cobalt, aluminum, nickel, copper, silver, gold, alloys thereof, or the like. The barrier layers 71, 75 and metal layer 73 may each be formed by an acceptable deposition process such as CVD, PVD, ALD, PECVD, or the like. The barrier layers 71, 75 and the metal layer 73 are further deposited on the sidewalls of the multi-layer stack 58 and fill in the trenches 86. Thereafter, the barrier layers 71, 75 and the metal layer 73 in the trenches 86 are removed by an etching back process.

An acceptable etch back process may be performed to remove excess materials from the sidewalls of the dielectric layers 52 and the bottom surfaces of the trenches 86. The acceptable etch back process includes a dry etch (e.g., RIE, NBE, the like), a wet etch, the like, or a combination thereof. The acceptable etch back process may be anisotropic.

In some embodiments, upon the replacement process, the sacrificial layers 53 of the strip-shaped staircase structures are subsequently replaced with conductive lines 72 (see FIG. 1A).

Figure 17A:

FIGS. 17A through 22B illustrate forming and patterning channel regions for the memory cells 202 (see FIG. 1A) in the trenches 86. FIGS. 17A, 18A and 22A are illustrated in a partial three-dimensional view. In FIGS. 17B, 18B, 19, 20, 21 and 22B cross-sectional views are provided along line C-C' of FIG. 1A.

In FIGS. 17A through 20, a ferroelectric layer 90, a channel layer 92, and a dielectric material 98A are deposited in the trenches 86.

Figure 17B:
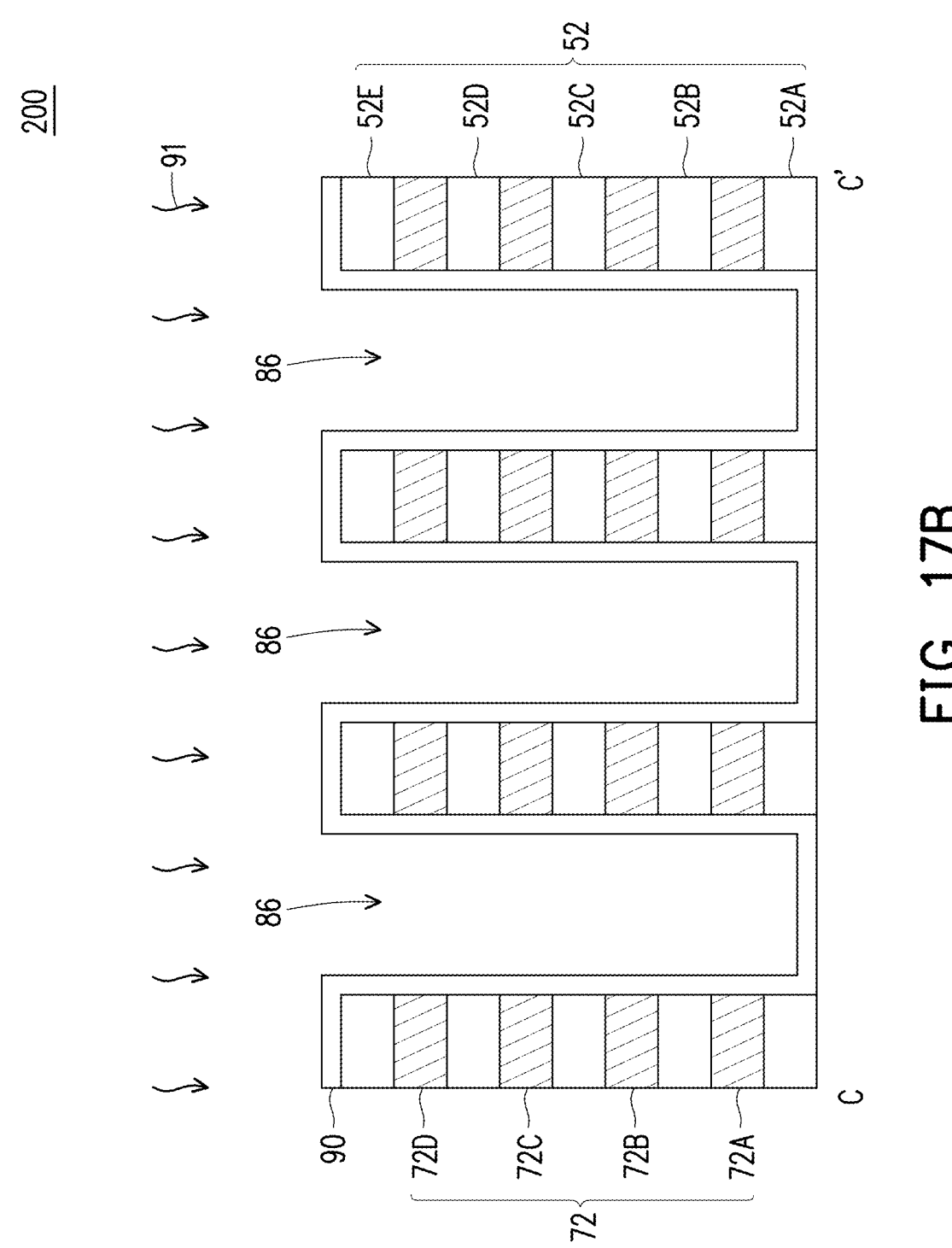

In FIGS. 17A and 17B, a ferroelectric layer 90 may be deposited conformally in the trenches 86 along sidewalls of the conductive lines 72 and along top surfaces of the dielectric layer 52E, and along the bottom surfaces of the trenches 86. In some embodiments, a ferroelectric layer 90 may be further deposited on the IMD 70 and along the sidewall of each step of the staircase structure in the staircase region. The ferroelectric layer 90 may include materials that are capable of switching between two different polarization directions by applying an appropriate voltage differential across the ferroelectric layer 90. For example, the ferroelectric layer 90 includes a high-k dielectric material, such as a hafnium (Hf) based dielectric materials or the like. In some embodiments, the ferroelectric layer 90 includes hafnium oxide, hafnium zirconium oxide, silicon-doped hafnium oxide, or the like.

In some embodiments, the ferroelectric layer 90 is hafnium oxide ($HfO_2$) doped by Al, Si, Zr, La, Gd, or Y, in an embodiment. In some embodiments, a ferroelectric material, such as HZO, HSO, HfSiO, HfLaO, $HfZrO_2$ (HZO), or $ZrO_2$, is used as the ferroelectric material. A suitable formation method, such as PVD, CVD, ALD, or the like, may be used to form the ferroelectric layer 90. In some alternative embodiments, the ferroelectric layer 90 may be replaced by a charge storage layer, such as a layer of $SiN_x$ between two $SiO_x$ layers (e.g., an ONO structure). In other embodiments, the ferroelectric layer 90 may be replaced by any suitable switching material, such as a phase change material, a variable resistance material, or the like.

In some embodiments, the ferroelectric layer 90 has a thickness of about 1-20 nm, such as 5-10 nm. Other thickness ranges (e.g., more than 20 nm or 5-15 nm) may be applicable. In some embodiments, the ferroelectric layer 90 is a single-layered structure, a bi-layered structure, or a multi-layered structure.

Thereafter, an annealing process 91 is performed to the ferroelectric layer 90. The temperature range of the annealing process 91 ranges from about 300° C. to about 450° C. (e.g., 350° C. to about 400° C.), so as to achieve a desired crystalline lattice structure, improve film quality, and reduce film-related defects/impurities for the ferroelectric layer 90. In some embodiments, the annealing process 91 may further be below 400° C. to meet a BEOL thermal budget and reduce defects that may result in other features from high-temperature annealing processes.

Figure 18A:
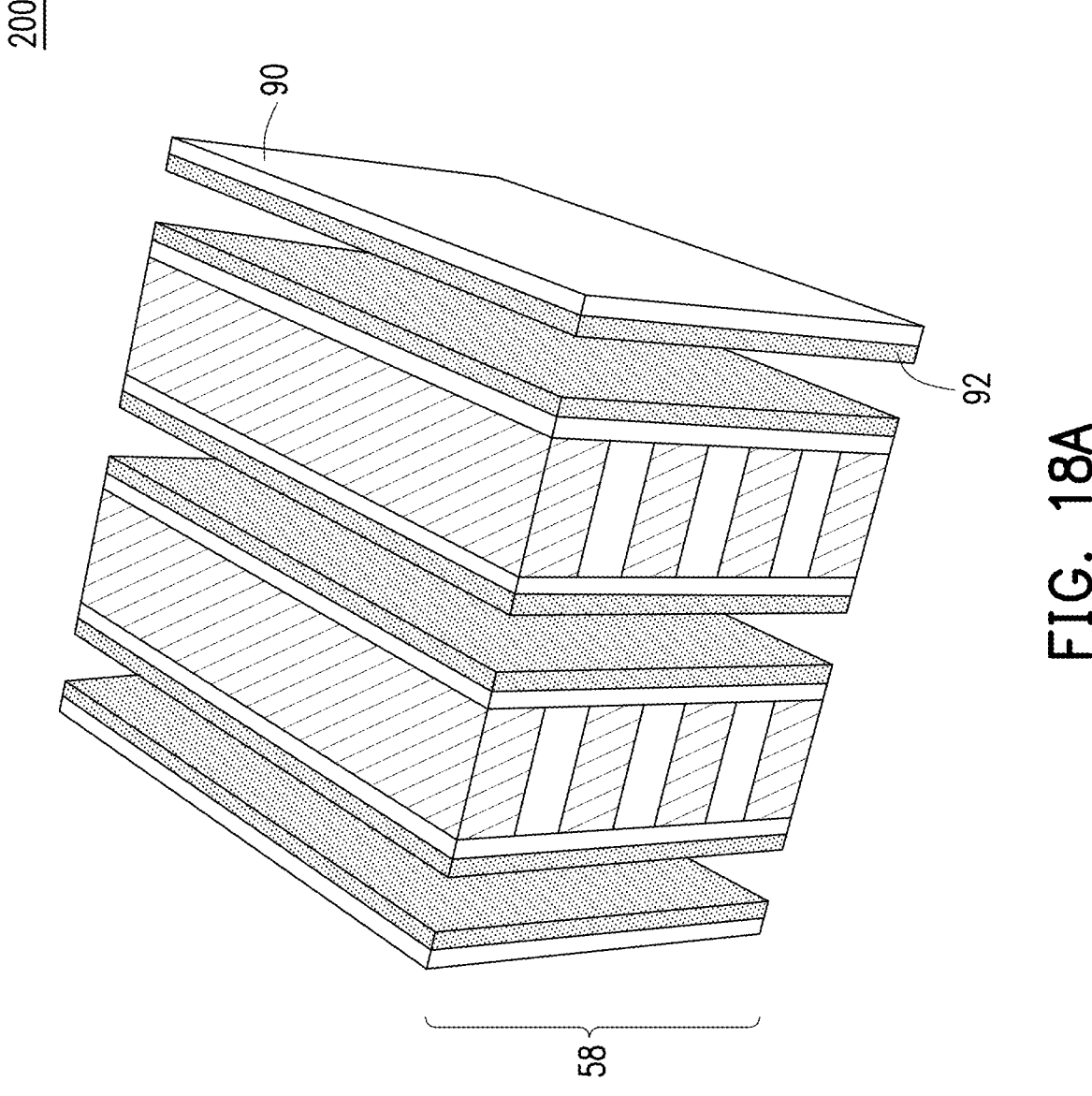
Figure 18B:
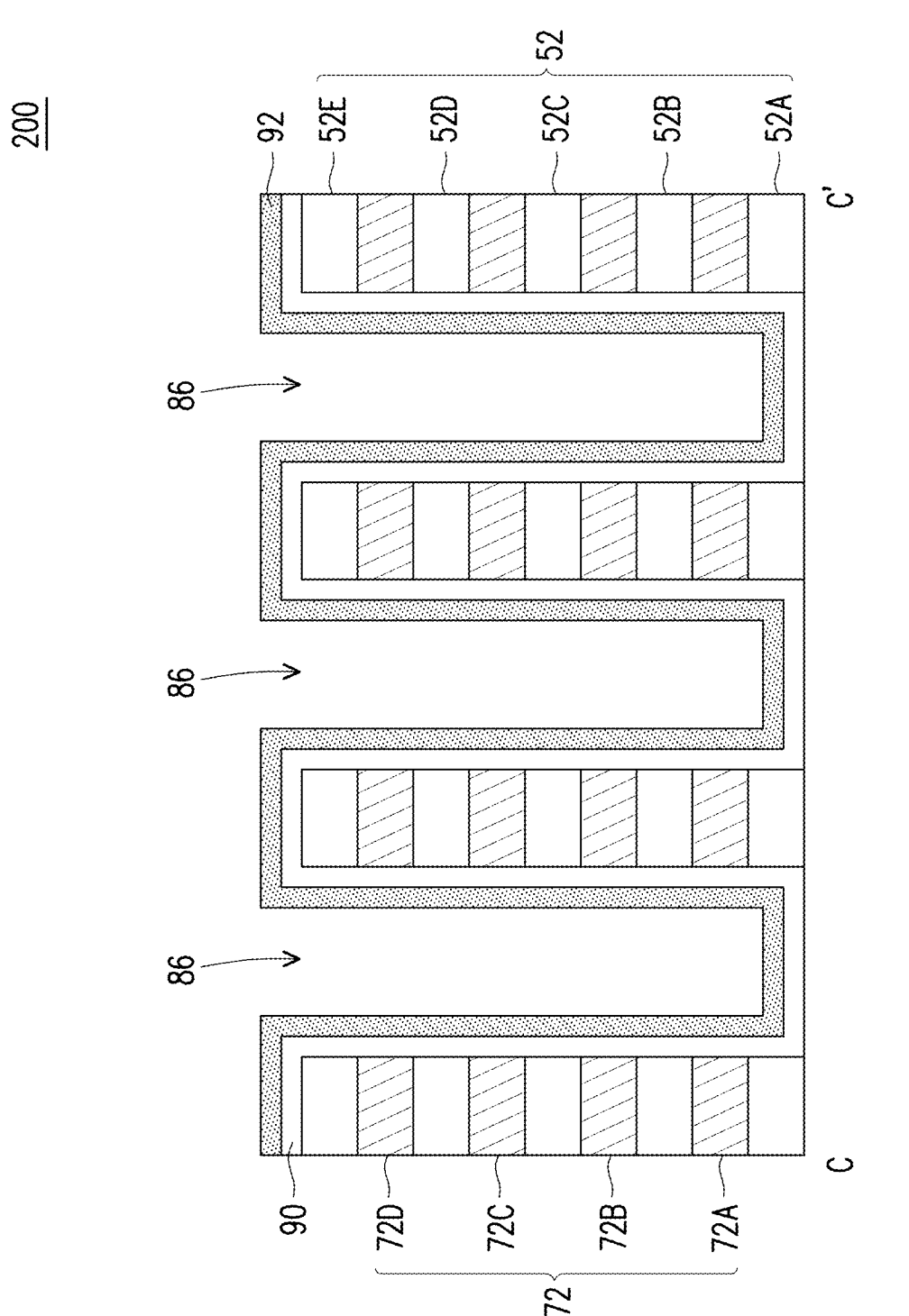

In FIGS. 18A and 18B, a channel layer 92 is conformally deposited in the trenches 86 over the ferroelectric layer 90. The channel layer 92 includes materials suitable for providing channel regions for the memory cells 202 (see FIG. 1A). For example, the channel layer 92 includes oxide semiconductor (OS) such as zinc oxide (ZnO), indium tungsten oxide (InWO), indium gallium zinc oxide (InGaZnO, IGZO), indium zinc oxide (InZnO), indium tin oxide (ITO), combinations thereof, or the like. In some alternative embodiments, channel layer 92 includes polycrystalline silicon (poly-Si), amorphous silicon (a-Si), or the like. The channel layer 92 may be deposited by CVD, PVD, ALD, PECVD, or the like. The channel layer 92 may extend along sidewalls and bottom surfaces of the trenches 86 over the ferroelectric layer 90. In some embodiments, the channel layer 92 may be further deposited on the IMD 70 and along the sidewall of each step of the staircase structure in the staircase region. After the channel layer 92 is deposited, an annealing step (e.g., at a temperature range of about 300° C. to about 450° C.) in oxygen-related ambient may be performed to activate the charge carriers of the channel layer 92.

Figure 19:
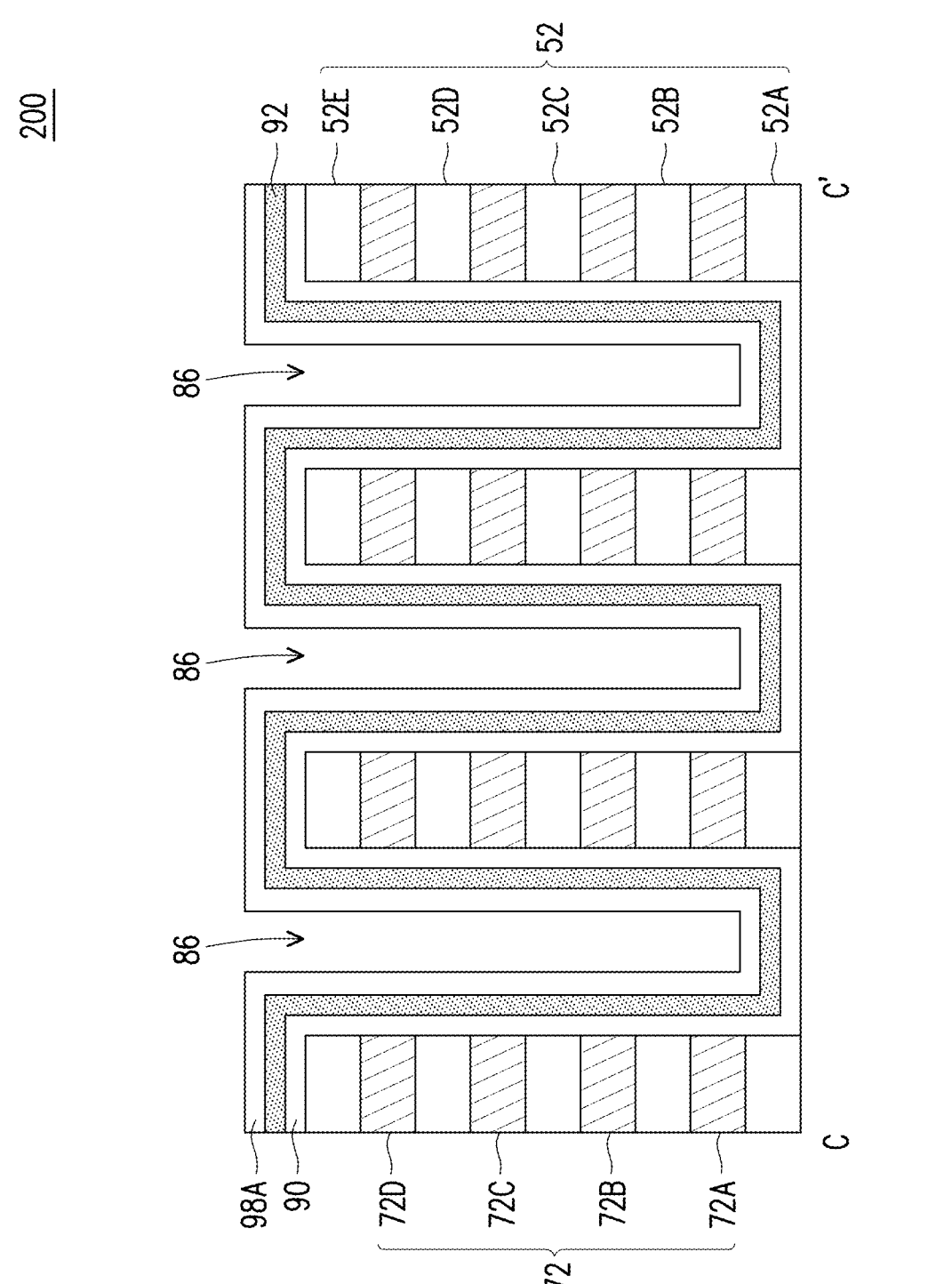

In FIG. 19, a dielectric material 98A is deposited in the trenches 86 over the channel layer 92. In some embodiments, the dielectric material 98A includes silicon oxide, silicon nitride, silicon oxynitride, or the like, which may be deposited by CVD, PVD, ALD, PECVD, or the like. The dielectric material 98A may extend along sidewalls and bottom surfaces of the trenches 86 over the channel layer 92. In some embodiments, the dielectric material 98A is optional and may be omitted as needed.

Figure 20:
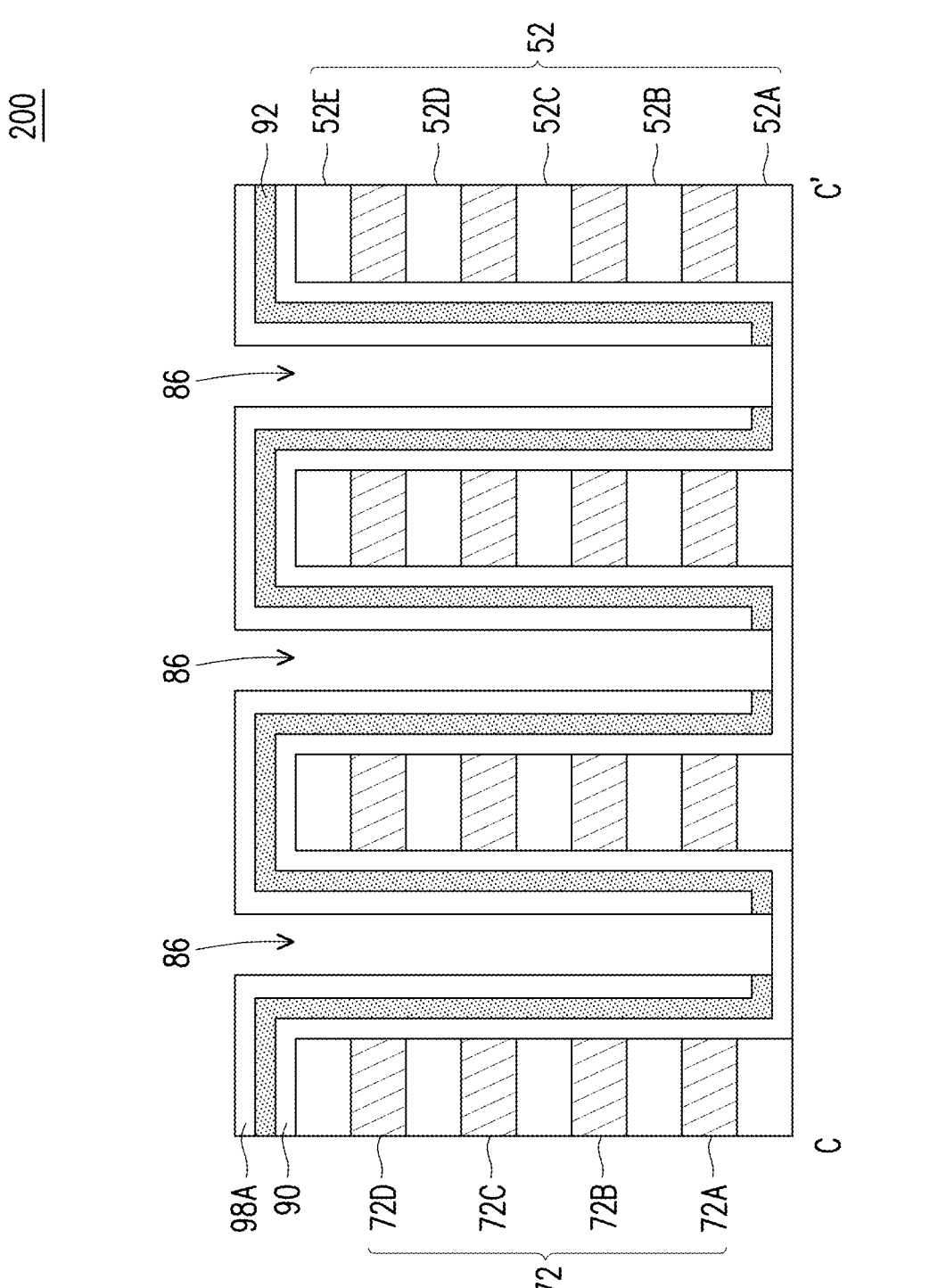

In FIG. 20, bottom portions of the dielectric material 98A and the channel layer 92 are removed in the trenches 86. The removal process includes an acceptable etching process, such as a dry etch (e.g., RIE, NBE, the like), a wet etch, the like, or a combination thereof. The etching may be anisotropic. In some embodiments, the top portions of the dielectric material 98A and the channel layer 92 are removed from the multi-layer stack 58. In some embodiments, removal process includes a combination of photolithography and etching.

Accordingly, the remaining dielectric material 98A and the channel layer 92 may expose portions of the ferroelectric layer 90 on bottom surfaces of the trenches 86. Thus, portions of the channel layer 92 on opposing sidewalls of the trenches 86 may be separated from each other, which improves isolation between the memory cells 202 of the memory device 200 (see FIG. 1A).

Figure 21:
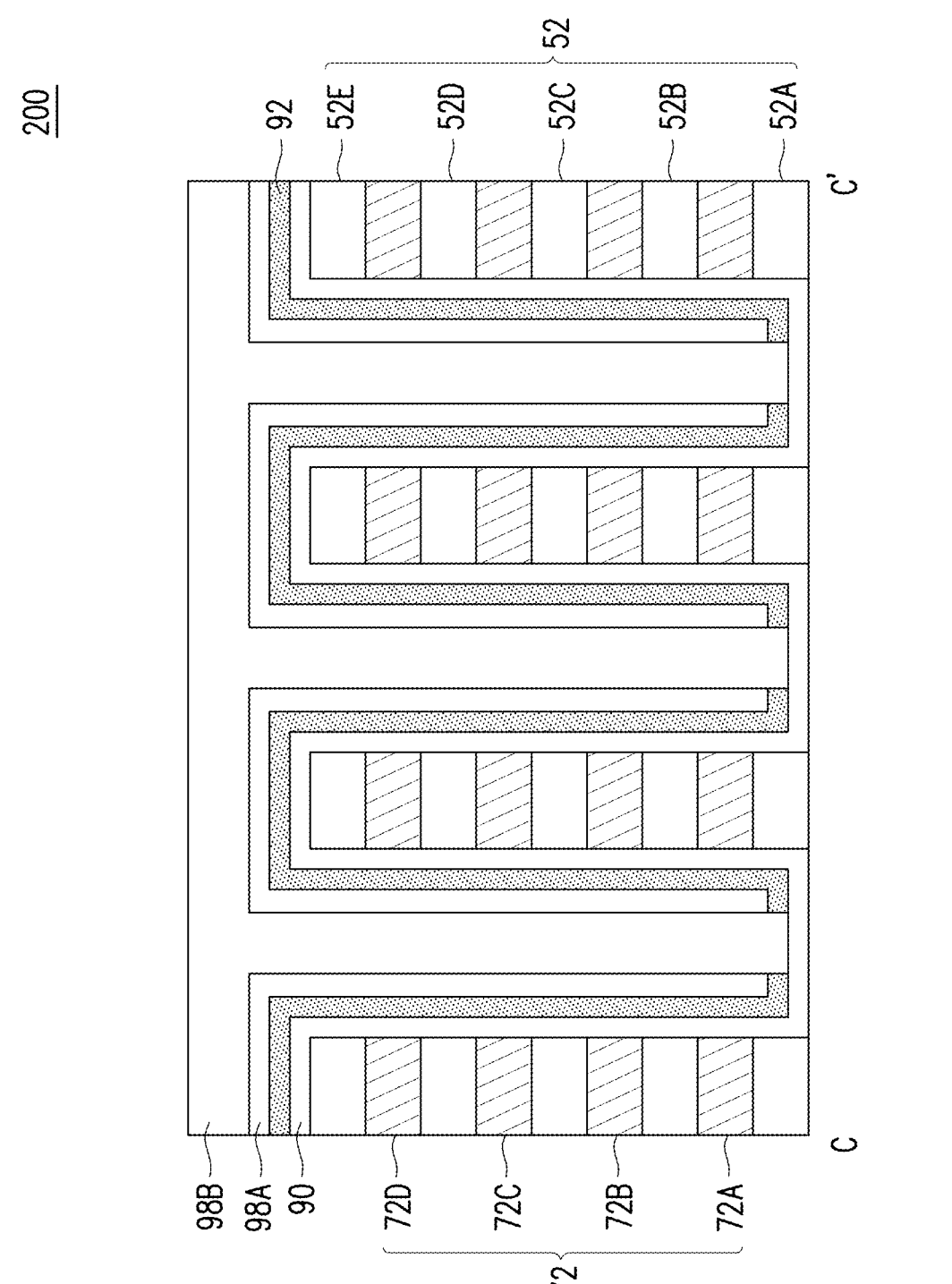

In FIG. 21, a dielectric material 98B is deposited to completely fill the trenches 86. The dielectric material 98B may be formed of one or more materials and by processes the same as or similar to those of the dielectric material 98A. In some embodiments, the dielectric material 98B and the dielectric material 98A include different materials.

Figure 22A:
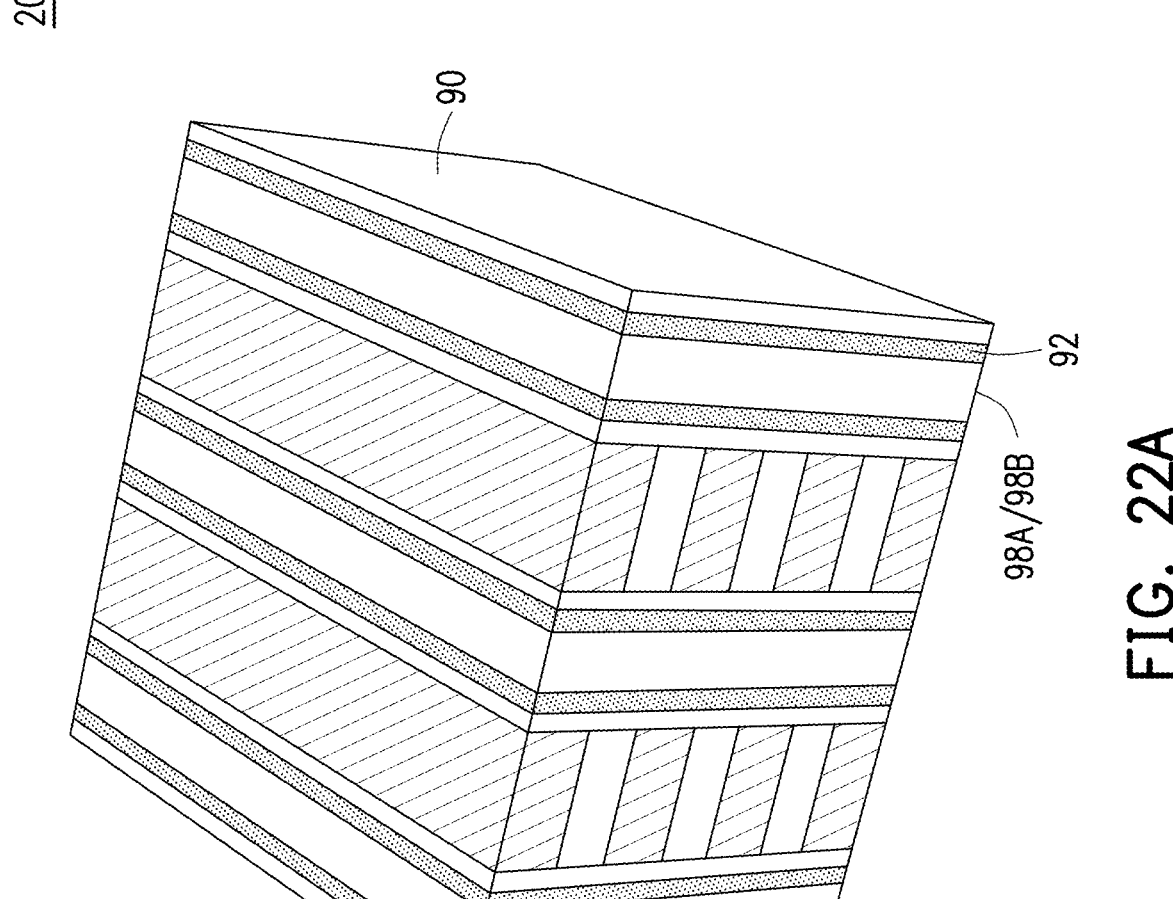
Figure 22B:
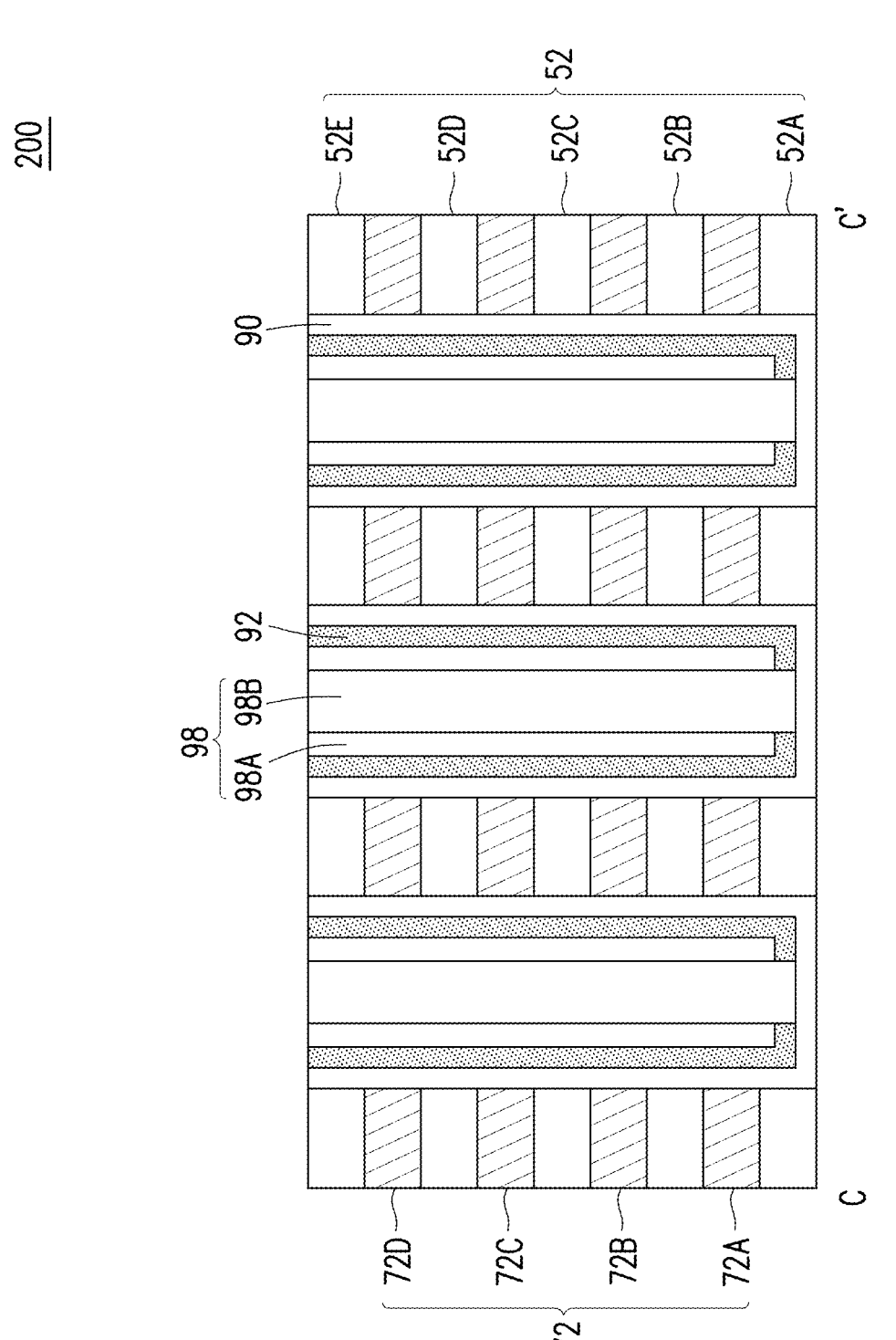

In FIGS. 22A and 22B, a removal process is applied to the dielectric materials 98A/98B, the channel layer 92, and the ferroelectric layer 90 to remove excess materials over the multi-layer stack 58. In some embodiments, a planarization process such as a CMP, an etch-back process, combinations thereof, or the like may be utilized. The planarization process exposes the multi-layer stack 58 such that top surfaces of the multi-layer stack 58 (e.g., the dielectric layer 52E), the ferroelectric layer 90, the channel layer 92, the dielectric materials 98A/98B, and the IMD 70 are level after the planarization process is complete.

Figure 24A:
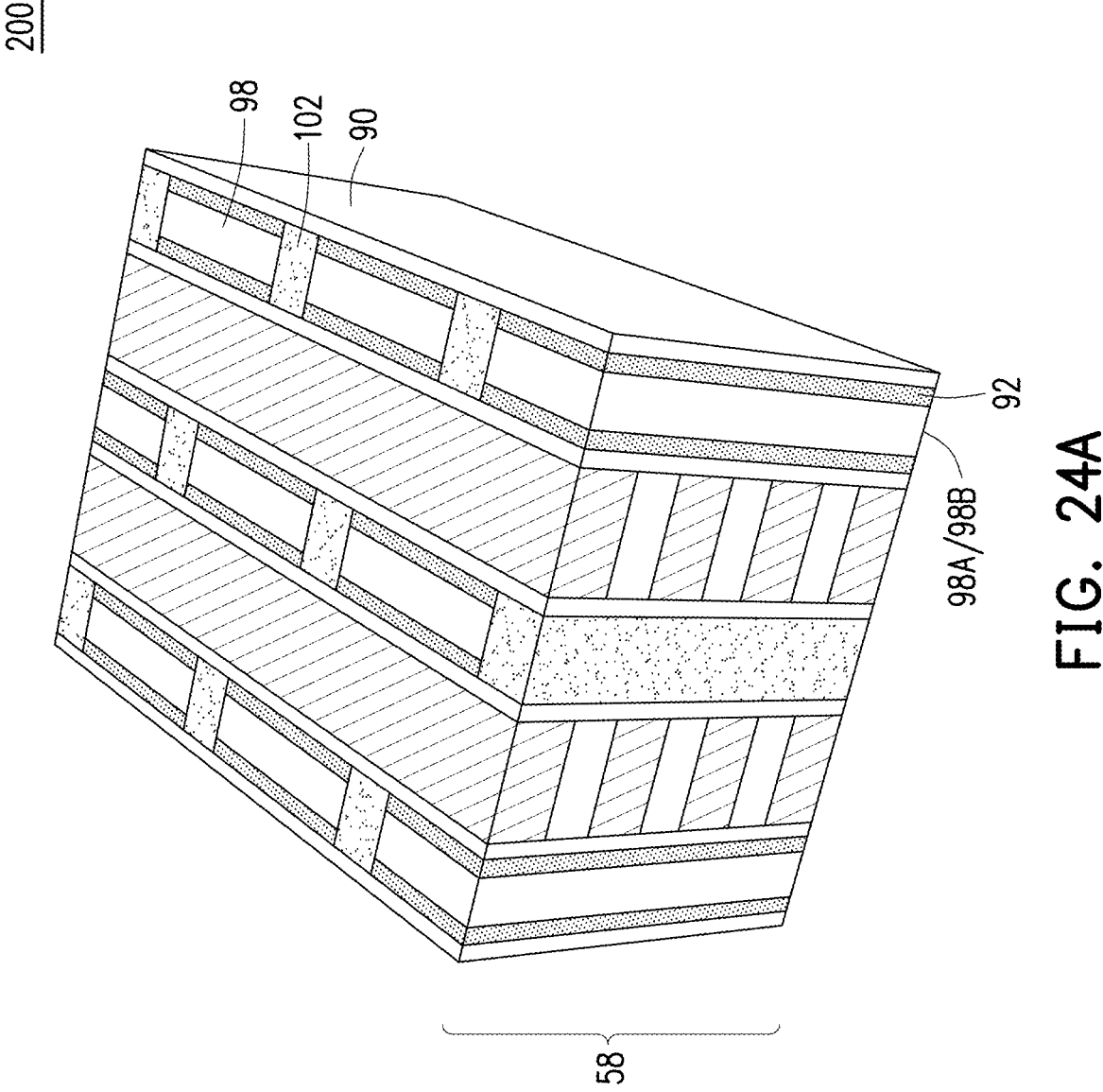
Figure 24B:
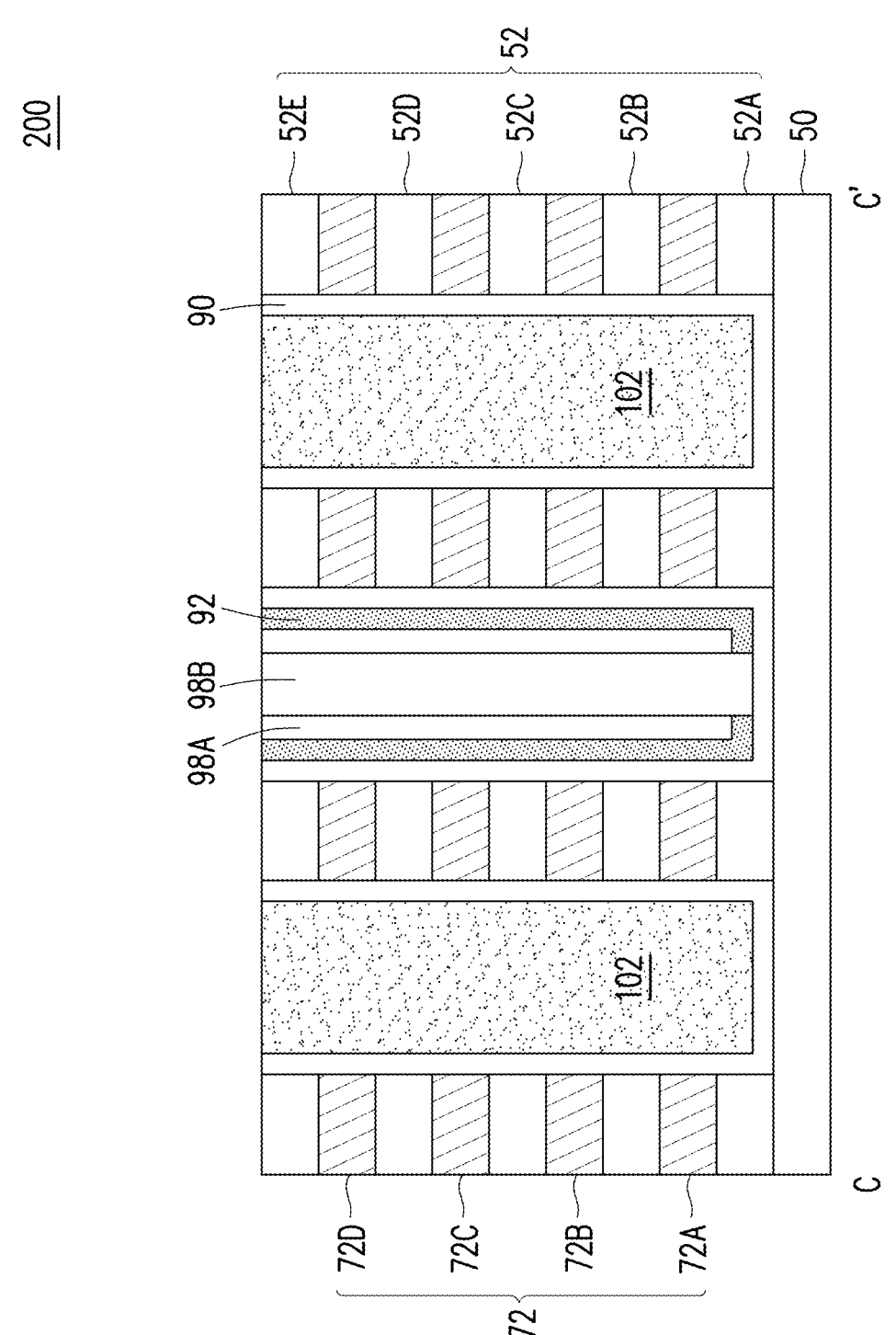
Figure 25A:
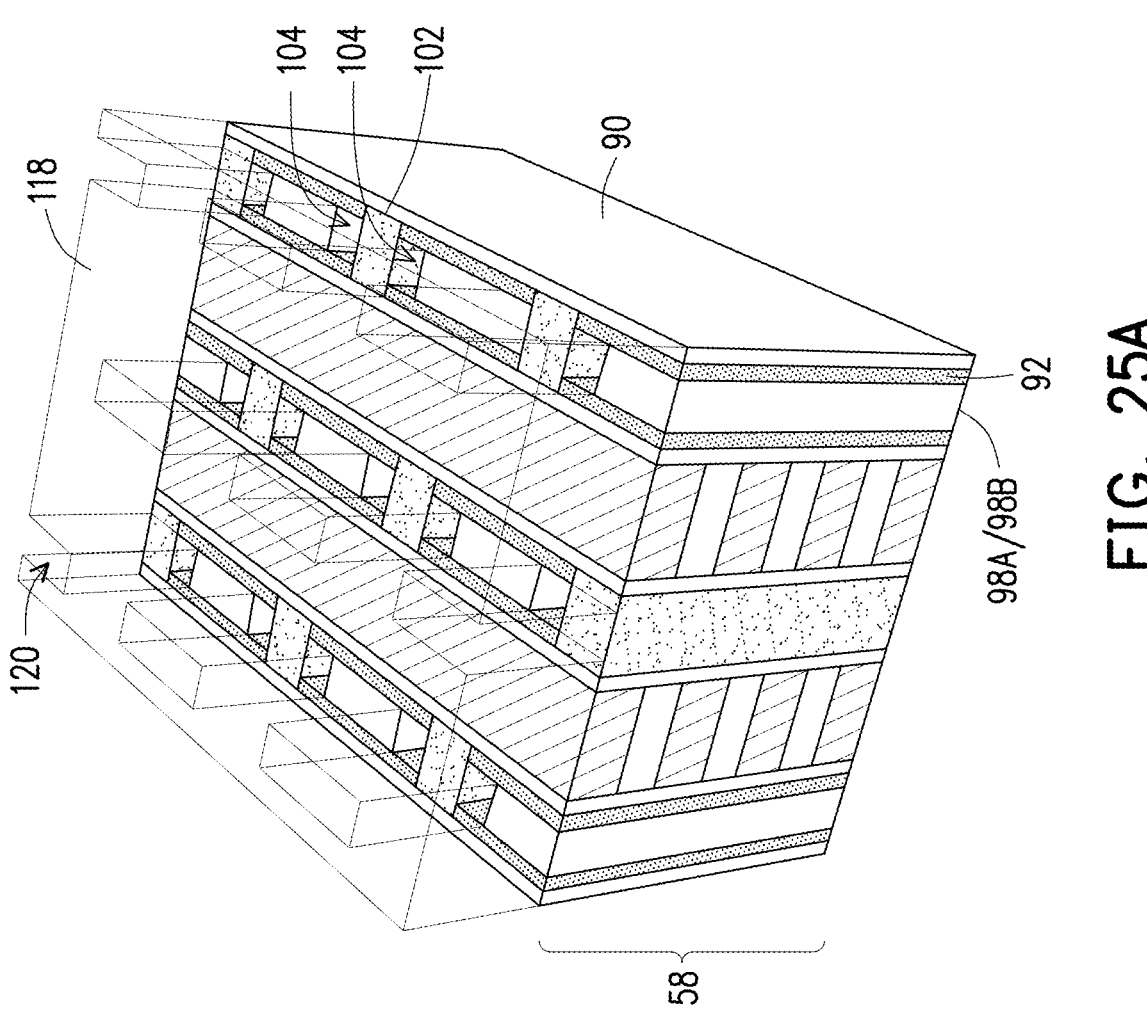
Figure 25B:
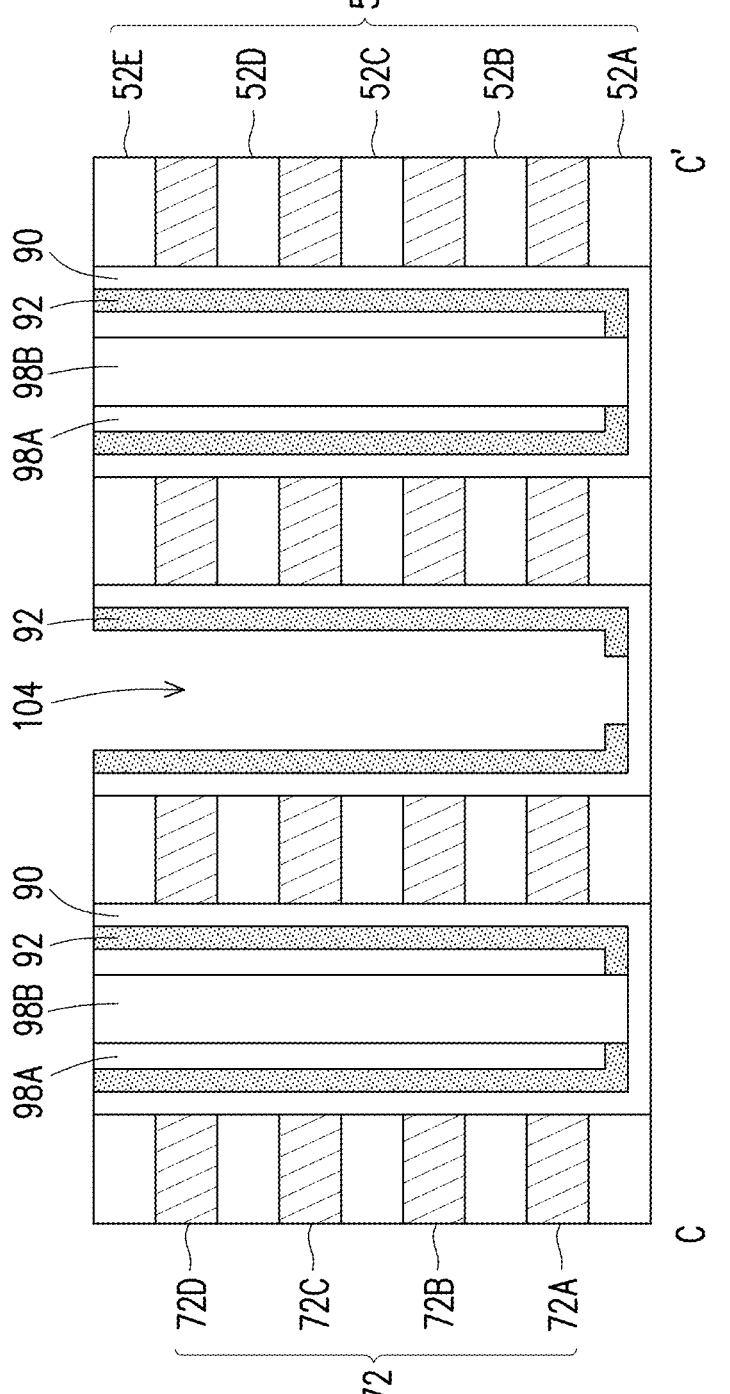
Figure 26A:
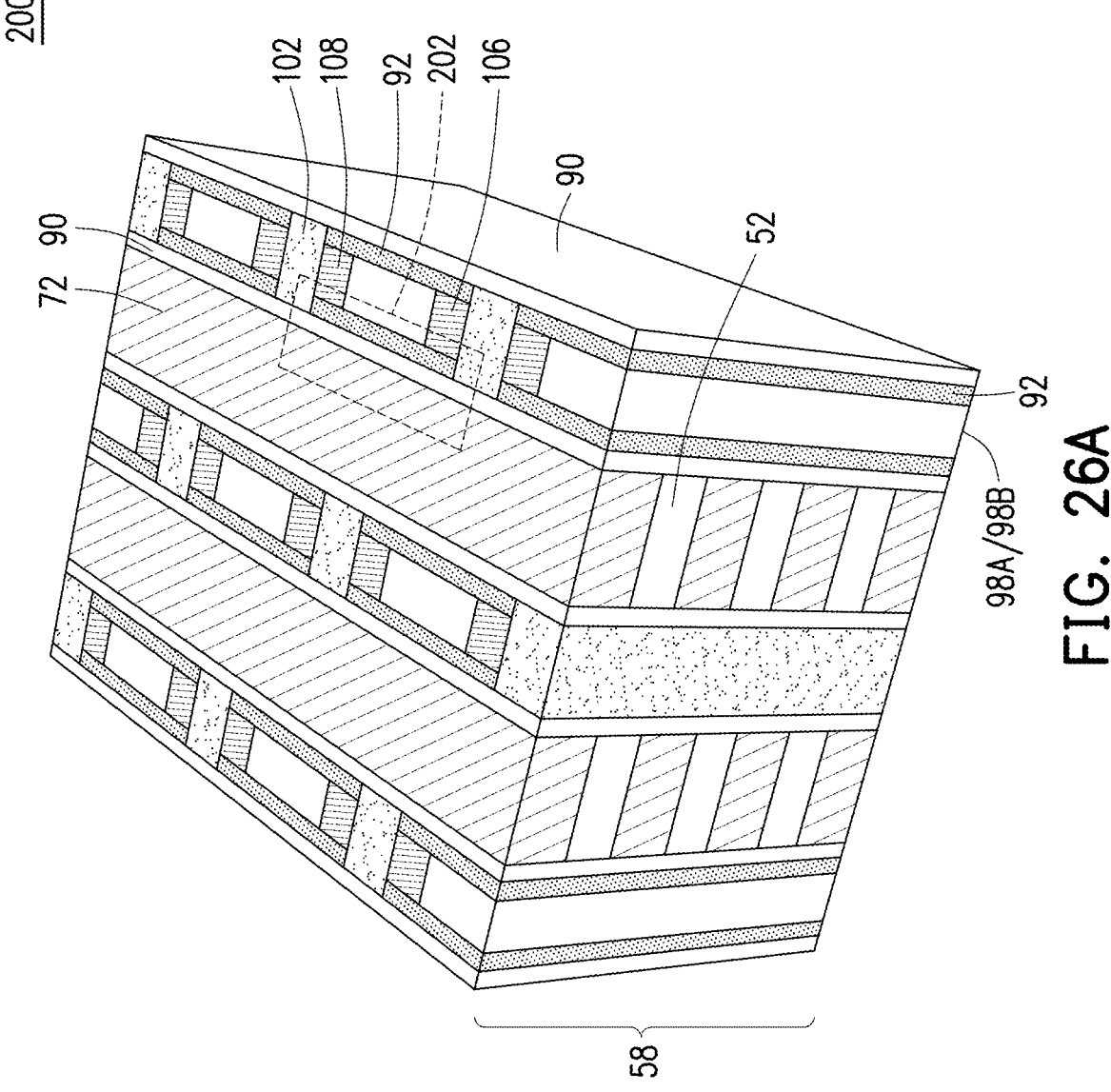

FIGS. 23A through 26B illustrate intermediate steps of manufacturing conductive pillars 106 and 108 (e.g., source/drain pillars) in the memory device 200. The conductive pillars 106 and 108 may extend along a direction perpendicular to the conductive lines 72 such that individual cells of the memory device 200 may be selected for read and write operations. FIGS. 23A, 24A, 25A and 26A are illustrated in a partial three-dimensional view. In FIGS. 23B and 24B, cross-sectional views are provided along line C-C' of FIG. 1A. In FIGS. 25B and 26B, cross-sectional views are provided along line D-D' of FIG. 1A.

Figure 23A:
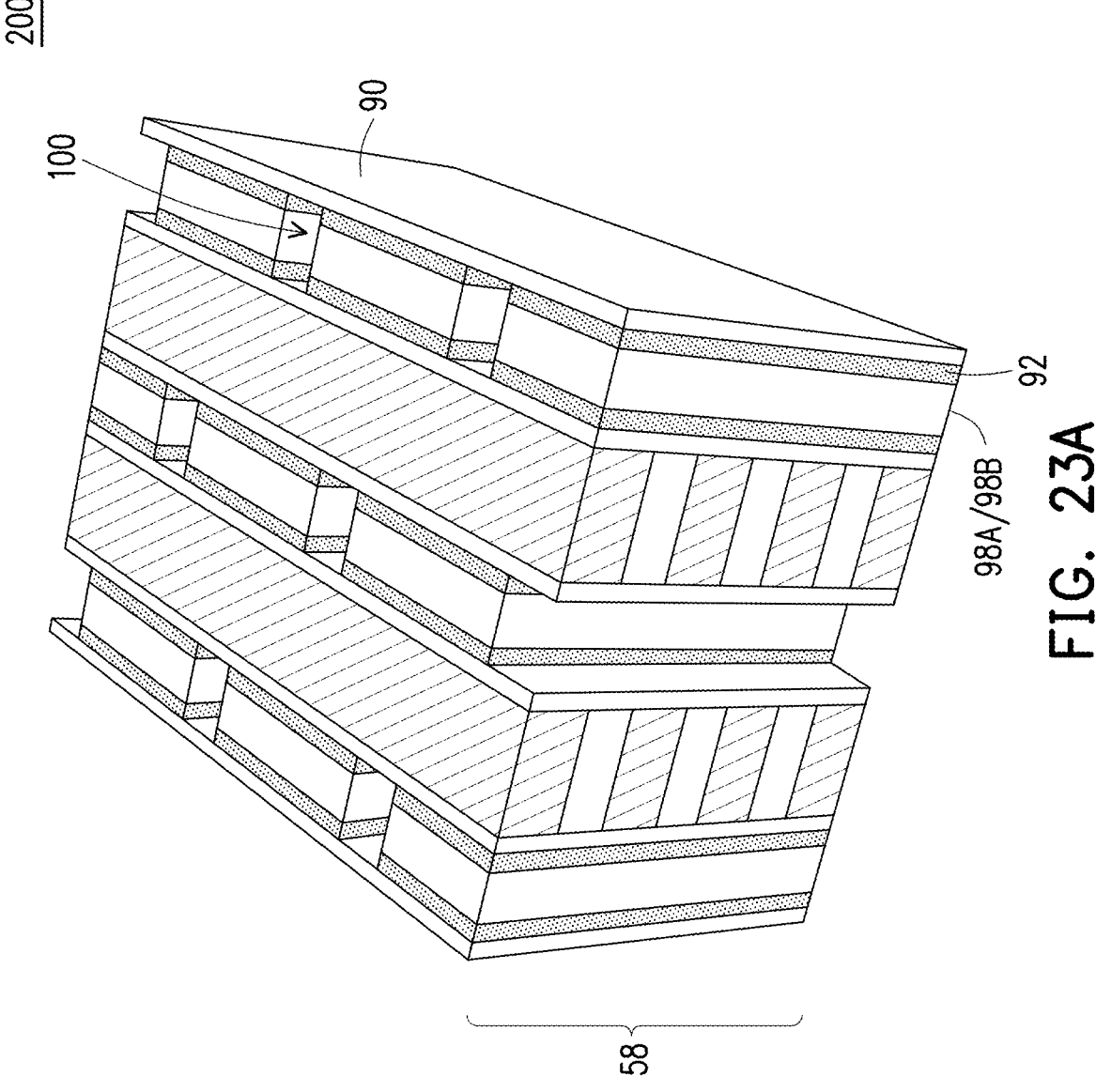
Figure 23B:
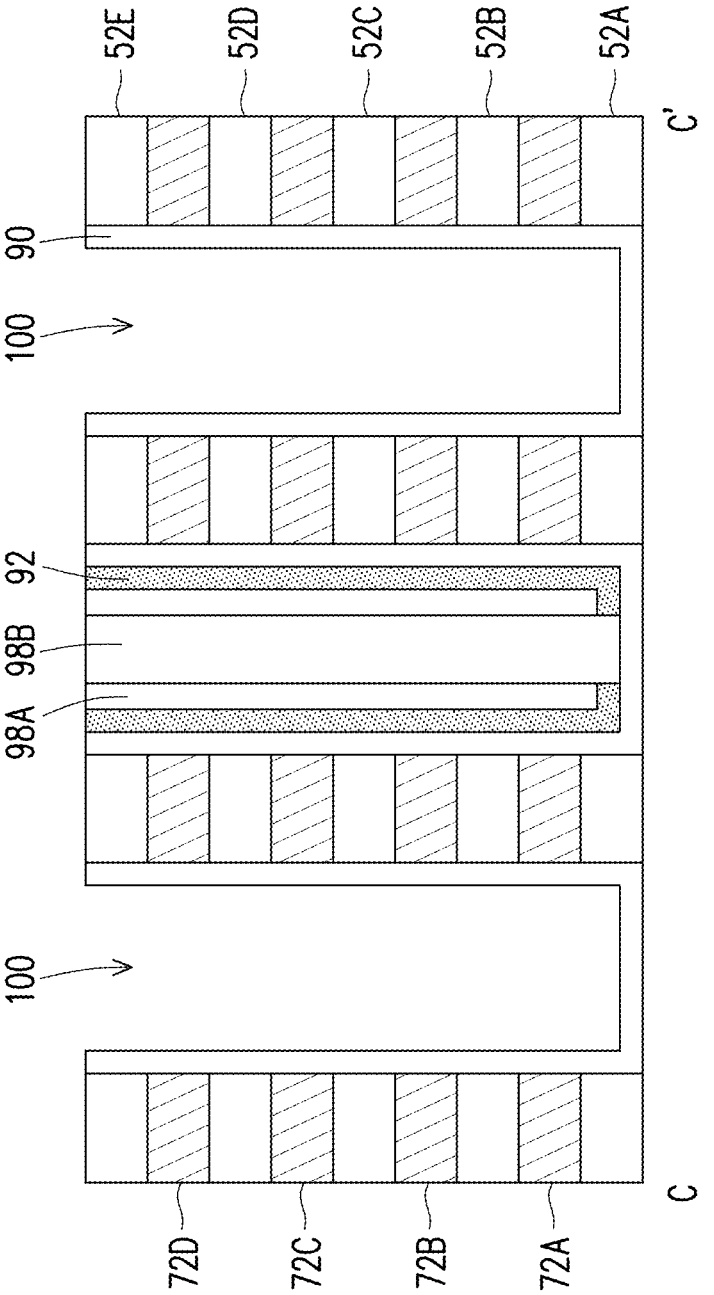

In FIGS. 23A and 23B, trenches 100 are patterned through the channel layer 92 and the dielectric materials 98A/98B. Patterning the trenches 100 may be performed through a combination of photolithography and etching, for example. The trenches 100 may be disposed between opposing sidewalls of the ferroelectric layer 90, and the trenches 100 may physically separate adjacent stacks of memory cells in the memory device 200 (see FIG. 1A).

In FIGS. 24A and 24B, isolation pillars 102 are formed in the trenches 100. In some embodiments, an isolation layer is deposited over the multi-stack 58 filling in the trenches 100. The isolation layer may include, for example, silicon oxide, silicon nitride, silicon oxynitride, or the like, which may be deposited by CVD, PVD, ALD, PECVD, or the like. The isolation layer may extend along sidewalls and bottom surfaces of the trenches 100 over the channel layer 92. After deposition, a planarization process (e.g., a CMP, etch back, or the like) may be performed to remove excess portions of the isolation layer. In the resulting structure, top surfaces of the multi-layer stack 58 (e.g., dielectric layer 52E), the ferroelectric layer 90, the channel layer 92, and the isolation pillars 102 may be substantially level (e.g., within process variations). In some embodiments, materials of the dielectric materials 98A/98B and isolation pillars 102 may be selected so that they may be etched selectively relative each other. For example, in some embodiments, the dielectric materials 98A/98B include oxide and the isolation pillars 102 include nitride. In some embodiments, the dielectric materials 98A/98B include nitride and the isolation pillars 102 include oxide. Other materials are also possible.

In FIGS. 25A and 25B, trenches 104 are defined for the subsequently formed the conductive pillars 106 and 108. The trenches 104 are formed by patterning the dielectric materials 98A/98B with a combination of photolithography and etching, for example. In some embodiments, as shown in FIG. 28A, a photoresist 118 is formed over the multi-layer stack 58, the dielectric materials 98A/98B, the isolation pillars 102, the channel layer 92, and the ferroelectric layer 90. In some embodiments, the photoresist 118 is patterned by an acceptable photolithography technique to define openings 120. Each of the openings 120 may expose the corresponding isolation pillar 102 and two separate regions of the dielectric materials 98A/98B beside the isolation pillar 102. In this way, each of the openings 120 may define a pattern of a conductive pillar 106 and an adjacent conductive pillar 108 that are separated by the isolation pillars 102.

Subsequently, portions of the dielectric materials 98A/98B exposed by the openings 120 may be removed by an acceptable etching process, such as by a dry etch (e.g., RIE, NBE, the like), a wet etch, the like, or a combination thereof. The etching may be anisotropic. The etching process may use an etchant that etches the dielectric materials 98A/98B without significantly etching the isolation pillars 102. As a result, even though the openings 120 expose the isolation pillars 102, the isolation pillars 102 may not be significantly removed. Patterns of the trenches 104 may correspond to the conductive pillars 106 and 108 (see FIGS. 26A and 26B). After the trenches 104 are patterned, the photoresist 118 may be removed by ashing, for example.

In FIGS. 26A and 26B, the trenches 104 are filled with a conductive material to form the conductive pillars 106 and

108. The conductive material may include copper, titanium, titanium nitride, tantalum, tantalum nitride, tungsten, ruthenium, aluminum, combinations thereof, or the like, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillars 106 and 108. In the resulting structure, top surfaces of the multi-layer stack 58 (e.g., the dielectric layer 52E), the ferroelectric layer 90, the channel layer 92, the conductive pillars 106, and the conductive pillars 108 may be substantially level (e.g., within process variations). In some embodiments, the conductive pillars 106 correspond to and are electrically connected to the bit lines in the memory array, and the conductive pillars 108 correspond to correspond to and are electrically connected to the source lines in the memory device 200.

Thus, stacked memory cells 202 may be formed in the memory device 200, as shown in FIG. 26A. Each memory cell 202 includes a gate electrode (e.g., a portion of a corresponding conductive line 72), a gate dielectric (e.g., a portion of a corresponding ferroelectric layer 90), a channel region (e.g., a portion of a corresponding channel layer 92), and source/drain pillars (e.g., portions of corresponding conductive pillars 106 and 108). The isolation pillars 102 isolates adjacent memory cells 202 in a same column and at a same vertical level. The memory cells 202 may be disposed in an array of vertically stacked rows and columns.

Figure 27A:
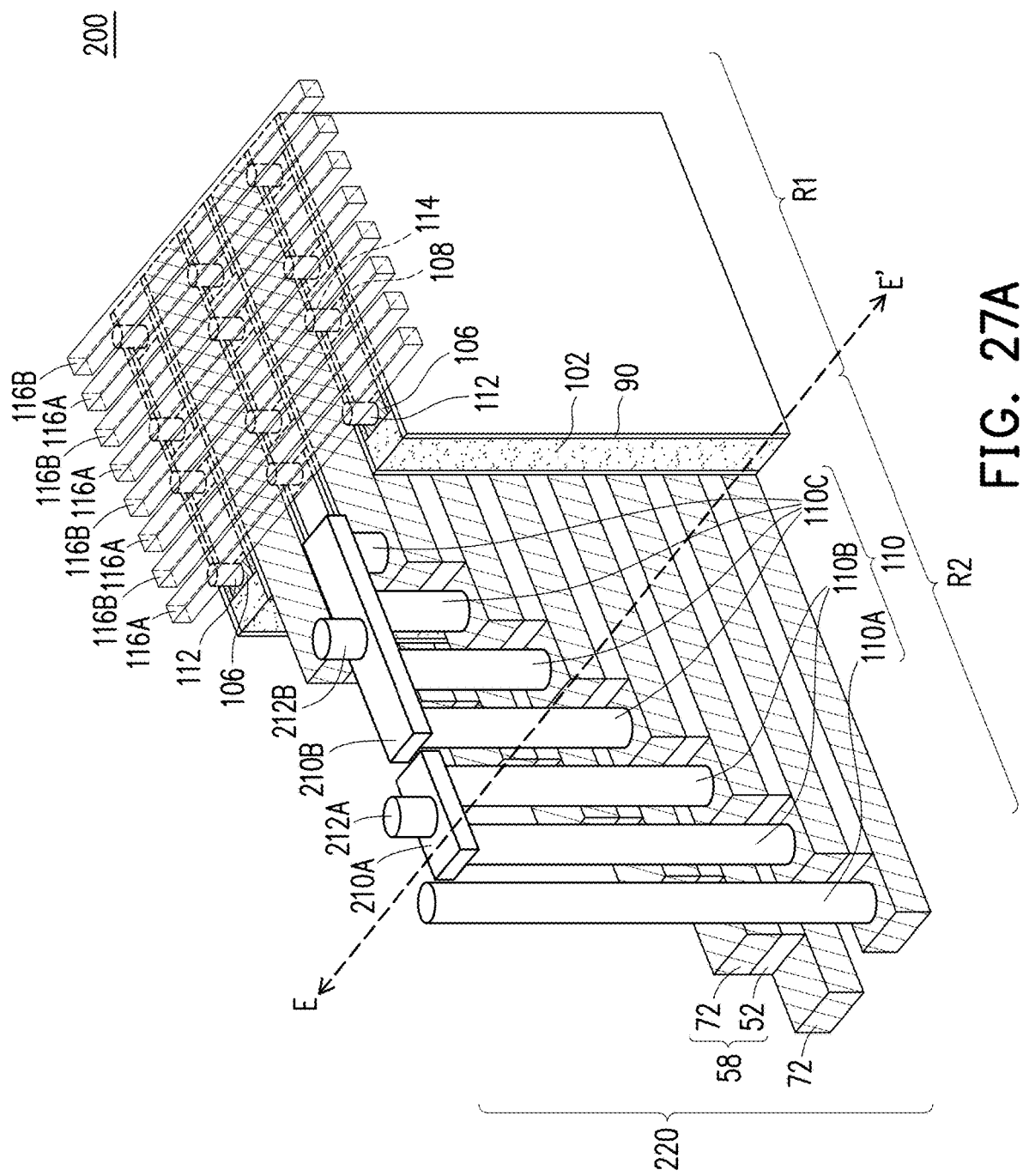
Figure 27B:
Figure 27C:
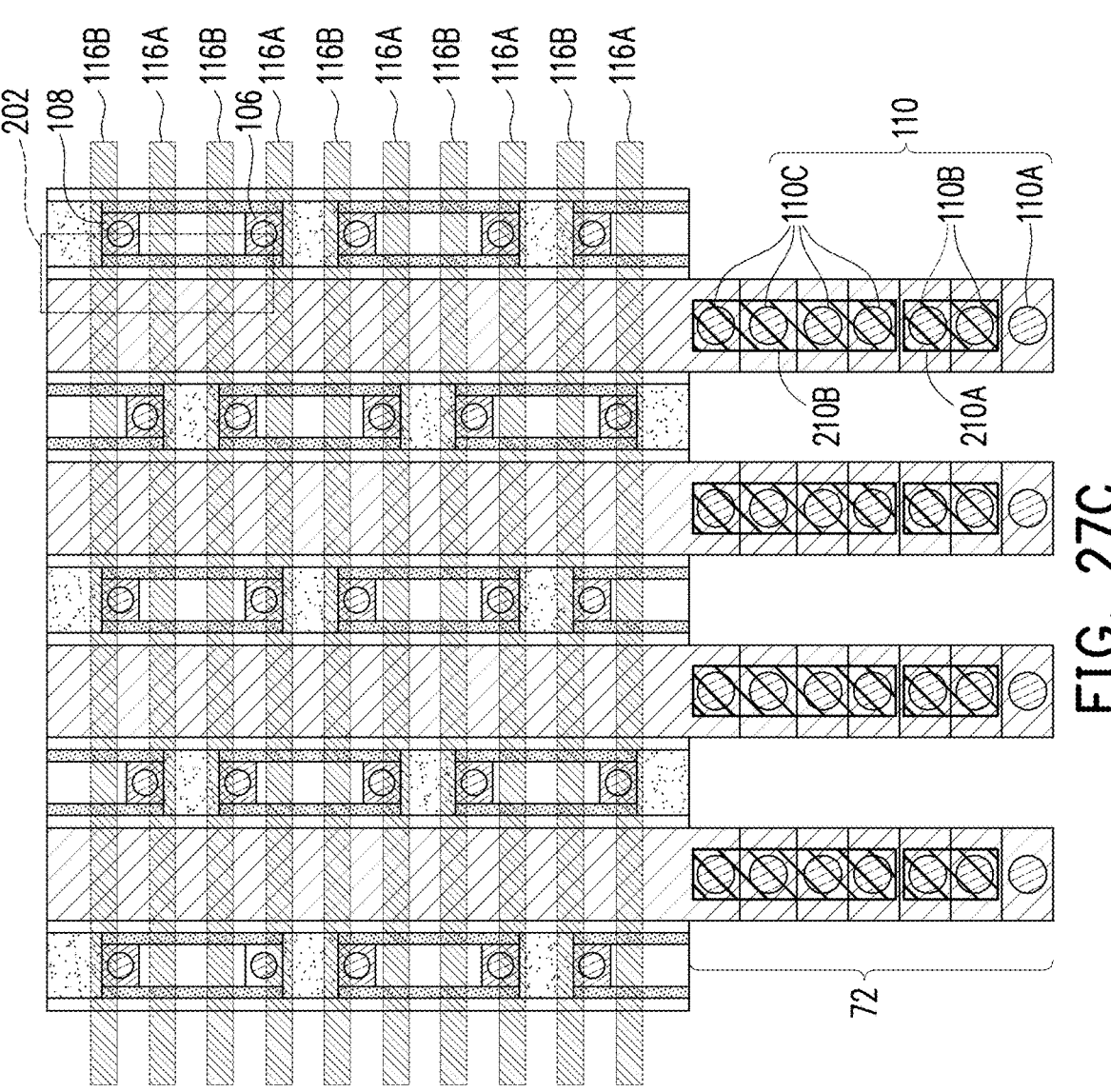
Figure 27D:
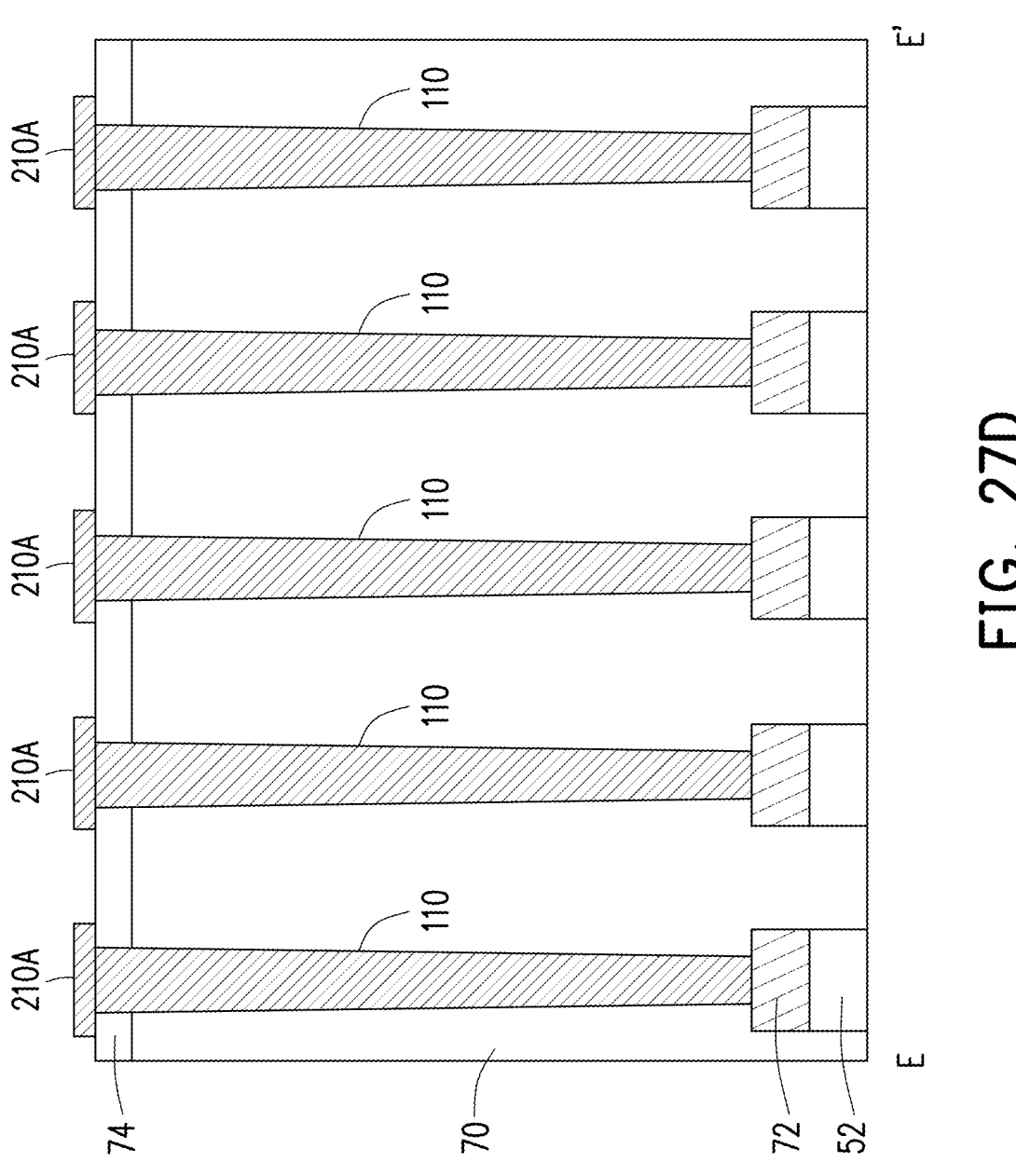
Figure 27E:
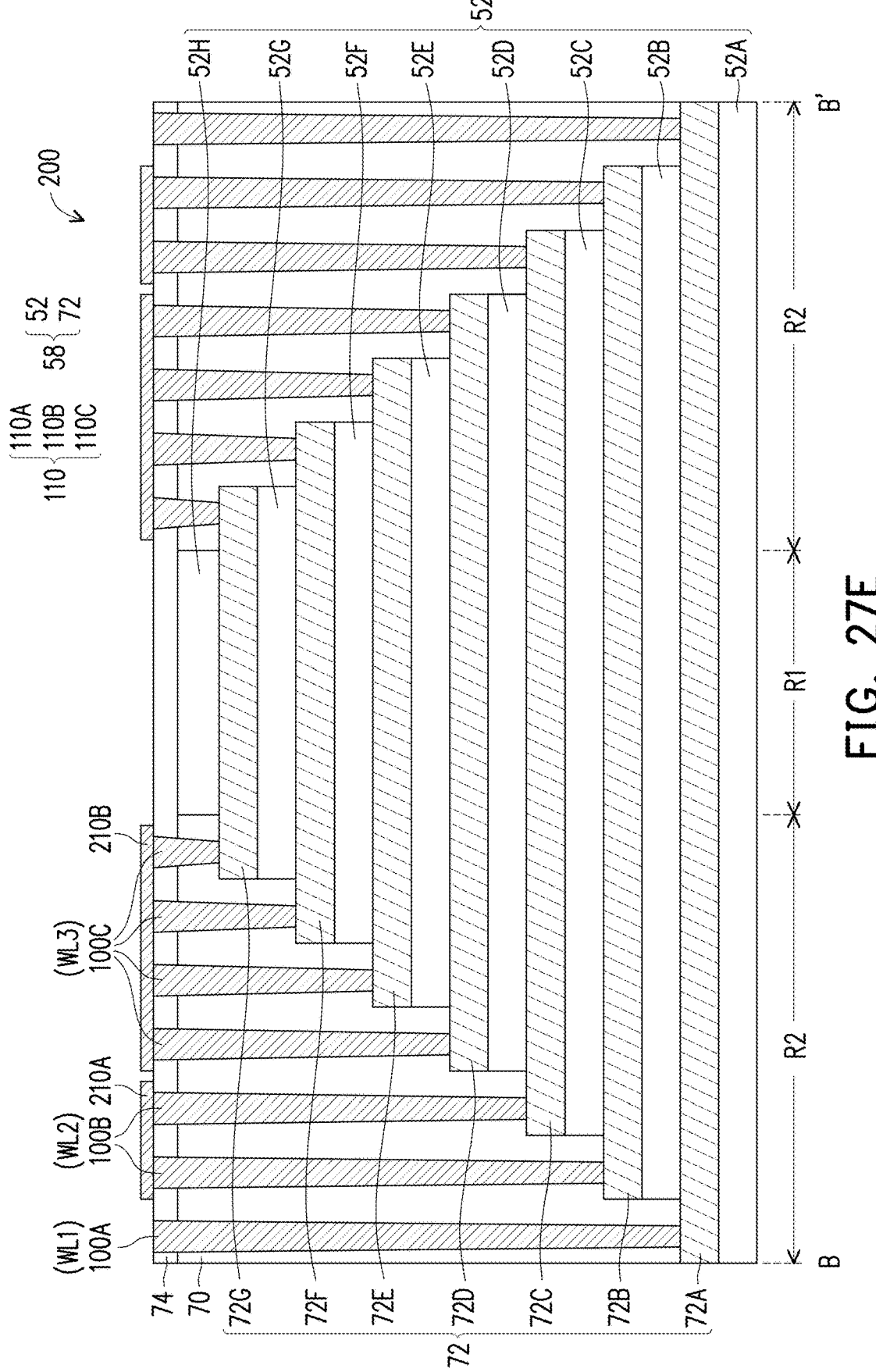

In FIGS. 27A, 27B, 27C, 27D and 27E, an IMD layer 74 is formed on top surfaces of the multi-layer stack 58 (e.g., the dielectric layer 52E), the ferroelectric layer 90, the channel layer 92, the conductive pillars 106, and the conductive pillars 108 and the IMD 70. Conductive contacts 110, 112, and 114 are made on the conductive lines 72, the conductive pillars 106, and the conductive pillars 108, respectively. FIG. 27A illustrates a perspective view of the memory device 200; FIG. 27B illustrates a cross-sectional view of the device along line D-D' of FIG. 1A; FIG. 27C illustrates a top-down view of the memory device 200; and FIG. 27D illustrates a cross-sectional view along the line E-E' of FIG. 27A; and FIG. 27E illustrates a cross-sectional view of the device along line B-B' of FIG. 1A.

The IMD 74 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the IMD 74 may include an oxide (e.g., silicon oxide or the like), a nitride (e.g., silicon nitride or the like), a combination thereof or the like. Other dielectric materials formed by any acceptable process may be used. Thereafter, a removal process is applied to the IMD 74 to remove excess dielectric material over the multi-layer stack 58. In some embodiments, the removal process may be a planarization process, such as a chemical mechanical polish (CMP), an etch-back process, combinations thereof, or the like.

After forming the IMD 74, a plurality of conductive contacts 110 are respectively formed on the staircase structure 220. In detail, as shown in FIG. 27A and FIG. 27E, the conductive contacts 110 at least includes a first group including a first word line via 110A, a second group including two second word line vias 110B, and a third group including four third word line vias 110C. In some embodiments, the two second word line vias 110B are electrically connected to each other; and the four third word line vias 110C are electrically connected to each other; and the first group, the second group, and the third group are electrically isolated from each other. In some embodiments, forming the conductive contacts 110 may include patterning openings in the IMD 74 and IMD 70 to expose portions of the conductive lines 72 using a combination of photolithography and etching, for example. A liner (not shown), such as a diffusion barrier layer, an adhesion layer, or the like, and a conductive material are formed in the openings. The liner may include titanium, titanium nitride, tantalum, tantalum nitride, or the like. The conductive material may include copper, a copper alloy, silver, gold, tungsten, cobalt, aluminum, nickel, or the like. A planarization process, such as a CMP, may be performed to remove excess material from the surface of the IMD 74. The remaining liner and conductive material form the contacts 110 in the openings.

As also illustrated by the perspective view of FIG. 27A, conductive contacts 112 and 114 may also be made on the conductive pillars 106 and the conductive pillars 108, respectively. In some embodiments, the conductive contacts 110, 112, and 114 may be formed in the same process or the same order. In some alternative embodiments, the conductive contacts 110, 112, and 114 may be formed in different processes or in different orders.

After forming the conductive contacts 110, 112, and 114, a plurality of conductive lines 210A, 210B, 116A, and 116B may be formed on the conductive contacts 110, 112, and 114, respectively. In some embodiments, the conductive lines 210A, 210B, 116A, and 116B may be formed in the same process or the same order. In some alternative embodiments, the conductive lines 210A, 210B, 116A, and 116B may be formed in different processes or in different orders. The conductive contacts 110, 112, and 114 may be electrically connected to conductive lines 210A, 210B, 116A, and 116B, respectively, which connect the memory array to an underlying/overlying circuitry (e.g., control circuitry) and/or signal, power, and ground lines in the semiconductor die. For example, as shown in FIG. 27D, the conductive contacts 110 may extend through the IMD 74 and IMD 70 to electrically connect the conductive lines 210A and 210B to the conductive lines 72 and the underlying active devices one the substrate. Other conductive contacts or vias may be formed through the IMD 74 to electrically connect the conductive lines 116A and 116B to the underlying active devices one the substrate. In alternate embodiments, routing and/or power lines to and from the memory array may be provided by an interconnect structure formed over the memory device 200 in addition to or in lieu of the interconnect structure 320. Accordingly, the memory device 200 may be completed.

As shown in FIG. 27A and FIG. 27D, the conductive line 210A may be referred to as the first bridge layer 210A disposed on the two second word line vias 110B to electrically connect the two second word line vias 110B. The conductive line 210B may be referred to as the second bridge layer 210B disposed on the four third word line vias 110C to electrically connect the four third word line vias 110C. In such embodiment, the two conductive lines 72B and 72C may electrically connected to each other through the two second word line vias 110B and the first bridge layer 210A, so that corresponding two memory cells 202 share the same word line (e.g., WL2). Similarly, the four conductive lines 72D, 72E, 72F, and 72G may electrically connected to each other through the four third word line vias 110C and the second bridge layer 210B, so that corresponding four memory cells 202 share the same word line (e.g., WL3). In this case, the unit cell including the two memory cells 202 may have different on-current ($I_{ON}$) from that of other unit cell including single one memory cell 202 or more than two memory cells. Therefore, those unit cells with different on-current ($I_{ON}$) can be identified as different unit cells to store more than two logic states, thereby realizing the multi-level programming in the memory device. In this case, the memory device is applicable in the AI applications, such as Deep Neural Networks (DNN) computation, Convolutional Neural Networks (CNN) computation, in-memory computing, or the like.

Further, as shown in FIG. 27A, additional conductive vias 212A and 212B may be formed on the first bridge layers 210A and 210B, respectively.

Although the embodiments of FIGS. 1A through 26B illustrate a particular pattern for the conductive pillars 106 and 108, other configurations are also possible. For example, in these embodiments, the conductive pillars 106 and 108 have a staggered pattern. That is, the memory cells 202 on different sides of the strip-shaped staircase structure 220 are arranged in a staggered configuration. However, in other embodiments, the conductive pillars 106 and 108 in a same row of the array are all aligned with each other, as shown in the memory device 200A of FIG. 29. That is, the memory cells 202 on different sides of the strip-shaped staircase structure 220 may be arranged aligned with each other.

In some embodiments, the memory device 200A may include a substrate (not shown) having an array region R1 and a staircase region R2. In addition, the memory device 200A includes the multi-layer stack 58 is disposed on the substrate in the array region R1. The multi-layer stack 58 has an end portion extending on the staircase region R2 to be shaped into a staircase structure 220. The memory device 200A further includes the memory cells 202 respectively disposed on sidewalls of the multi-layer stack 58 in the array region R1, and arranged at least along a stacking direction D1 of the multi-layer stack 58. The memory device 200A further includes the conductive contacts 110 respectively on the staircase structure 220. It should be note that, in the present embodiment, at least two conductive contacts 110 (e.g., two second word line vias 110B) are electrically connected to each other through the first bridge layer 210A. In such embodiment, the unit cell including the two memory cells 202 may have different on-current ($I_{ON}$) from that of other unit cell including single one memory cell 202 or more than two memory cells 202. Therefore, those unit cells with different on-current ($I_{ON}$) can be identified as different unit cells to store more than two logic states, thereby realizing the multi-level programming in the memory device 200A.

FIG. 28 illustrates a method of forming a memory device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 400, a multi-layer stack is formed on a substrate having an array region and a staircase region. The multi-layer stack includes a plurality of dielectric layers and a plurality of conductive layers stacked alternately and has a trench penetrating therethrough. The multi-layer stack further has an end portion extending on the staircase region to be formed as a staircase structure. FIG. 13 to FIG. 16B illustrate varying views corresponding to some embodiments of act 400.

At act 402, a plurality of memory cells are formed in the trench. In some embodiments, the plurality of memory cells are arranged along a stacking direction of the multi-layer stack. FIG. 17A to FIG. 26B illustrate varying views corresponding to some embodiments of act 402.

At act 404, a plurality of conductive contacts are formed on the staircase structure. In some embodiments, at least two conductive layers are electrically connected to each other through at least one conductive contact. FIG. 27A to FIG. 27E illustrate varying views corresponding to some embodiments of act 404.

Figure 29:
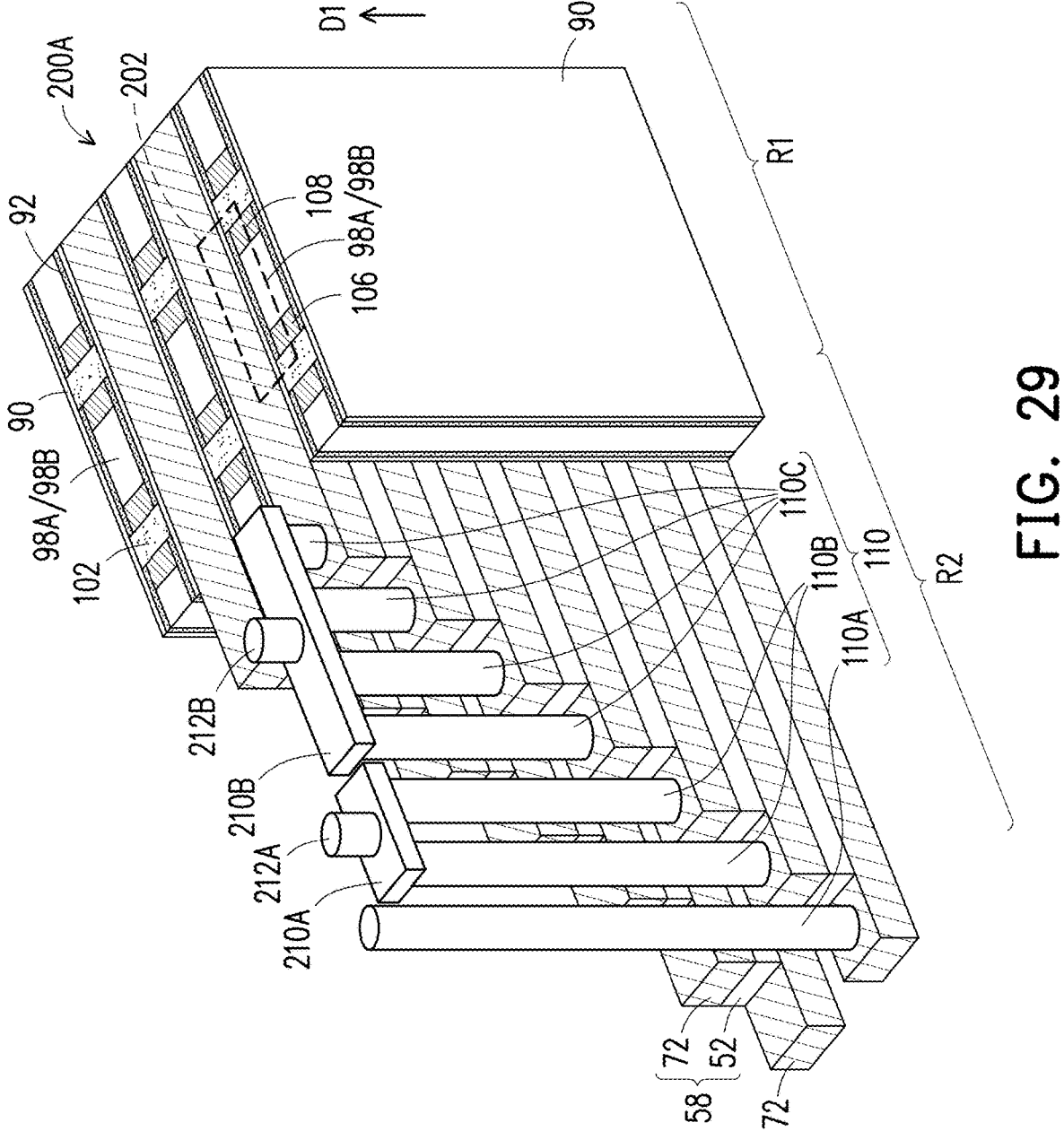
FIG. 29 illustrates a simplified perspective view of a memory device in accordance with some alternative embodiments.

In some embodiments, the isolation structures (e.g., dielectric materials 98A/98B) are in a staggered arrangement. Specifically, the isolation structures of adjacent columns are arranged in a staggered manner, as shown in FIG. 23A. However, the disclosure is not limited thereto. In some embodiments, the isolation structures (e.g., dielectric materials 98A/98B) of adjacent columns are arranged in a regular array and aligned to each other, as shown in FIG. 29. Each of the isolation structures (e.g., dielectric materials 98A/98B) is disposed between two memory devices.

In the above embodiments, the memory device is formed by a "staircase first process" in which the staircase structure is formed before the memory cells are formed. However, the disclosure is not limited thereto. In other embodiments, the memory device may be formed by a "staircase last process" in which the staircase structure is formed after the memory cells are formed.

In the above embodiments, the gate electrodes (e.g., word lines) are formed by depositing sacrificial dielectric layers followed by replacing sacrificial dielectric layers with conductive layers. However, the disclosure is not limited thereto. In other embodiments, the gate electrodes (e.g., word lines) may be formed in the first stage without the replacement step as needed.

Figure 30:
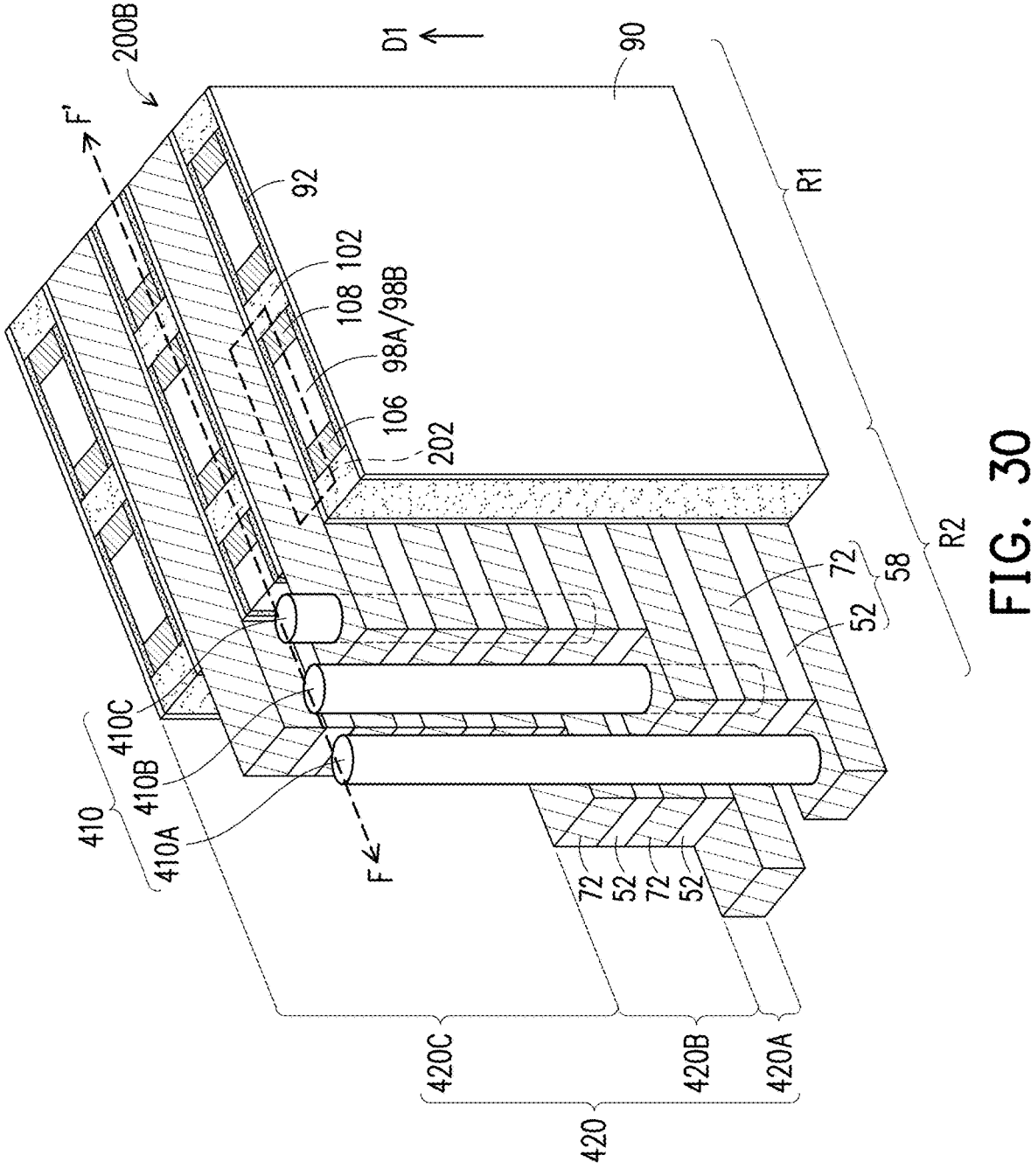
FIG. 30 illustrates a simplified perspective view of a memory device in accordance with a second embodiment.

FIG. 30 illustrates a simplified perspective view of a memory device 200B in accordance with a second embodiment.

Referring to FIG. 30, the memory device 200B may include a substrate (not shown) having an array region R1 and a staircase region R2. In addition, the memory device 200B at least includes a multi-layer stack 58 and a plurality of memory cells 202. The multi-layer stack 58 is disposed on the substrate in the array region R1. In some embodiments, the multi-layer stack 58 includes a plurality of dielectric layers 52 and a plurality of conductive layers 72 stacked alternatively. The multi-layer stack 58 may have an end portion extending on the staircase region R2 to form as a staircase structure 420. The memory cells 202 are respectively disposed on sidewalls of the multi-layer stack 58 in the array region R1, and arranged at least along a stacking direction D1 of the multi-layer stack 58. The memory device 200B further includes a plurality of conductive contacts 410 respectively standing on a plurality of steps of the staircase structure 420. At least one conductive contact 410B or 410C extends downwardly into a corresponding step 420B or 420C of the staircase structure 420, so that the at least two conductive layers 72 are electrically connected to each other through the at least one conductive contact 410B or 410C.

Specifically, the conductive contacts 410 at least includes a first word line via 410A, a second word line via 410B, and a third word line via 410C. The steps of the staircase structure 420 at least includes a first step 420A having at least one conductive layer 72; a second step 420B having at least two conductive layers 72 and at least two dielectric layers 52; and a third step 420C having at least four conductive layers 72 and at least four dielectric layers 52. However, the disclosure is not limited thereto. In other embodiments, the number of the dielectric layers 52 and the conductive layers 72 in each step may be adjusted according to the needs. The first step 420A may be longer than the second step 420B, the second step 420B may be longer than the third step 420C, and the second step 420B is located between the first and third steps 420A and 420C. As shown in FIG. 30, the first word line via 410A may stand on the first step 420A. The second word line via 420B may stand on the second step 410B and extend downwardly to contact the at least two conductive layers 72, so that the at least two conductive layers 72 are electrically connected to each other through the second word line via 410B. The third word line via 410C may stand on the third step 420C and extending downwardly to contact the at least four conductive layers 72, so that the at least four conductive layers 72 are electrically connected to each other through the third word line via 410C.

It should be note that, in the present embodiment, the two conductive layers 72 are electrically connected to each other through the second word line via 410B. In such embodiment, the unit cell including the two memory cells 202 may have different on-current ($I_{ON}$) from that of other unit cell including single one memory cell 202 or more than two memory cells 202. Therefore, those unit cells with different on-current ($I_{ON}$) can be identified as different unit cells to store more than two logic states, thereby realizing the multi-level programming in the memory device 200B. Similarly, the four conductive layers 72 are electrically connected to each other through the third word line via 410C, so that the unit cell including the four memory cells 202 may have different on-current ($I_{ON}$) from that of other unit cell including less than or more than four memory cells 202. As such, the memory device 200B having those unit cells with different on-current ($I_{ON}$) is able to realize the multi-level programming, thereby applying in the AI applications, such as Deep Neural Networks (DNN) computation, Convolutional Neural Networks (CNN) computation, in-memory computing, or the like.

FIGS. 31, 32, 33, and 34 illustrate cross-sectional views of manufacturing the memory device 200B in accordance with the second embodiment.

Figure 31:
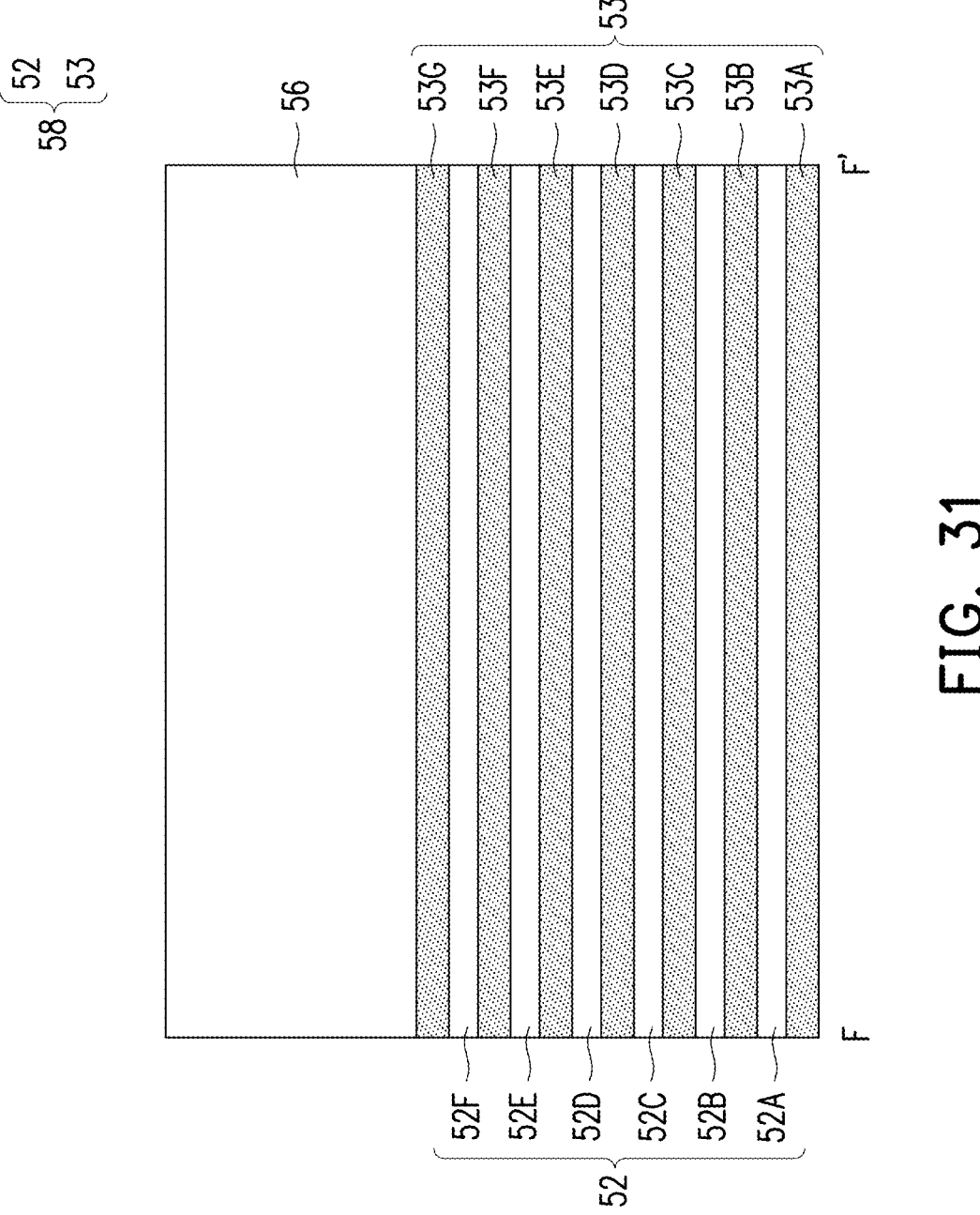
FIGS. 31, 32, 33, and 34 illustrate cross-sectional views of manufacturing a memory device in accordance with a second embodiment.

Referring to FIG. 31, a multi-layer stack 58 is formed over the structure of FIG. 2, and a photoresist 56 is formed over the multi-layer stack 58. The substrate 50, the transistors, the ILDs, and the interconnect structure 320 of FIG. 2 may be omitted from FIGS. 31 through 34 for the purposes of simplicity and clarity.

In FIG. 31, the multi-layer stack 58 includes alternating layers of sacrificial layers 53A-53G (collectively referred to as sacrificial layers 53) and dielectric layers 52A-52F (collectively referred to as dielectric layers 52). The sacrificial layers 53 may be patterned and replaced in subsequent steps to define conductive lines 72 (e.g., the word lines). Although FIG. 31 illustrates a particular number of the sacrificial layers 53 and the dielectric layers 52, other embodiments may include different numbers of the sacrificial layers 53 and the dielectric layers 52. Besides, although the multi-layer stack 58 is illustrated as having sacrificial layers as topmost and bottommost layers, the disclosure is not limited thereto. In some embodiments, at least one of the topmost and bottommost layers of the multi-layer stack 58 is a dielectric layer.

Figure 32:
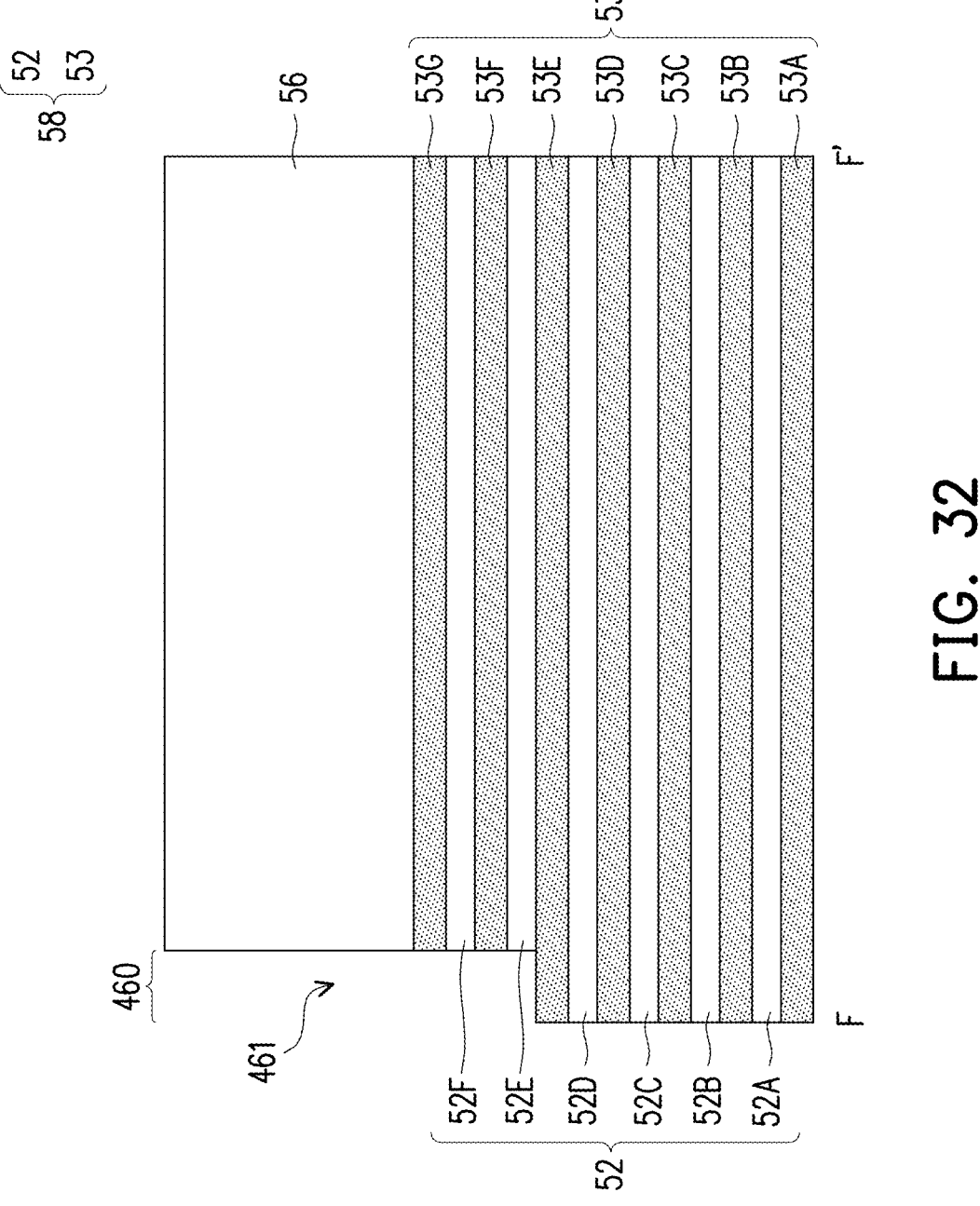

Referring to FIG. 32, the exposed portions of the multi-layer stack 58 in the region 460 are etched using the photoresist 56 as a mask. The etching may be any acceptable etching process, such as a dry etch (e.g., a reactive ion etch (RIE), a neutral beam etch (NBE), the like), a wet etch, the like, or a combination thereof. The etching may be aniso-tropic. The etching may remove portions of two pairs of the sacrificial layers 53G, 53F and the dielectric layers 52F, 52E in the region 460 and define an opening 461. In some alternative embodiment, the etching may remove portions of any number of pairs of the sacrificial layers 53 and the dielectric layers 52, so that the opening 461 reaches to a desired depth.

Figure 33:
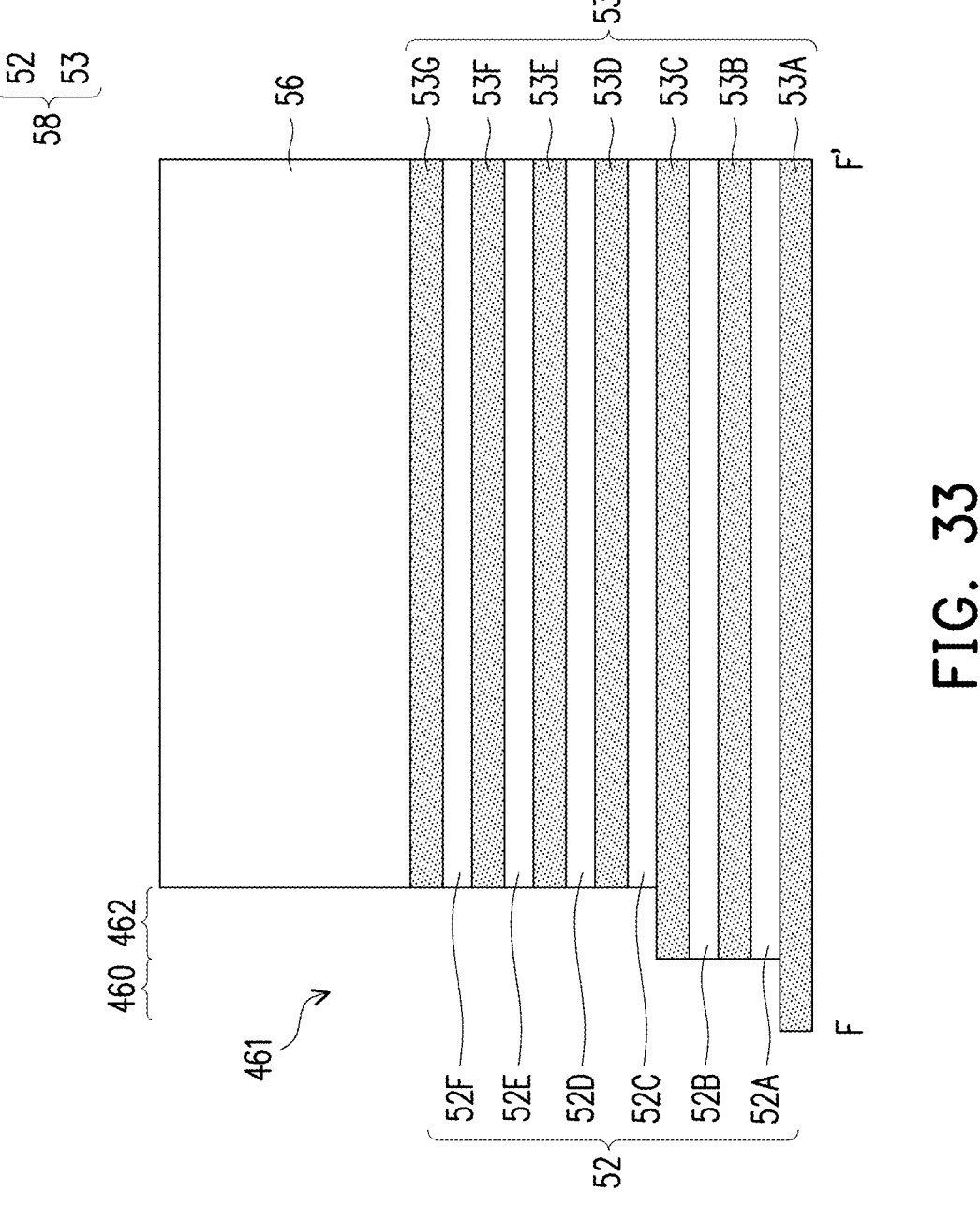

Referring to FIG. 32 and FIG. 33, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced and portions the multi-layer stack 58 in the region 460 and a region 462 may be exposed.

In FIG. 33, portions of four pairs of the sacrificial layers 53E, 53D, 53C, 53B and the dielectric layers 52D, 52C, 52B, 52A in the region 460, and portions of four pairs of the sacrificial layers 53G, 53F, 53E, 53D and the dielectric layers 52F, 52E, 52D, 52C in the region 462 are removed by acceptable etching processes using the photoresist 56 as a mask. The etching may be any acceptable etching process, such as a dry etch (e.g., RIE, NBE, the like), a wet etch, the like, or a combination thereof. The etching may be aniso-tropic. The etching may extend the openings 461 further into the multi-layer stack 58. In the resulting structure, the sacrificial layer 53A is exposed in the region 460, and the sacrificial layer 53C is exposed in the region 462. In some embodiments, the cycle number of the trimming process and the etching process may be adjusted to achieve any number of steps of the staircase structure.

Figure 34:
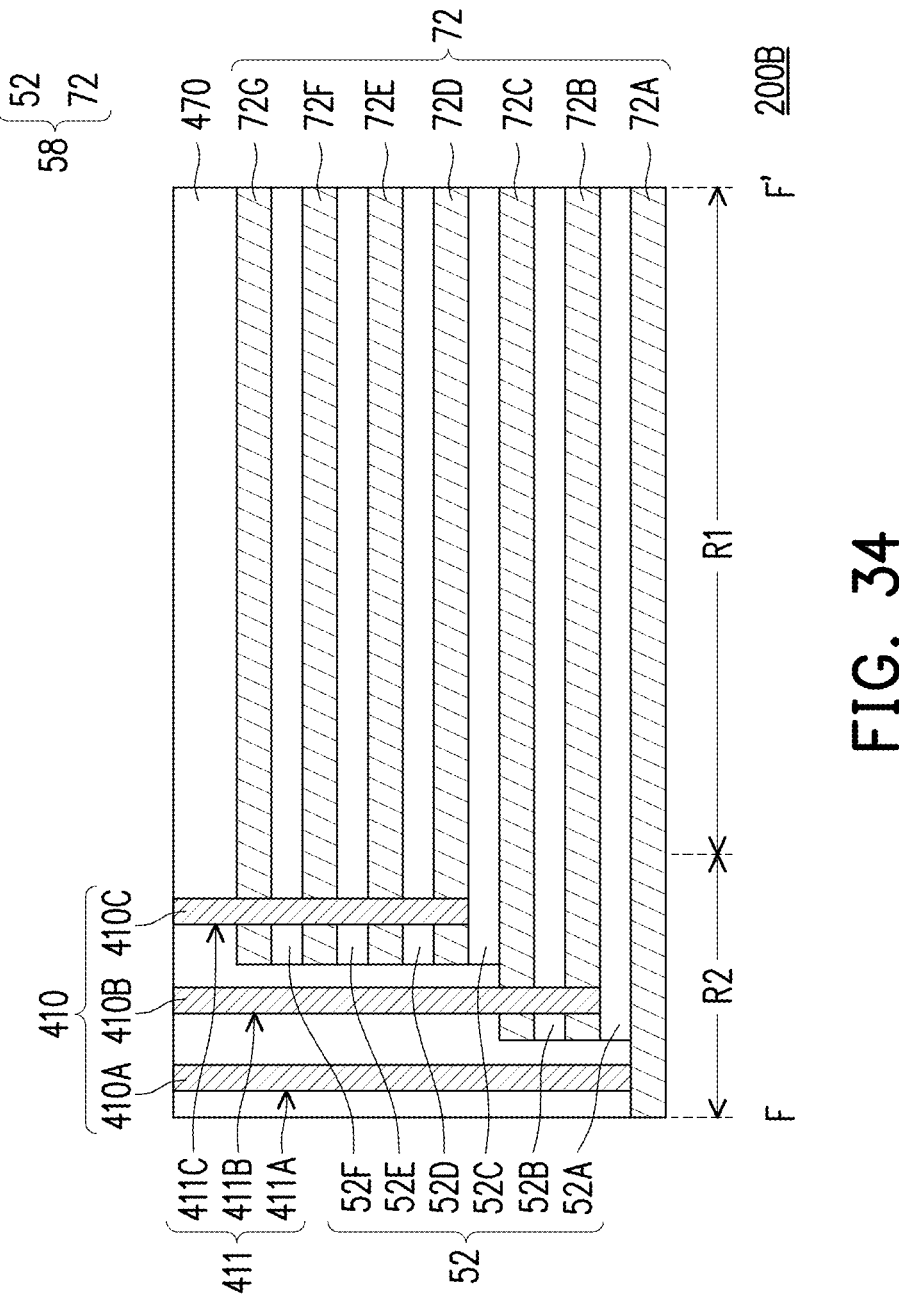

Referring to FIG. 33 and FIG. 34, after removing the photoresist 56 by an acceptable ashing or wet strip process, an inter-metal dielectric (IMD) 470 is deposited over the multi-layer stack 58. Thereafter, the bulk multi-layer stack 58 is patterned to form trenches therethrough, and sacrificial layers 53 are replaced with conductive materials to define the conductive lines 72 (as illustrated in FIGS. 13 through 16B), and then a plurality of memory cells 202 are formed in the trench (as illustrated in FIGS. 17 through 26B). Since FIG. 34 illustrates reference cross-section F-F' illustrated in FIG. 30, the memory cells 202 are not shown in the cross-section of FIG. 34.

In FIG. 34, a plurality of conductive contacts 410A-410C (collectively referred to as conductive contacts 410) are respectively formed on the staircase structure 420. In some embodiments, the forming the conductive contacts 410 may include patterning openings 411A-411C (collectively referred to as openings 411) in the IMD 470 to expose portions of the conductive lines 72 using a combination of photolithography and etching, for example. In the present embodiment, the openings 411 may further extend down-wardly into a corresponding step of the staircase structure 420. For example, the first opening 411A penetrates through the IMD 470 to expose a portion of the surface of the conductive line 72A. The second opening 411B penetrates through the IMD 470 and partially into two pair of the conductive lines 72B, 72C and the dielectric layers 52A, 52B to at least expose portions of the surfaces of the conductive lines 72B and 72C. The third opening 411C penetrates through the IMD 470 and partially into four pair of the conductive lines 72D, 72E, 72F, 72G and the dielectric layers 52C, 52D, 52E, 52F to at least expose portions of the surfaces of the conductive lines 72D, 72E, 72F, and 72G. Thereafter, a liner (not shown), such as a diffusion barrier layer, an adhesion layer, or the like, and a conductive material are formed in the openings 411. The liner may include titanium, titanium nitride, tantalum, tantalum nitride, or the like. The conductive material may include copper, a copper alloy, silver, gold, tungsten, cobalt, aluminum, nickel, or the like. A planarization process, such as a CMP, may be performed to remove excess material from the surface of the IMD 470. The remaining liner and conductive material form the conductive contacts 410 in the openings 411.

Although the embodiment of FIG. 30 illustrates a particular pattern for the conductive pillars 106 and 108, other configurations are also possible. For example, in these embodiments, the conductive pillars 106 and 108 have a staggered pattern. That is, the memory cells 202 on different sides of the strip-shaped staircase structure 420 are arranged in a staggered configuration. However, in other embodiments, the conductive pillars 106 and 108 in a same row of the array are all aligned with each other, as shown in the memory device 200A of FIG. 29. That is, the memory cells 202 on different sides of the strip-shaped staircase structure 420 may be arranged aligned with each other.

Figure 35:
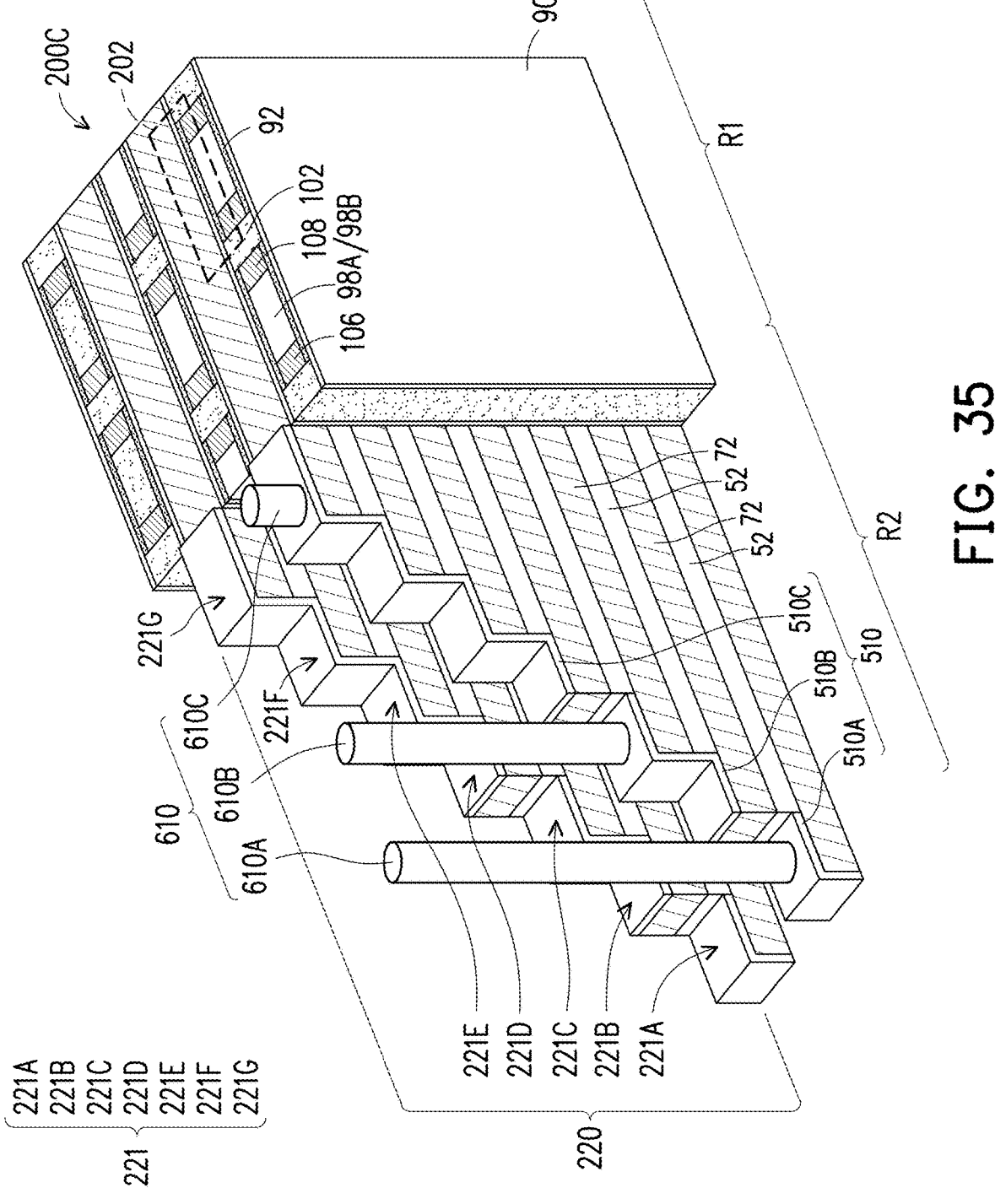
FIG. 35 illustrates a simplified perspective view of a memory device in accordance with a third embodiment.

FIG. 35 illustrates a simplified perspective view of a memory device 200C in accordance with a third embodiment.

Referring to FIG. 35, the memory device 200C of the third embodiment is similar to the memory device 200 of the first embodiment. That is, the structures, materials, and functions of the memory device 200C are similar to those of the memory device 200, and thus the details are omitted herein. The main difference between the memory device 200C and the memory device 200 lies in that the memory device 200C further includes a plurality of conformal layers 510 at least covering at least two steps of the staircase structure 220. In detail, as shown in FIG. 35, the conformal layers 510 at least includes a first conformal layer 510A, a second conformal layer 510B, and a third conformal layer 510C. The staircase structure 220 at least includes a plurality of steps 221A-221G (collectively referred to as steps 221), wherein each step 221 has a pair of the dielectric layer 52 and the conductive line 72. The first conformal layer 510A covers one step 221A of the staircase structure 220. The second conformal layer 510B covers two steps 221B and 221C of the staircase structure 220. The third conformal layer 510C covers the four steps 221D, 221E, 221F, and 221G of the staircase structure 220. In some embodiments, the first, second, and third conformal layers 510A, 510B, and 510C are electrically isolated from each other. In addition, the memory device 200C includes a plurality of conductive contacts 610 respectively standing on the conformal layers 510. Specifically, the conductive contacts 610 at least includes a first word line via 610A standing on the first conformal layer 510A, a second word line via 610B standing on the second conformal layer 510B, and a third word line via 610C standing on the third conformal layer 510C. In some embodiments, the first, second, and third word line vias 610A, 610B, and 610C are electrically isolated from each other.

It should be noted that, in the present embodiment, the at least two conductive layers 72 of the steps 221 are electrically connected to each other through the second conformal layer 510B and the second word line via 610B. In such embodiment, the unit cell including the two memory cells 202 may have different on-current ($I_{ON}$) from that of other unit cell including single one memory cell 202 or more than two memory cells 202. Therefore, those unit cells with different on-current ($I_{ON}$) can be identified as different unit cells to store more than two logic states, thereby realizing the multi-level programming in the memory device 200C. Similarly, the at least four conductive layers 72 of the steps 221 are electrically connected to each other through the third conformal layer 510C and the third word line via 610C. In this case, the unit cell including the four memory cells 202 may have different on-current ($I_{ON}$) from that of other unit cell including less than four memory cells 202 or more than four memory cells 202. As such, the memory device 200C having those unit cells with different on-current ($I_{ON}$) is able to realize the multi-level programming, thereby applying in the AI applications, such as Deep Neural Networks (DNN) computation, Convolutional Neural Networks (CNN) computation, in-memory computing, or the like.

Although FIG. 35 illustrates single one conformal layer 510 covering a particular number of the steps 221 of the staircase structure 220, other embodiments may include different numbers of the steps 221 are covered by the single one conformal layer 510. For example, the single one conformal layer 510 may cover three, or more than four steps 221 of the staircase structure 220.

FIGS. 36, 37, 38, 38, and 40 illustrate perspective views of manufacturing the memory device 200C in accordance with the third embodiment.

Figure 36:
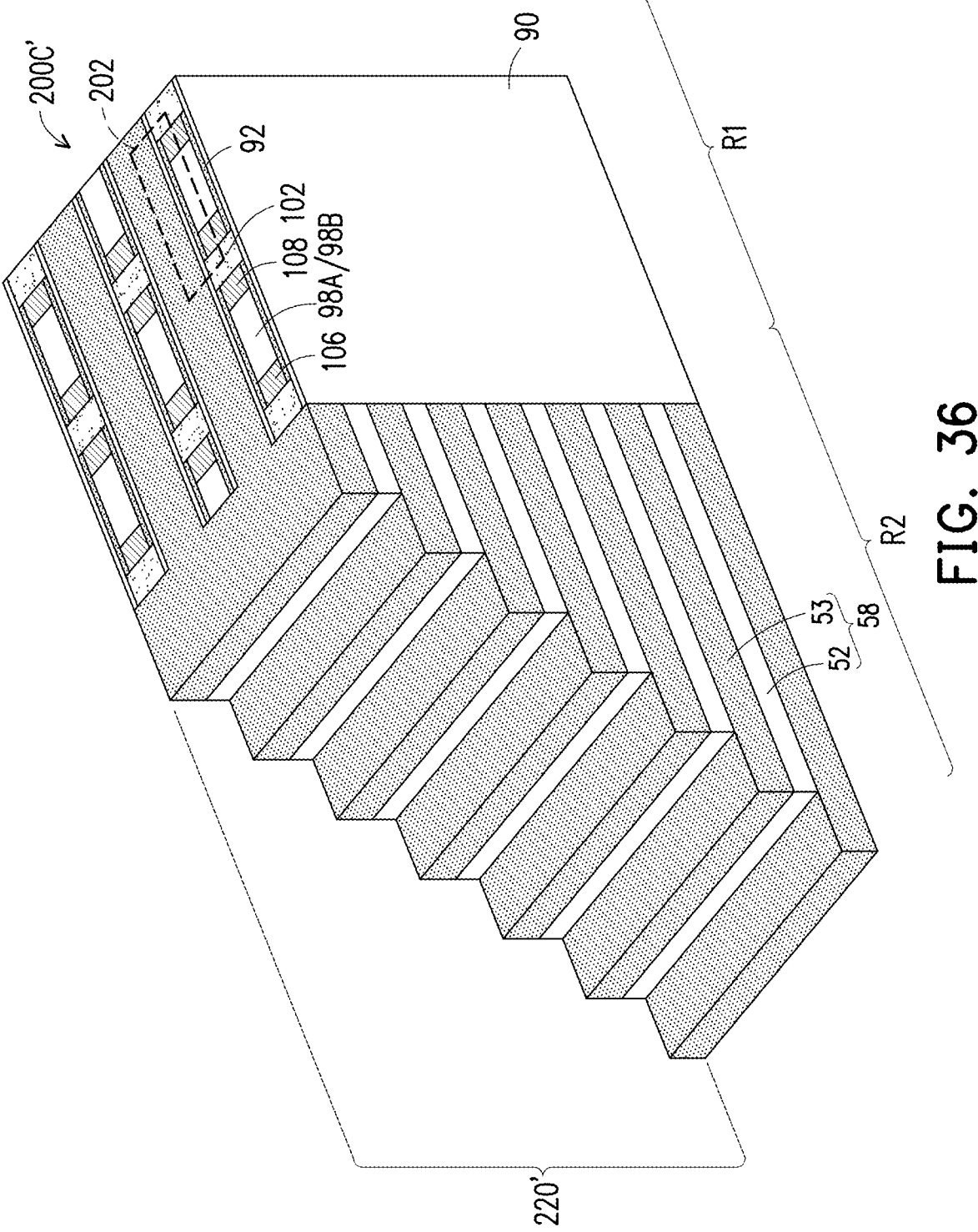
FIGS. 36, 37, 38, 39, and 40 illustrate perspective views of manufacturing a memory device in accordance with a third embodiment.

Referring to FIG. 36, the structure 200C' is formed to include a bulk staircase structure 220' in the stair case region R2 and a plurality of memory cells 202 in the array region R1. Specifically, the bulk staircase structure 220' is formed by using the same steps illustrated in FIGS. 2 through 11. In some embodiments, the bulk staircase structure 220' includes alternating layers of sacrificial layers 53 and dielectric layers 52. After the bulk staircase structure 220' is formed, the bulk multi-layer stack 58 in the array region R1 is pattered to form trenches therethrough, and then the memory cells 202 are formed in the trenches by using same steps illustrated in FIGS. 17A through 26B.

Figure 37:
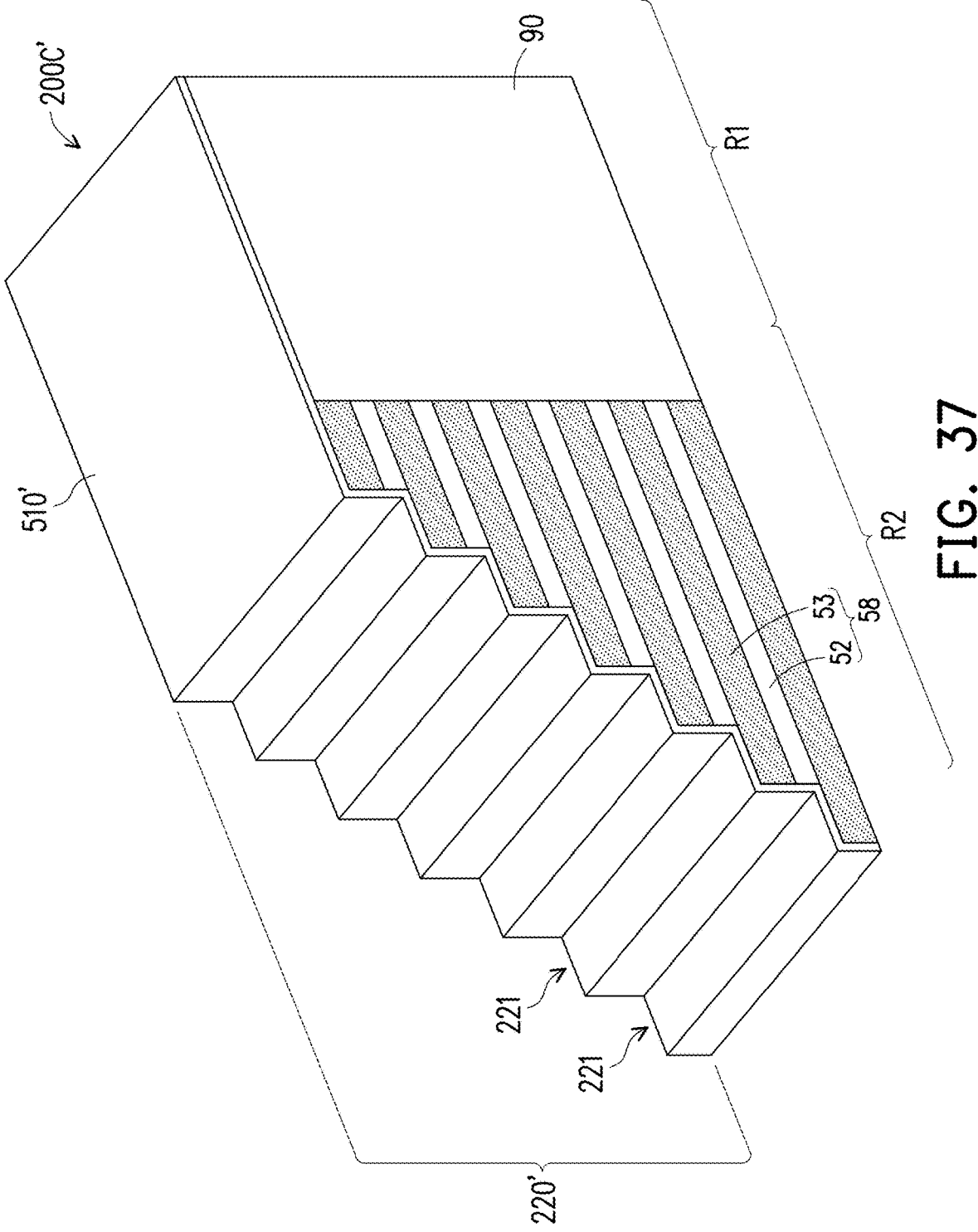

Referring to FIG. 37, a conformal material 510' is formed on the structure 200C' illustrated in FIG. 36. The conformal material 510' may conformally cover all steps 221 of the staircase structure 220 in the staircase region R2 and the top surface of the memory cells 202 in the array region R1. In some embodiments, the conformal material 510' includes a conductive material, such as copper, titanium, titanium nitride, tantalum, tantalum nitride, tungsten, ruthenium, aluminum, combinations thereof, or the like, which may be formed using, for example, CVD, ALD, PVD, PECVD, or the like.

Figure 38:
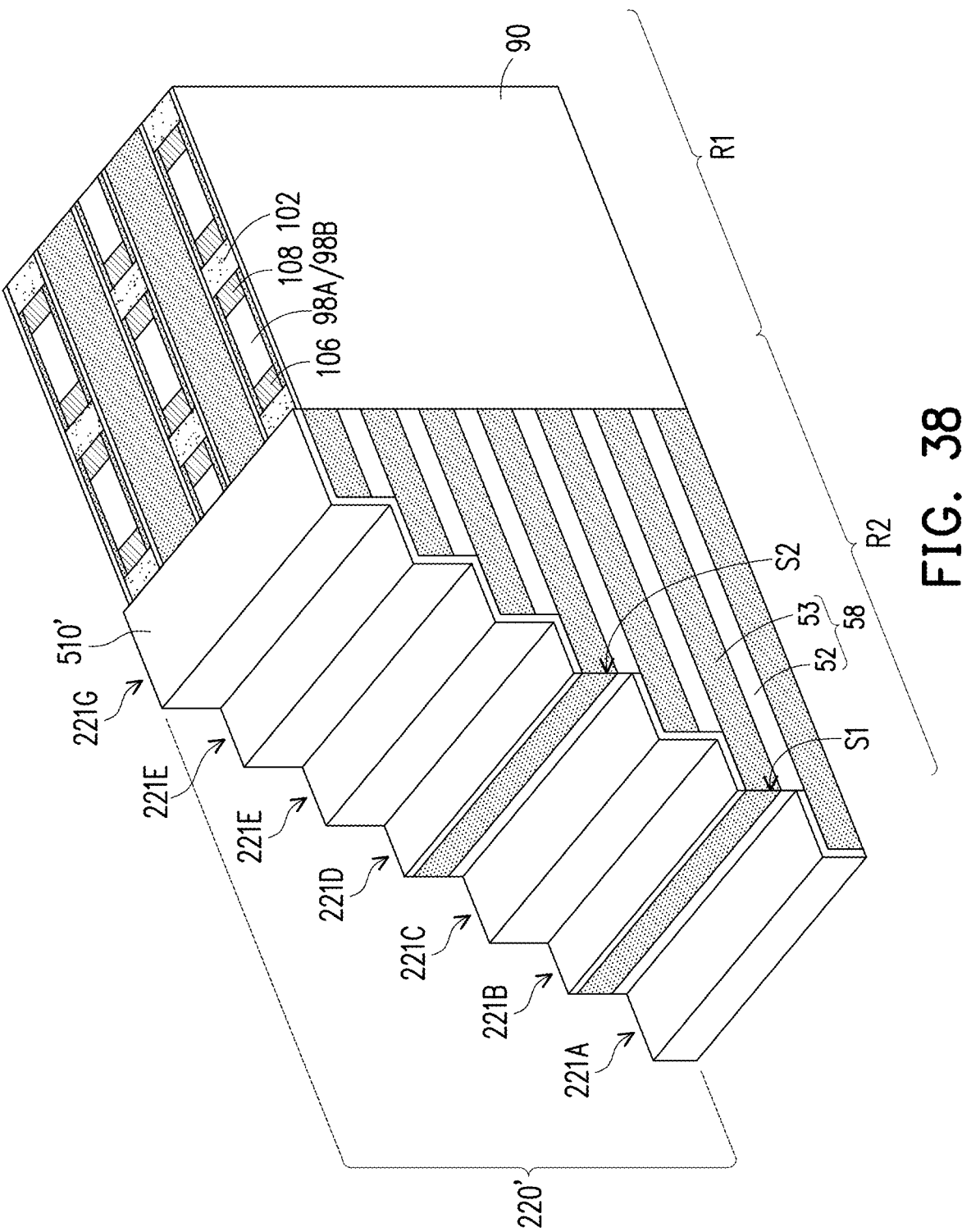

Referring to FIG. 38, the conformal material 510' is patterned by using a combination of photolithography and etching, for example. In the resulting structure, the conformal material 510' on a sidewall S1 of the step 221B and a sidewall S2 of the step 221D is removed, so as to expose the sidewall S1 of the step 221B and the sidewall S2 of the step 221D.

Figure 39:
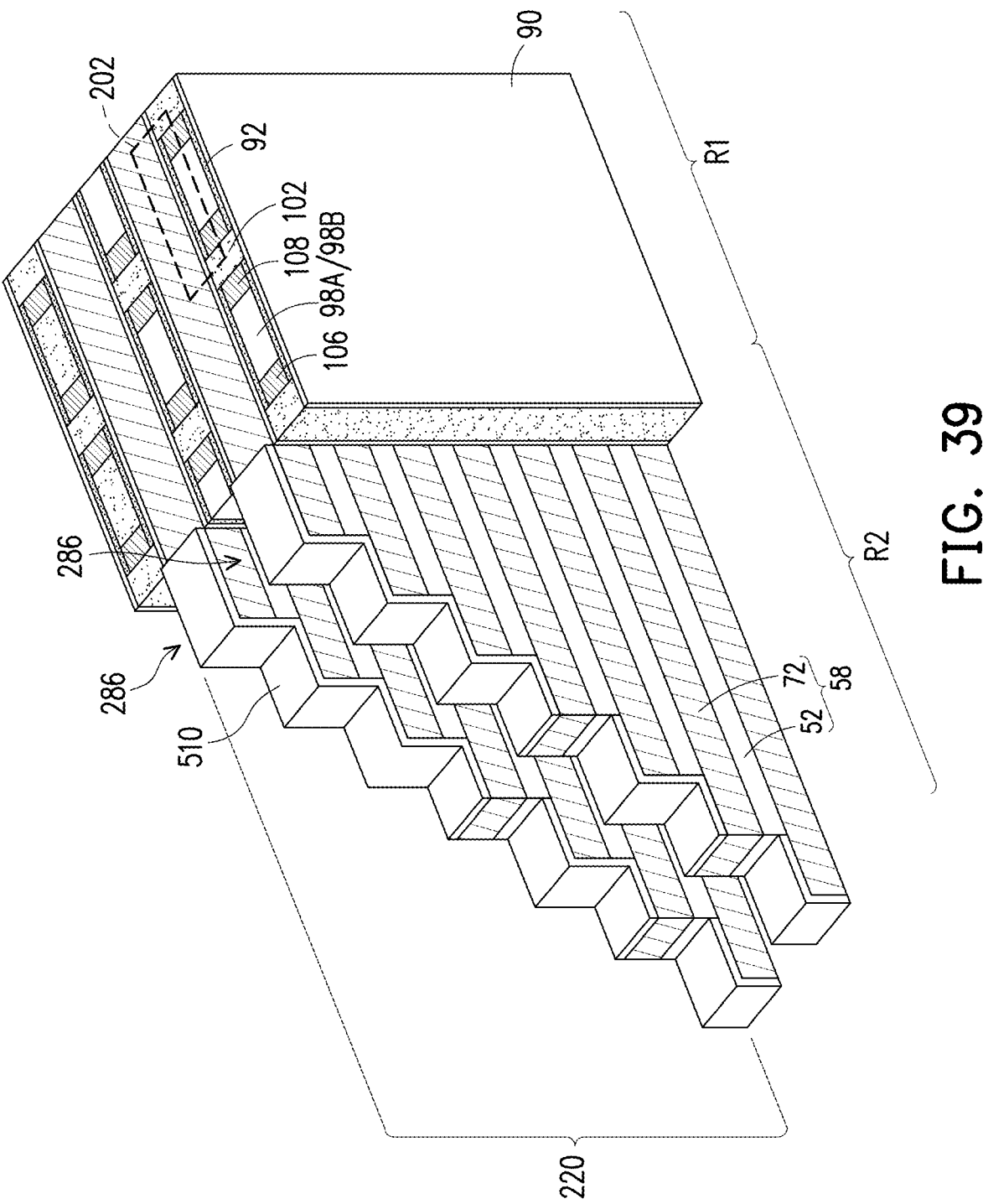

Referring to FIG. 38 and FIG. 39, the bulk staircase structure 220' is patterned by using a combination of photolithography and etching, for example. The bulk staircase structure 220' and the conformal material 510' are patterned to form trenches 286 therethrough. Thus, the trenches 286 extend through the bulk staircase structure 220' and the conformal material 510', so that the strip-shaped sacrificial layers 53, the strip-shaped dielectric layers 52, and the conformal layers 510 are accordingly formed. The strip-shaped sacrificial layers 53 are subsequently replaced with conductive lines 72, which will be described in details in FIGS. 16A and 16B.

Figure 40:
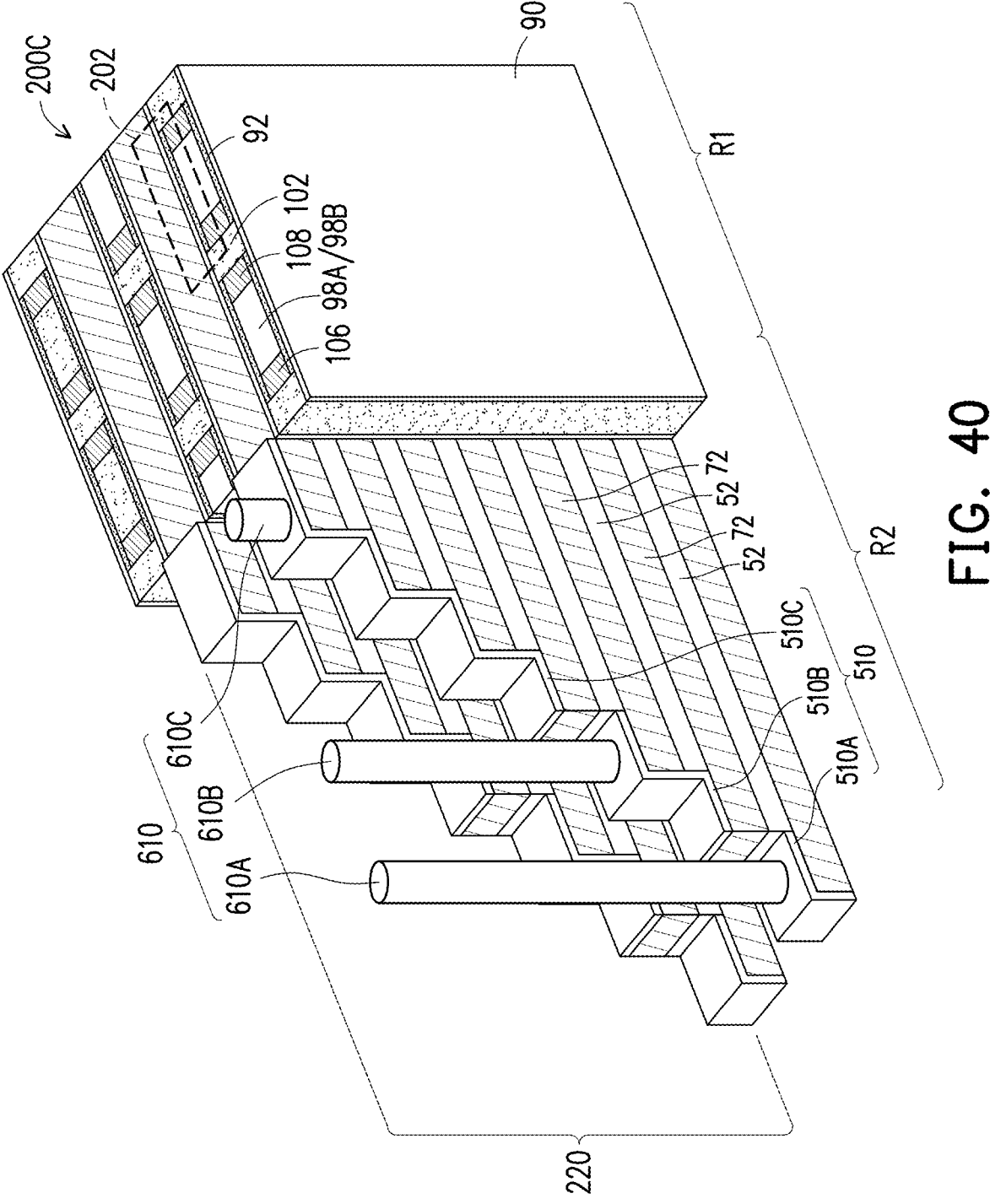

Referring to FIG. 40, a plurality of conductive contacts 610 are respectively formed on the staircase structure 220. In some embodiments, the conductive contacts 610 includes the first word line via 610A standing on the first conformal layer 510A, the second word line via 610B standing on the second conformal layer 510B, and the third word line via 610C standing on the third conformal layer 510C.

Although the embodiments of FIGS. 36 through 40 illustrate a particular pattern for the conductive pillars 106 and 108, other configurations are also possible. For example, in these embodiments, the conductive pillars 106 and 108 have a staggered pattern. That is, the memory cells 202 on different sides of the strip-shaped staircase structure 220 are arranged in a staggered configuration. However, in other embodiments, the conductive pillars 106 and 108 in a same row of the array are all aligned with each other, as shown in the memory device 200A of FIG. 29. That is, the memory cells 202 on different sides of the strip-shaped staircase structure 220 may be arranged aligned with each other.

In some alternative embodiments, the memory device may also be formed by a "staircase first process" in which the staircase structure is formed before the memory cells are formed, or a "staircase last process" in which the staircase structure is formed after the memory cells are formed.

Many variations of the above examples are contemplated by the present disclosure. It is understood that different embodiments may have different advantages, and that no particular advantage is necessarily required of all embodiments.

In accordance with an embodiment, a memory device includes a substrate, a multi-layer stack, a plurality of memory cells, and a plurality of conductive contacts. The substrate includes an array region and a staircase region. The multi-layer stack is disposed on the substrate in the array region, wherein the multi-layer stack has an end portion extending on the staircase region to be shaped into a staircase structure. The plurality of memory cells are respectively disposed on sidewalls of the multi-layer stack in the array region, and arranged at least along a stacking direction of the multi-layer stack. The plurality of conductive contacts are respectively on the staircase structure. At least two conductive contacts are electrically connected to each other.

In some embodiments, the memory device further includes a bridge layer disposed on the at least two conductive contacts to electrically connect the at least two conductive contacts; and a conductive via disposed on the bridge layer. In some embodiments, the plurality of conductive contacts include a first group comprising a first word line via; a second group comprising two second word line vias which are electrically connected to each other; and a third group comprising four third word line vias which are electrically connected to each other, wherein the first, second, and third groups are electrically isolated from each other. In some embodiments, the memory device further includes a first bridge layer disposed on the two second word line vias to electrically connect the two second word line vias; and a second bridge layer disposed on the four third word line vias to electrically connect the four third word line vias. In some embodiments, the multi-layer stack includes a plurality of conductive layers and a plurality of dielectric layers stacked alternately, an underlying conductive layer in the staircase structure is longer than a respective conductive layer thereon, so that a portion of a top surface of the underlying conductive layer is exposed by the respective conductive layer. In some embodiments, the at least two conductive contacts are respectively electrically connected to corresponding two conductive layers, so that the corresponding two conductive layers share the same word line. In some embodiments, one of the plurality of memory cells at least includes: a pair of source/drain (S/D) pillars extending along the stacking direction of the multi-layer stack; a channel layer disposed between the pair of S/D pillars and the multi-layer stack to connect the pair of S/D pillars; and a ferroelectric layer disposed between the channel layer and the multi-layer stack.

In accordance with an embodiment, a memory device includes a substrate, a multi-layer stack, and a plurality of memory cells. The substrate includes an array region and a staircase region. The multi-layer stack is disposed on the substrate in the array region, wherein the multi-layer stack comprises a plurality of conductive layers and a plurality of dielectric layers stacked alternately, and the multi-layer stack has an end portion extending on the staircase region to be shaped into a staircase structure. The plurality of memory cells respectively disposed on sidewalls of the multi-layer stack in the array region, and arranged along a stacking direction of the multi-layer stack. At least two conductive layers are electrically connected to each other, so that corresponding two memory cells share the same word line.

In some embodiments, the memory device further includes: a plurality of conductive contacts respectively disposed on the staircase structure, wherein at least two conductive contacts are respectively landed on the at least two conductive layers; a bridge layer disposed on the at least two conductive contacts and electrically connecting the at least two conductive contacts, wherein the at least two conductive layers are electrically connected to each other through the at least two conductive contacts and the bridge layer; and a conductive via disposed on the bridge layer. In some embodiments, the staircase structure has a plurality of steps, one of the plurality of steps comprises at least two conductive layers and at least two dielectric layers, and the at least two conductive layers has a sidewall aligned with a sidewall of the at least two dielectric layers. In some embodiments, the memory device further includes: a plurality of conductive contacts standing on the plurality of steps of the staircase structure, wherein at least one conductive contact extends downwardly into a corresponding step of the staircase structure, so that the at least two conductive layers are electrically connected to each other through the at least one conductive contact. In some embodiments, the plurality of steps include: a first step comprising at least one conductive layer; a second step comprising at least two conductive layers and at least two dielectric layers; and a third step comprising at least four conductive layers and at least four dielectric layers. In some embodiments, the memory device further includes: a first word line via standing on the first step; a second word line via standing on the second step and extending downwardly to contact the at least two conductive layers, so that the at least two conductive layers are electrically connected to each other through the second word line via; and a third word line via standing on the third step and extending downwardly to contact the at least four conductive layers, so that the at least four conductive layers are electrically connected to each other through the third word line via. In some embodiments, the memory device further includes: a first conformal layer covering at least one step of the staircase structure; a second conformal layer covering at least two steps of the staircase structure; a third conformal layer covering at least four steps of the staircase structure, wherein the first, second, and third conformal layers are electrically isolated from each other; a first word line via standing on the first conformal layer; a second word line via standing on the second conformal layer, wherein the at least two steps are electrically connected to each other through the second conformal layer and the second word line via; and a third word line via standing on the third conformal layer, wherein the at least four steps are electrically connected to each other through the third conformal layer and the third word line via. In some embodiments, the first, second, and third conformal layers are made of a conductive material.

In accordance with an embodiment, a method of forming a memory device includes: providing a substrate comprising an array region and a staircase region; forming a multi-layer stack on the substrate, wherein the multi-layer stack comprises a plurality of conductive layers and a plurality of dielectric layers stacked alternately and has a trench penetrating therethrough, and the multi-layer stack has an end portion extending on the staircase region to be formed as a staircase structure; forming a plurality of memory cells in the trench, wherein the plurality of memory cells are arranged along a stacking direction of the multi-layer stack; and forming a plurality of conductive contacts on the staircase structure, so that at least two conductive layers are electrically connected to each other through at least one conductive contact.

In some embodiments, the forming the plurality of memory cells includes: forming a ferroelectric layer on a sidewall of the trench to cover sidewalls of the plurality of conductive layers and the plurality of dielectric layers; forming a channel layer on the ferroelectric layer; and forming at least one pair of source/drain (S/D) pillars in the trench, so that the channel layer connects the at least one pair of S/D pillars. In some embodiments, the method further includes: forming a bridge layer on the plurality of conductive contacts, wherein the bridge layer connects at least two conductive contacts, so that the at least two conductive layers are electrically connected to each other through the at least two conductive contacts and the bridge layer. In some embodiments, the at least one conductive contact extends downwardly into a corresponding step of the staircase structure, so that the at least two conductive layers are electrically connected to each other through the at least one conductive contact. In some embodiments, the method further includes: forming a first conformal layer to cover at least one step of the staircase structure; forming a second conformal layer to cover at least two steps of the staircase structure; forming a third conformal layer to cover at least four steps of the staircase structure, wherein the first, second, and third conformal layers are electrically isolated from each other. The plurality of conductive contacts includes: a first word line via standing on the first conformal layer; a second word line via standing on the second conformal layer, wherein the at least two steps are electrically connected to each other through the second conformal layer and the second word line via; and a third word line via standing on the third conformal layer, wherein the at least four steps are electrically connected to each other through the third conformal layer and the third word line via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a plurality of memory cells arranged into an array of a plurality of rows and a plurality of columns, wherein the plurality of memory cells in a same vertical column share a common source line and a common bit line, and gates of at least two memory cells in the same vertical column are electrically connected to each other and together electrically coupled to a common word line.

2. The memory device of claim 1, wherein the at least two memory cells in the same vertical column are adjacent to each other.

3. The memory device of claim 1, wherein gates of four memory cells in the same vertical column are electrically connected to each other and together electrically coupled to the common word line.

4. The memory device of claim 1, further comprising:
a substrate comprising an array region and a staircase region;
a multi-layer stack disposed on the substrate in the array region, wherein the multi-layer stack has an end portion extending on the staircase region to be shaped into a staircase structure; and
the plurality of memory cells respectively disposed on sidewalls of the multi-layer stack in the array region, and arranged at least along a stacking direction of the multi-layer stack.

5. The memory device of claim 4, wherein one of the plurality of memory cells at least comprises:
a pair of source/drain (S/D) pillars extending along the stacking direction of the multi-layer stack;
a channel layer disposed between the pair of S/D pillars and the multi-layer stack to connect the pair of S/D pillars; and
a ferroelectric layer disposed between the channel layer and the multi-layer stack.

6. The memory device of claim 4, further comprising:
a plurality of conductive contacts respectively on the staircase structure, wherein at least two conductive contacts are electrically connected to each other.

7. The memory device of claim 6, further comprising:
a bridge layer disposed on the at least two conductive contacts to electrically connect the at least two conductive contacts; and
a conductive via disposed on the bridge layer.

8. The memory device of claim 4, wherein the multi-layer stack comprises a plurality of conductive layers and a plurality of dielectric layers stacked alternately, an underlying conductive layer in the staircase structure is longer than a respective conductive layer thereon, so that a portion of a top surface of the underlying conductive layer is exposed by the respective conductive layer.

9. The memory device of claim 8, wherein the at least two conductive contacts are respectively electrically connected to corresponding two conductive layers, so that the corresponding two conductive layers share the same word line.

10. A memory device, comprising:
a substrate comprising an array region and a staircase region;
a multi-layer stack disposed on the substrate in the array region, wherein the multi-layer stack comprises a plurality of conductive layers and a plurality of dielectric layers stacked alternately, and the multi-layer stack has an end portion extending on the staircase region to be shaped into a staircase structure, wherein the staircase structure has a plurality of steps, one of the plurality of steps comprises at least two conductive layers and at least two dielectric layers, and the at least two conductive layers has a sidewall aligned with a sidewall of the at least two dielectric layers; and a plurality of conductive contacts standing on the plurality of steps of the staircase structure, wherein at least one conductive contact extends downwardly into a corresponding step of the staircase structure, so that the at least two conductive layers are electrically connected to each other through the at least one conductive contact.

11. The memory device of claim 10, wherein the plurality of steps comprise:

a first step comprising at least one conductive layer;

a second step comprising at least two conductive layers and at least two dielectric layers; and a third step comprising at least four conductive layers and at least four dielectric layers.

12. The memory device of claim 11, further comprising:

a first word line via standing on the first step;

a second word line via standing on the second step and extending downwardly to contact the at least two conductive layers, so that the at least two conductive layers are electrically connected to each other through the second word line via; and a third word line via standing on the third step and extending downwardly to contact the at least four conductive layers, so that the at least four conductive layers are electrically connected to each other through the third word line via.

13. The memory device of claim 10, further comprising:

a plurality of memory cells respectively disposed on sidewalls of the multi-layer stack in the array region, and arranged along a stacking direction of the multi-layer stack, wherein the at least two conductive layers are electrically connected to each other, so that corresponding two memory cells share the same word line.

14. The memory device of claim 13, wherein one of the plurality of memory cells at least comprises:

a pair of source/drain (S/D) pillars extending along the stacking direction of the multi-layer stack;

a channel layer disposed between the pair of S/D pillars and the multi-layer stack to connect the pair of S/D pillars; and a ferroelectric layer disposed between the channel layer and the multi-layer stack.

15. A memory device, comprising:

a substrate comprising an array region and a staircase region;

a multi-layer stack disposed on the substrate in the array region, wherein the multi-layer stack comprises a plurality of conductive layers and a plurality of dielectric layers stacked alternately, and the multi-layer stack has an end portion extending on the staircase region to be shaped into a staircase structure;

a first conformal layer covering at least one step of the staircase structure;

a second conformal layer covering at least two steps of the staircase structure;

a third conformal layer covering at least four steps of the staircase structure, wherein the first, second, and third conformal layers are electrically isolated from each other.

16. The memory device of claim 15, further comprising:

a first word line via standing on the first conformal layer;

a second word line via standing on the second conformal layer, wherein the at least two steps are electrically connected to each other through the second conformal layer and the second word line via; and a third word line via standing on the third conformal layer, wherein the at least four steps are electrically connected to each other through the third conformal layer and the third word line via.

17. The memory device of claim 15, wherein the first, second, and third conformal layers are made of a conductive material.

18. The memory device of claim 15, further comprising:

a plurality of memory cells respectively disposed on sidewalls of the multi-layer stack in the array region, and arranged along a stacking direction of the multi-layer stack, wherein at least two conductive layers are electrically connected to each other, so that corresponding two memory cells share the same word line.

19. The memory device of claim 18, wherein one of the plurality of memory cells at least comprises:

a pair of source/drain (S/D) pillars extending along the stacking direction of the multi-layer stack;

a channel layer disposed between the pair of S/D pillars and the multi-layer stack to connect the pair of S/D pillars; and a gate dielectric layer disposed between the channel layer and the multi-layer stack.

20. The memory device of claim 19, wherein a material of the gate dielectric layer comprises a ferroelectric material, a phase change material, a variable resistance material, or a combination thereof.

* * * * *